(12) United States Patent
Gardner et al.

(10) Patent No.: US 12,272,692 B2
(45) Date of Patent: Apr. 8, 2025

(54) 3D SELECTIVE MATERIAL TRANSFORMATION TO INTEGRATE 2D MATERIAL ELEMENTS

(71) Applicant: Tokyo Electron Limited, Tokyo (JP)

(72) Inventors: Mark I. Gardner, Albany, NY (US); H. Jim Fulford, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 437 days.

(21) Appl. No.: 17/672,643

(22) Filed: Feb. 15, 2022

(65) Prior Publication Data
US 2023/0260999 A1 Aug. 17, 2023

(51) Int. Cl.
*H01L 27/092* (2006.01)
*H01L 21/8238* (2006.01)
(Continued)

(52) U.S. Cl.
CPC ............ *H01L 27/0922* (2013.01); *H01L 21/823807* (2013.01); *H01L 21/823814* (2013.01); *H01L 21/823871* (2013.01); *H01L 21/823878* (2013.01); *H01L 29/0665* (2013.01); *H01L 29/401* (2013.01); *H01L 29/41733* (2013.01); *H01L 29/41775* (2013.01); *H01L 29/42392* (2013.01); *H01L 29/6675* (2013.01); *H01L 29/78618* (2013.01); *H01L 29/78696* (2013.01); *H01L 21/8221* (2013.01); *H01L 21/8256* (2013.01)

(58) Field of Classification Search
CPC ..... H01L 21/823807; H01L 21/823814; H01L 21/823871; H01L 21/823878; H01L 21/82345; H01L 21/8221; H01L 21/8256; H01L 29/0665; H01L 29/401; H01L 29/41733; H01L 29/41775; H01L 29/42392; H01L 29/6675; H01L 29/78618; H01L 29/78696; H01L 29/66439; H01L 29/775; H01L 27/0688; H01L 27/092; H01L 27/0922; H01L 29/0673; H01L 29/0847; H01L 29/1037; H01L 29/41725; H01L 29/24; H01L 29/7606; H01L 29/42356; H01L 29/66969; H01L 29/778; H01L 29/685; H01L 29/7394; H01L 29/1033; H01L 29/42324; H01L 29/1606; H01L 29/66825; H01L 29/66484; H01L 29/4908; H01L 29/04; H01L 29/7831; H01L 29/7839; H01L 29/78681; H01L 29/788; B82Y 10/00; G11C 13/0002; G11C 13/003; G11C 13/0033; G11C 13/0007; G11C 13/004; G11C 13/0069; H10B 99/00; H10B 63/30
USPC ................... 257/288, 9, 29, 24, 66
See application file for complete search history.

(56) References Cited

U.S. PATENT DOCUMENTS 7,768,051 B2 8/2010 Abbott
9,024,376 B2 5/2015 Masuoka et al.
(Continued)

*Primary Examiner* — Natalia A Gondarenko
(74) *Attorney, Agent, or Firm* — Foley & Lardner LLP

(57) ABSTRACT

A semiconductor device includes a transistor structure that includes a two-dimensional (2D) material around at least a dielectric structure. The transistor structure includes a first source/drain structure in contact with the first 2D material. The transistor structure includes a second source/drain structure in contact with the 2D material. The transistor structure includes a gate structure around at least the 2D material.

13 Claims, 57 Drawing Sheets

(51) Int. Cl.
  *H01L 29/06*    (2006.01)
  *H01L 29/40*    (2006.01)
  *H01L 29/417*   (2006.01)
  *H01L 29/423*   (2006.01)
  *H01L 29/66*    (2006.01)
  *H01L 29/786*   (2006.01)
  H01L 21/822     (2006.01)
  H01L 21/8256    (2006.01)

(56) References Cited

U.S. PATENT DOCUMENTS

| | | | |
|---|---|---|---|
| 9,425,324 B2 | 8/2016 | Diaz et al. | |
| 9,478,624 B2 | 10/2016 | Colinge et al. | |
| 2011/0260225 A1 | 10/2011 | Lee | |
| 2014/0017890 A1* | 1/2014 | Cohen | H01L 29/775 |
| | | | 977/734 |
| 2018/0061835 A1 | 3/2018 | Yang et al. | |
| 2018/0061837 A1 | 3/2018 | Mathew et al. | |
| 2018/0204833 A1 | 7/2018 | Cheng et al. | |
| 2020/0357931 A1 | 11/2020 | Lee et al. | |
| 2020/0373203 A1 | 11/2020 | Liebmann et al. | |
| 2021/0280582 A1* | 9/2021 | Lu | H01L 29/0847 |
| 2022/0328670 A1* | 10/2022 | Lee | H01L 29/1606 |
| 2023/0088101 A1* | 3/2023 | Naylor | H01L 29/42392 |
| | | | 257/29 |
| 2023/0099814 A1* | 3/2023 | Maxey | H01L 29/66969 |
| | | | 257/29 |

* cited by examiner

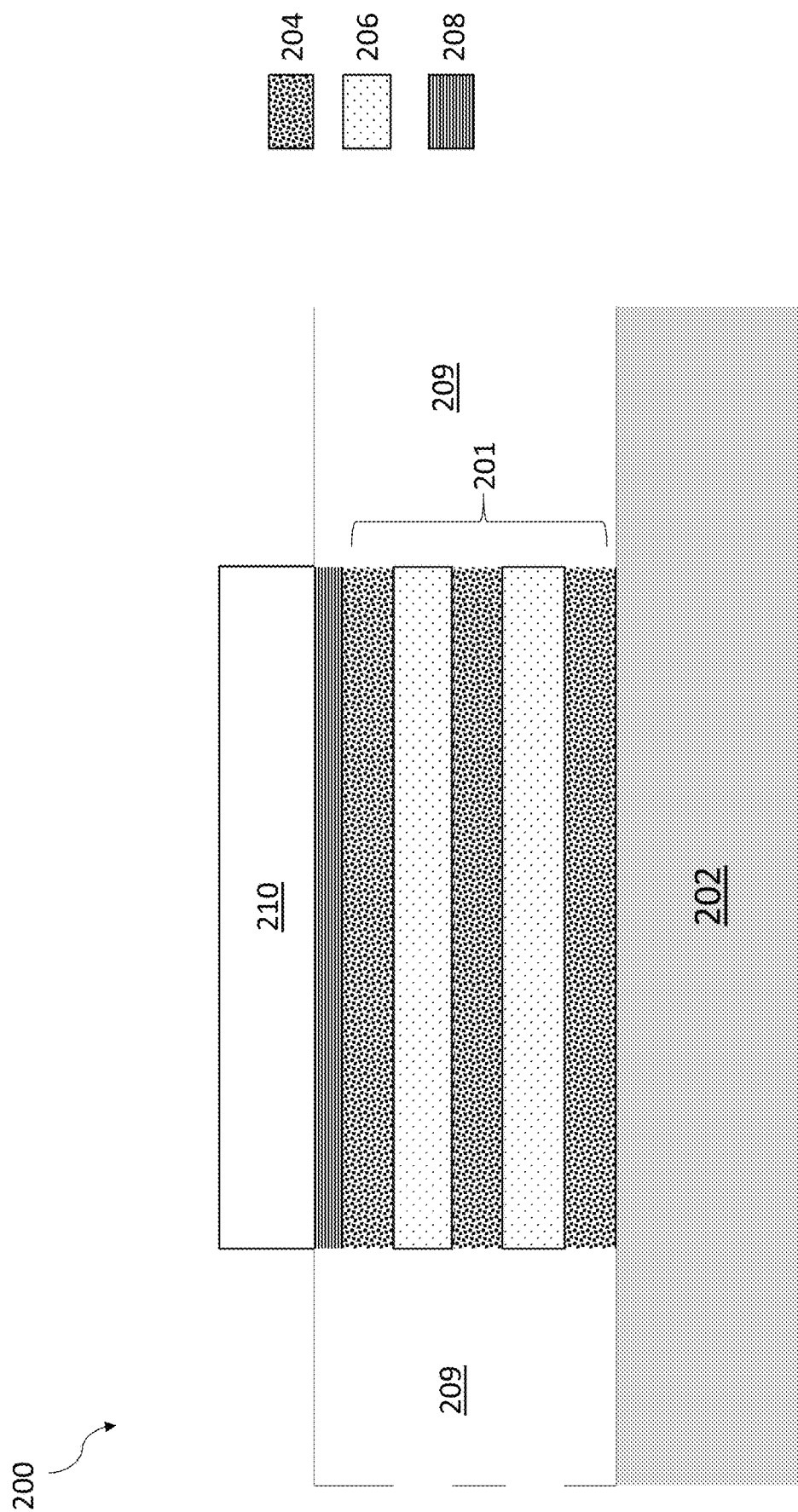

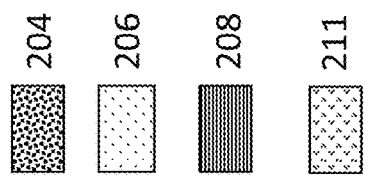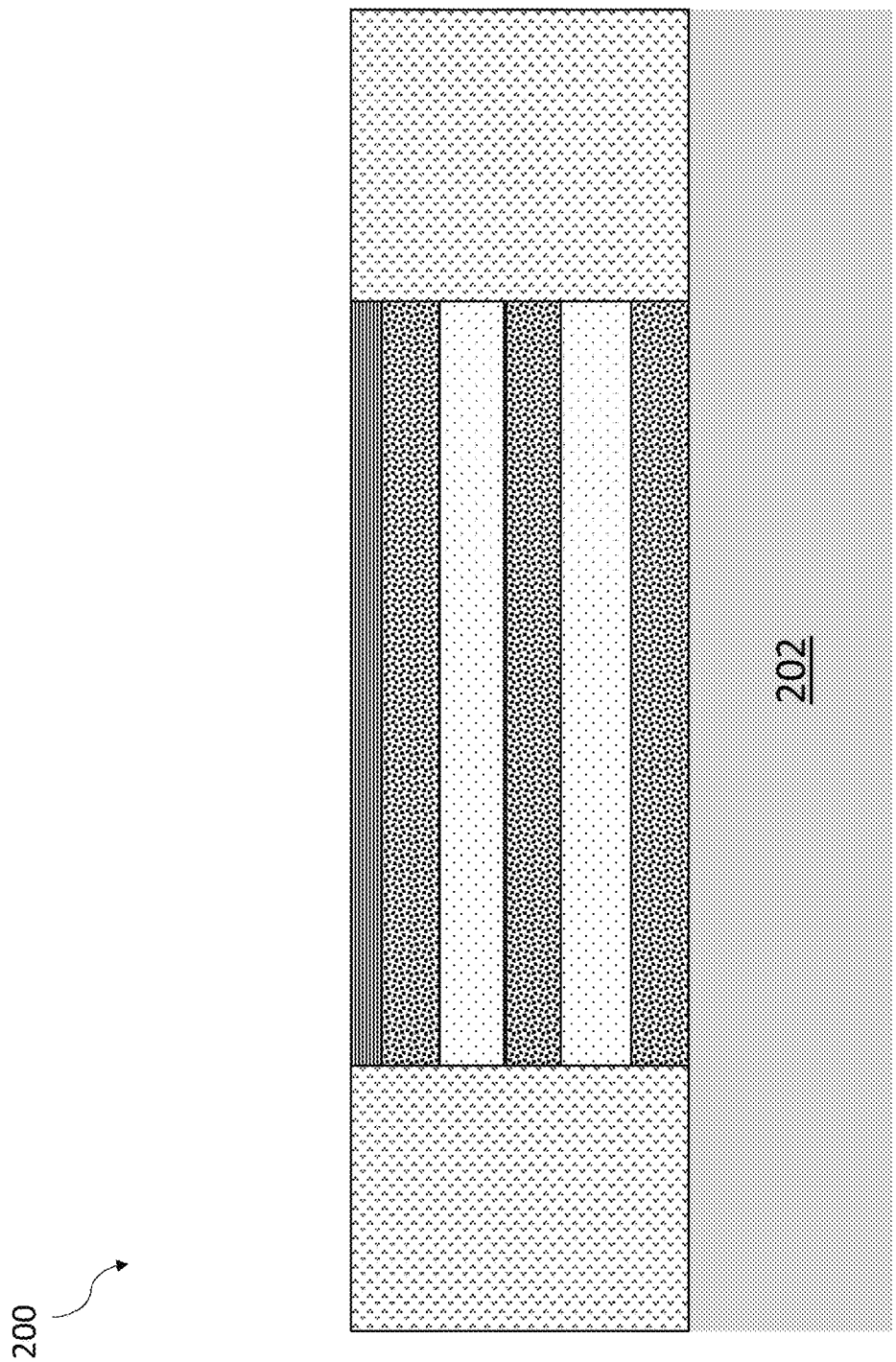
FIG. 2C

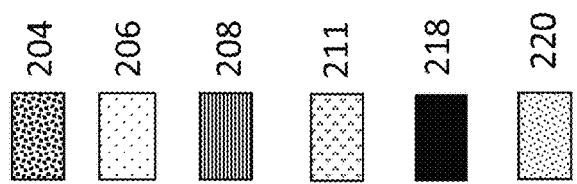
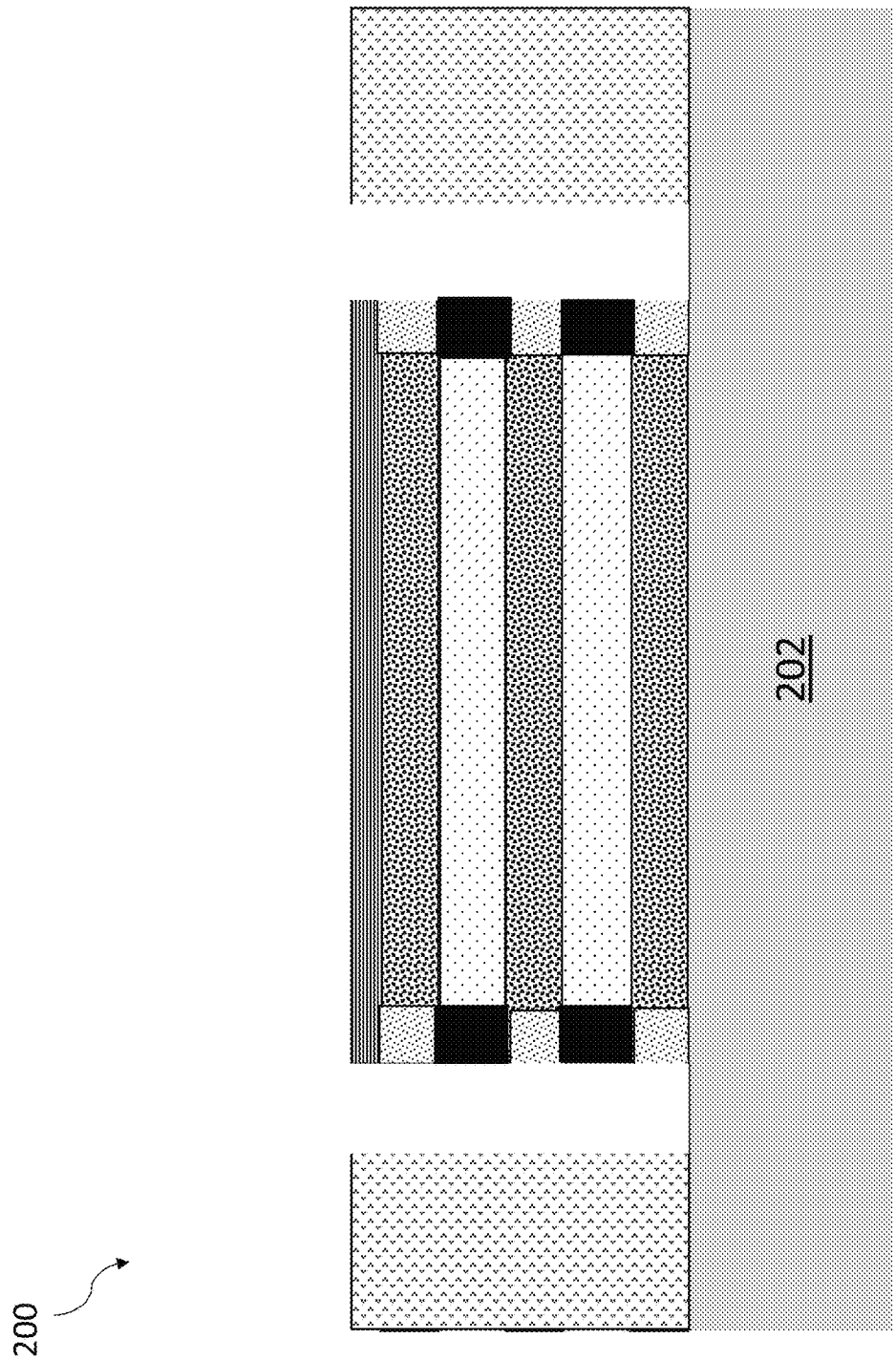
FIG. 2G

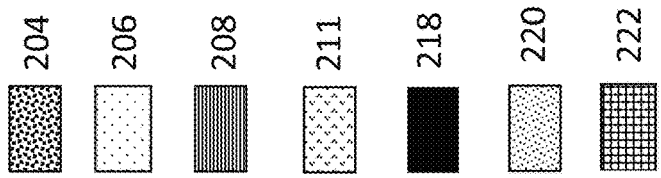
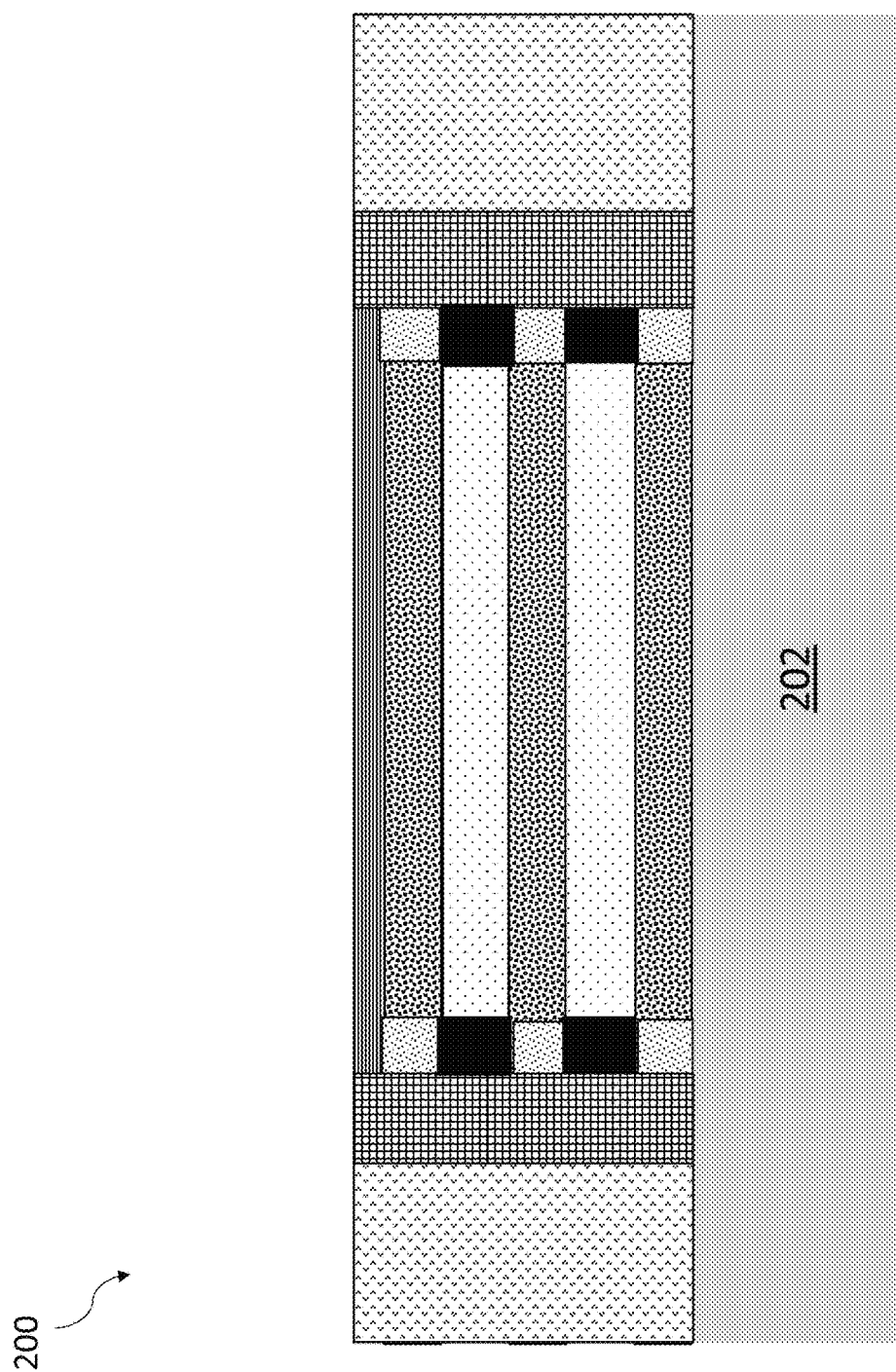
FIG. 2H

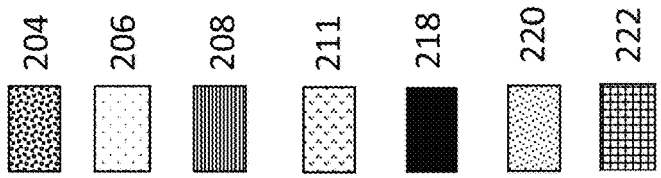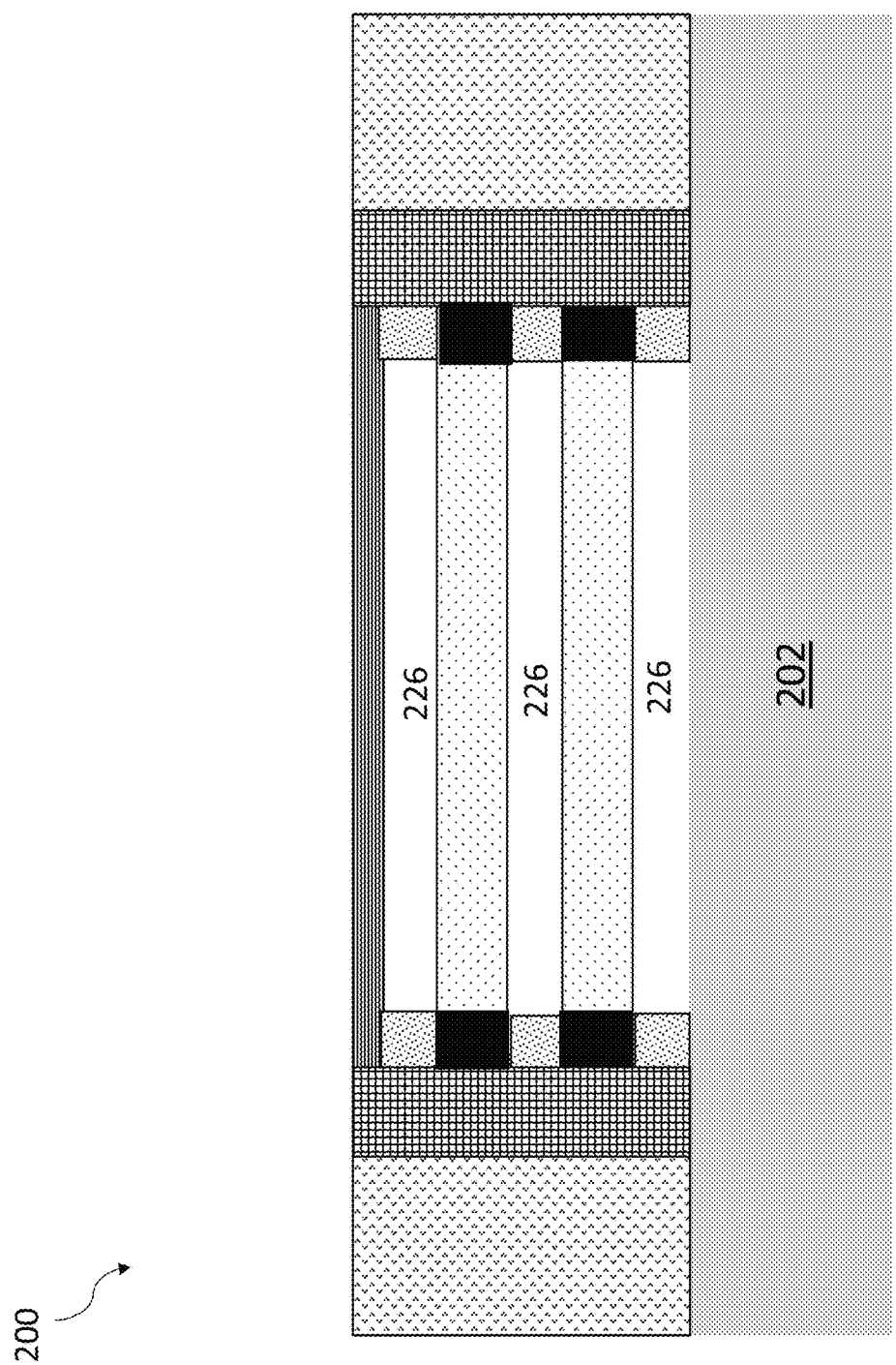
FIG. 2J

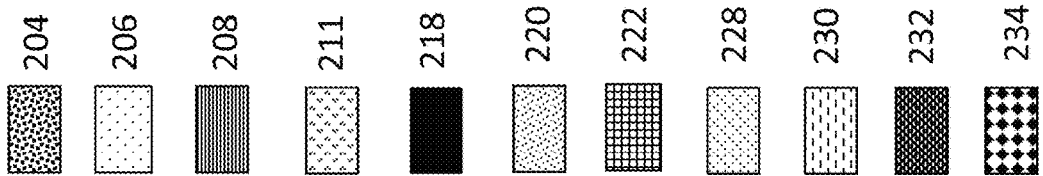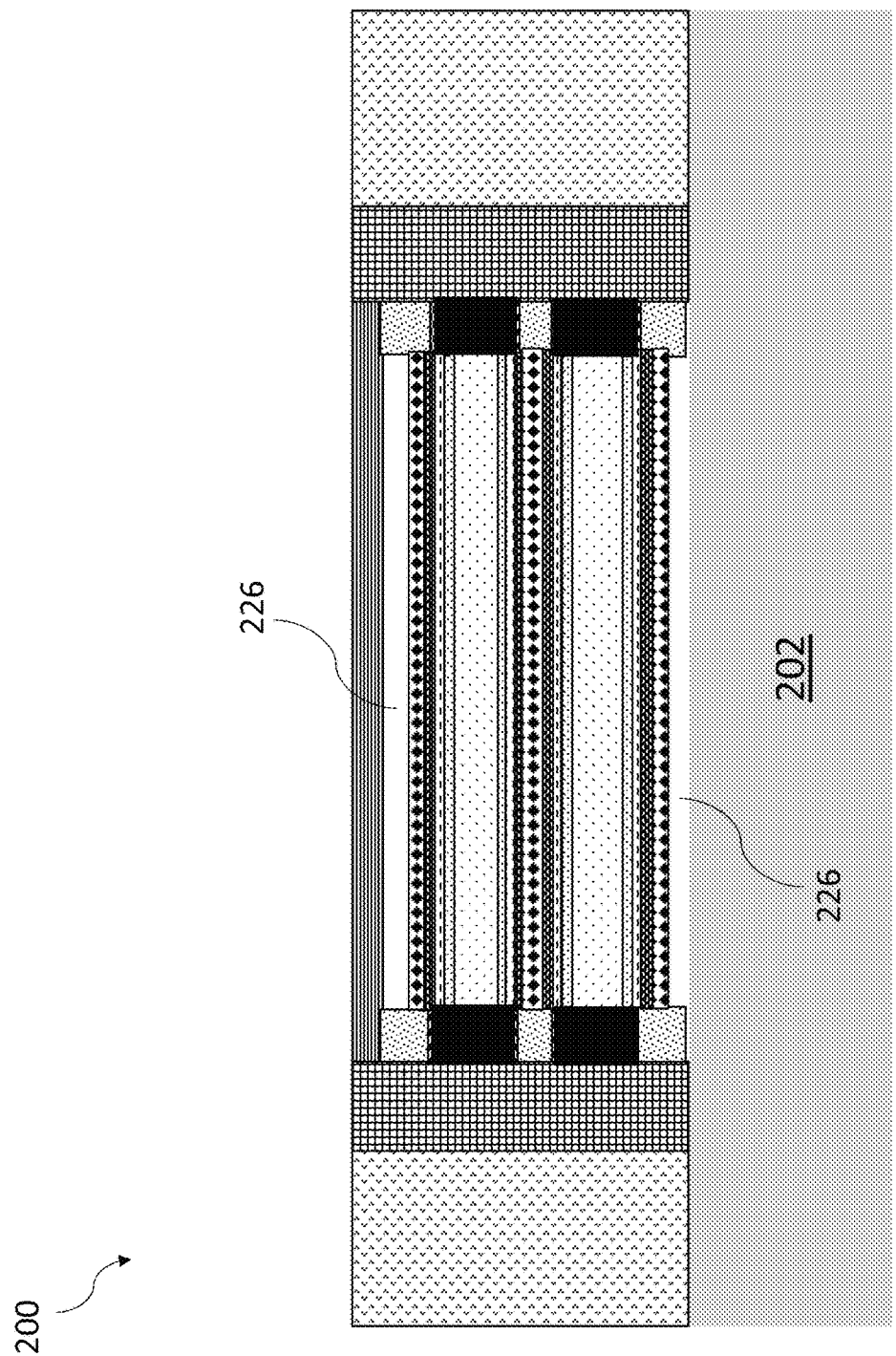
FIG. 2L

 204
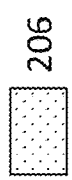 206
 208
 211
 218
 220
 222
 228
 230
 232
 234
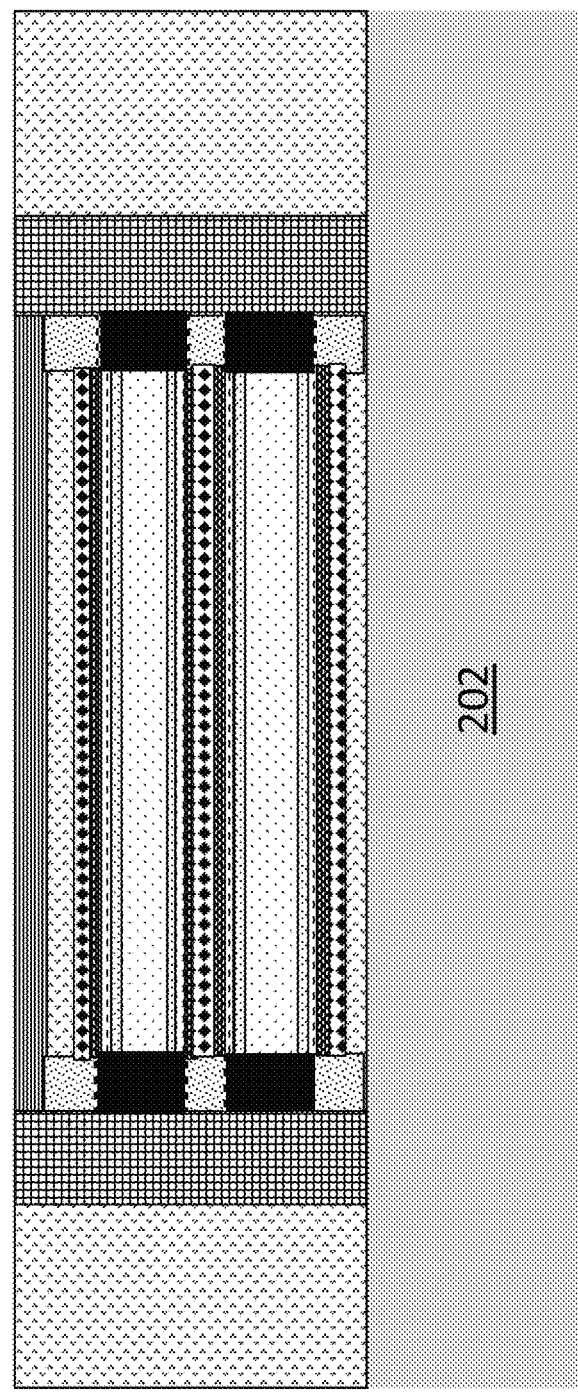
FIG. 2M

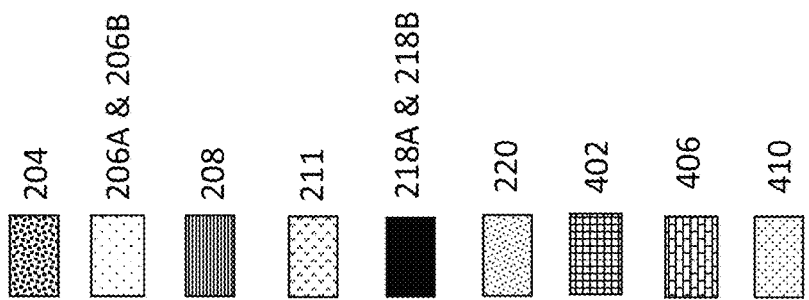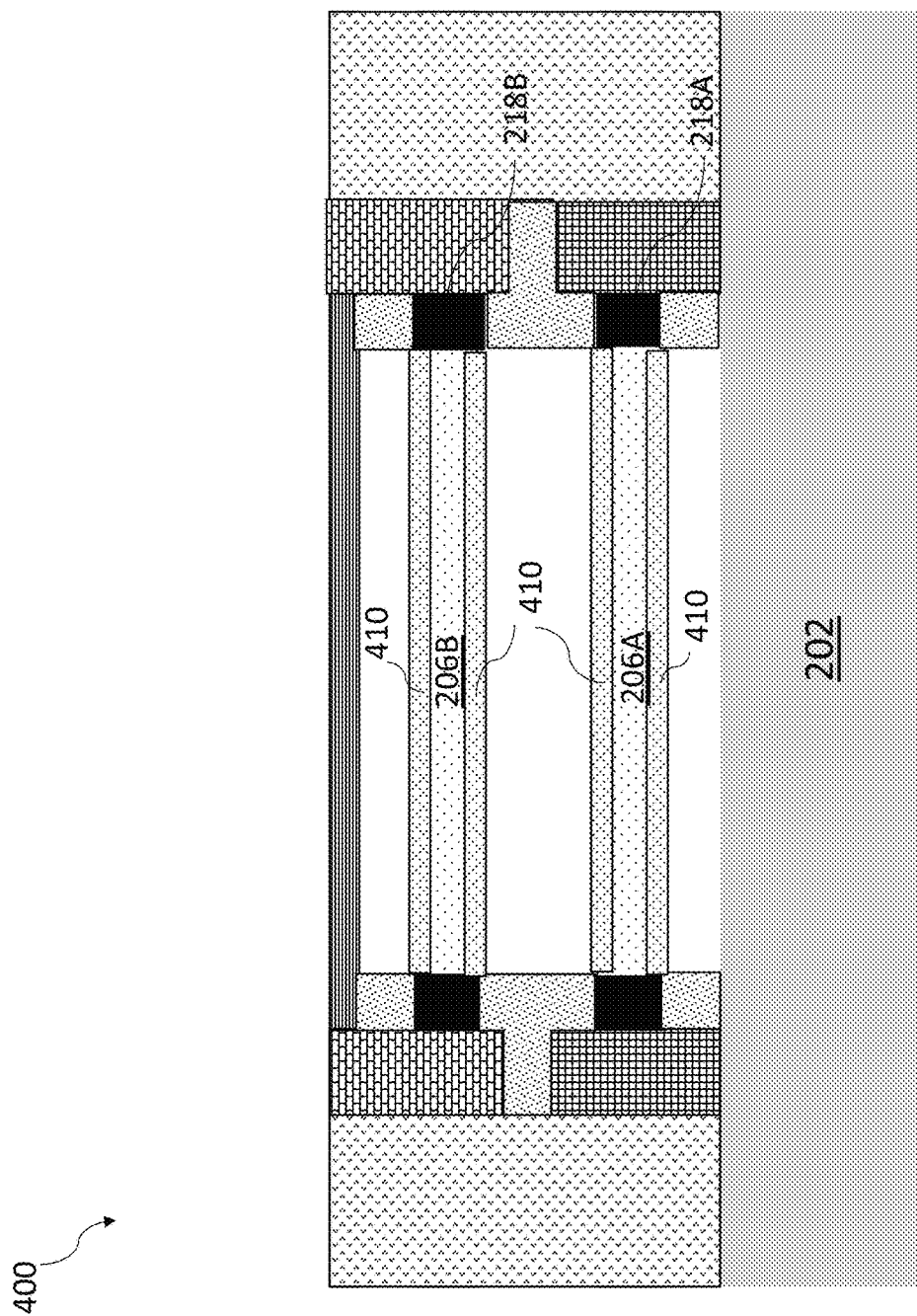
FIG. 4E

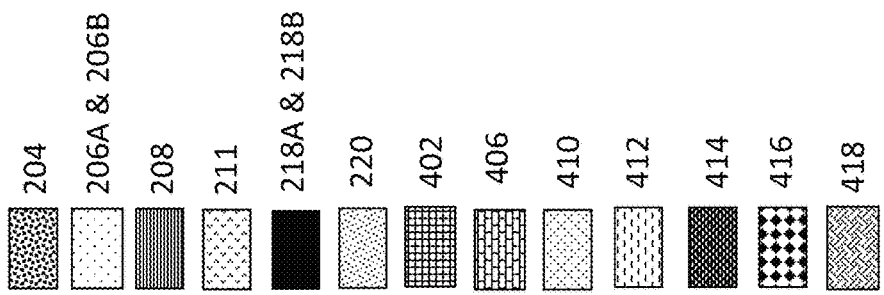
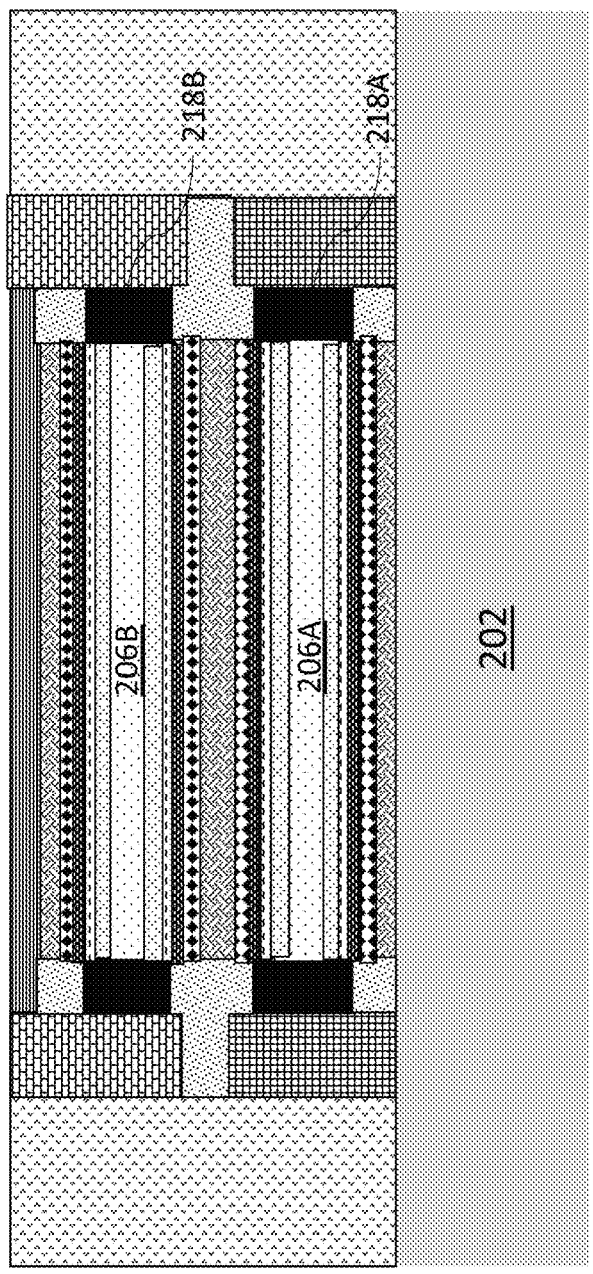
FIG. 4G

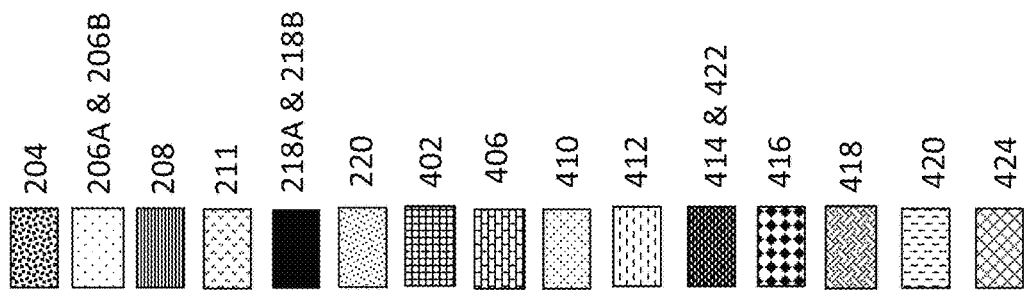
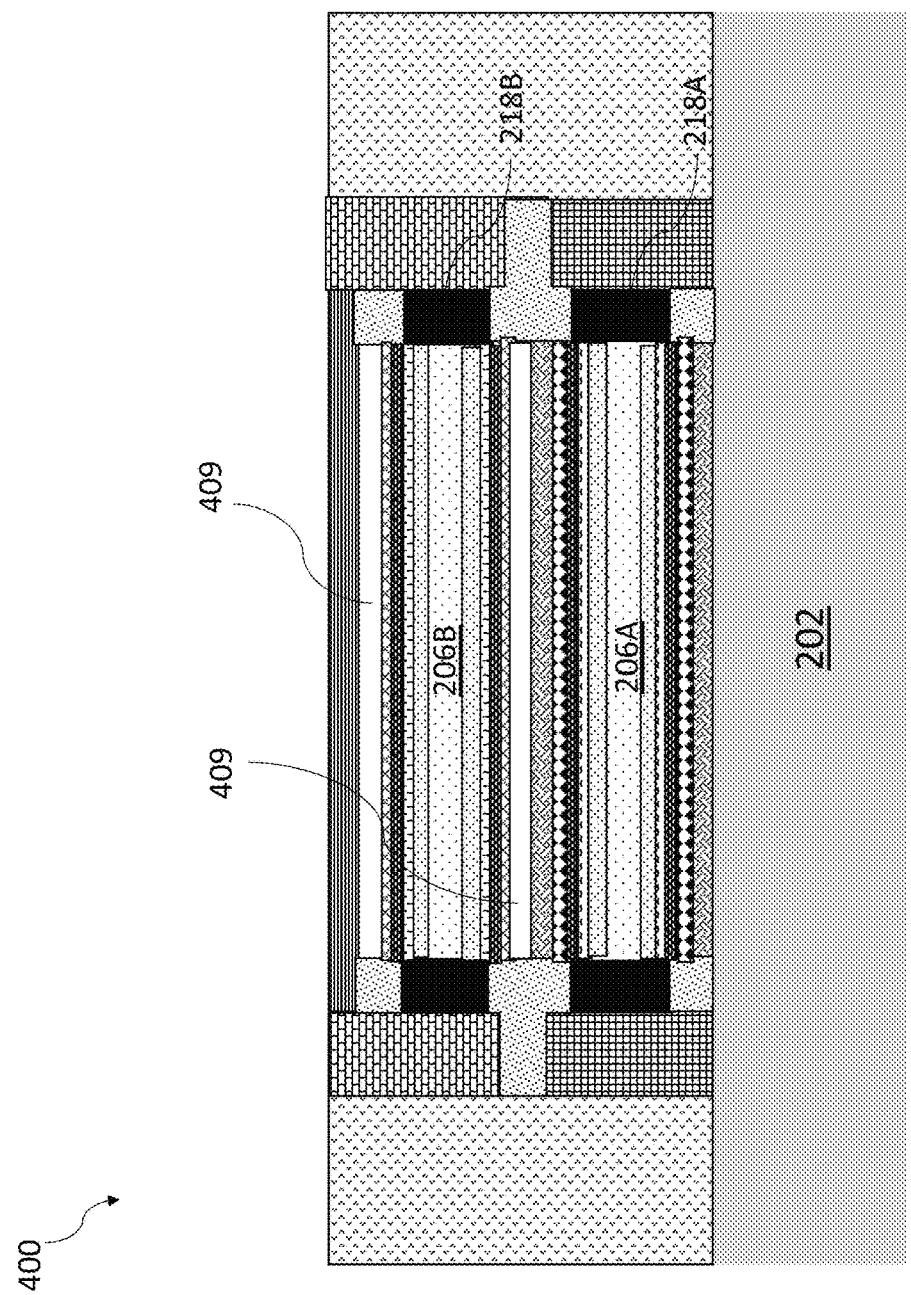
FIG. 4J

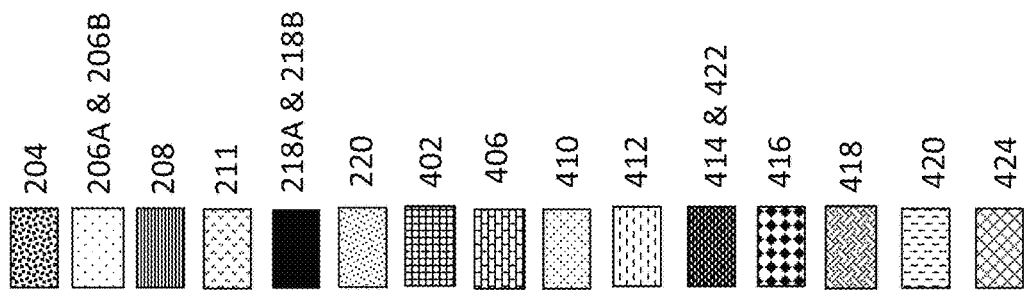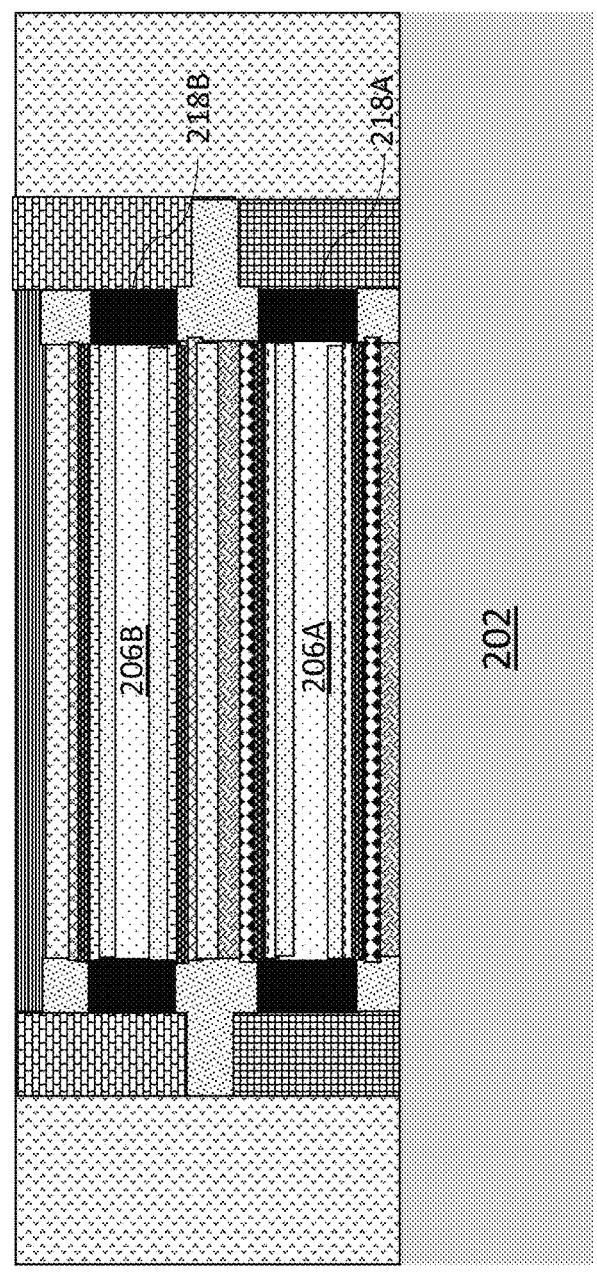
FIG. 4K

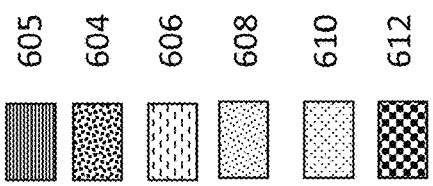
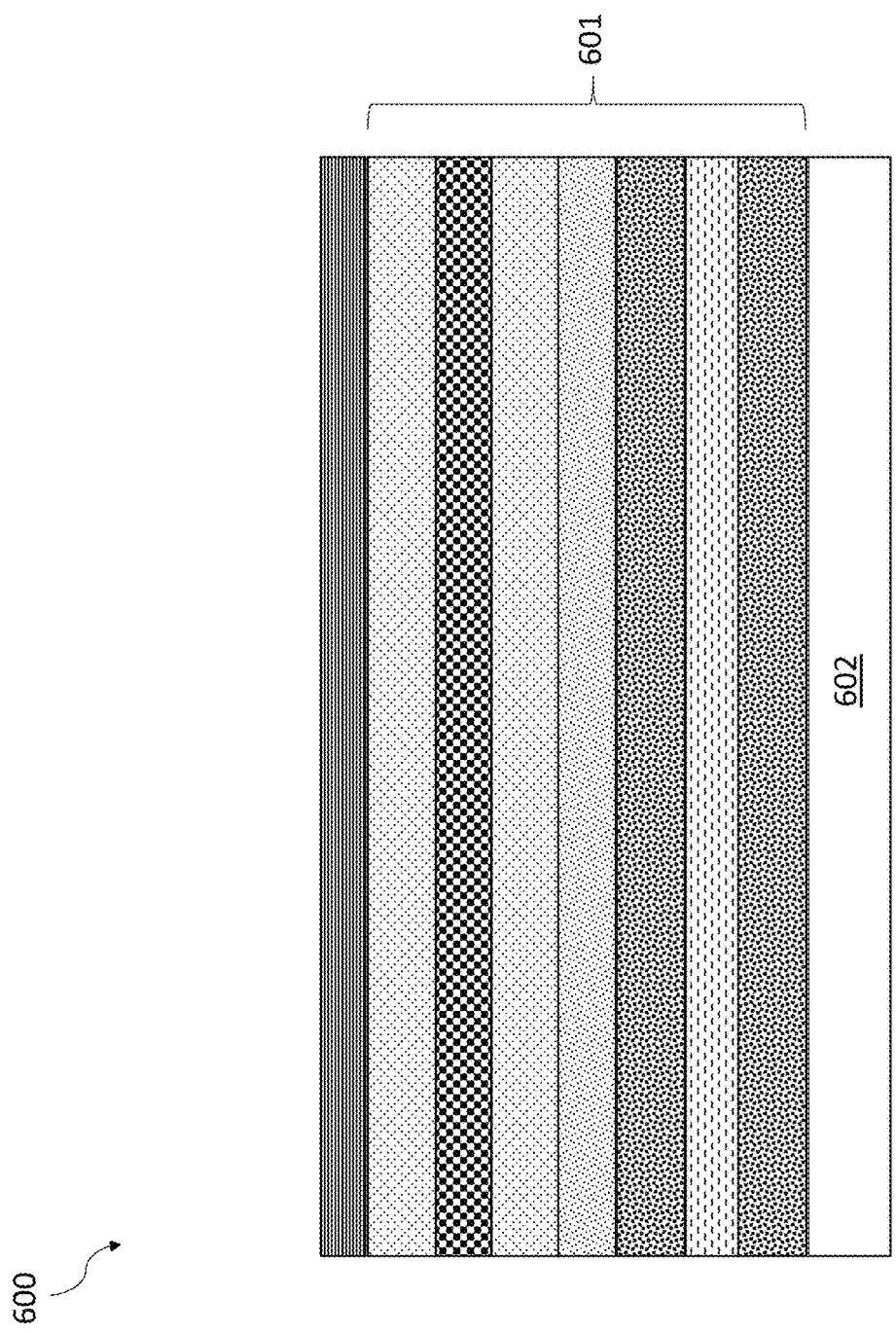
FIG. 6A

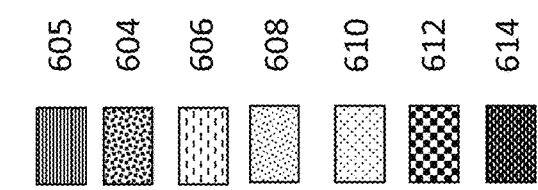
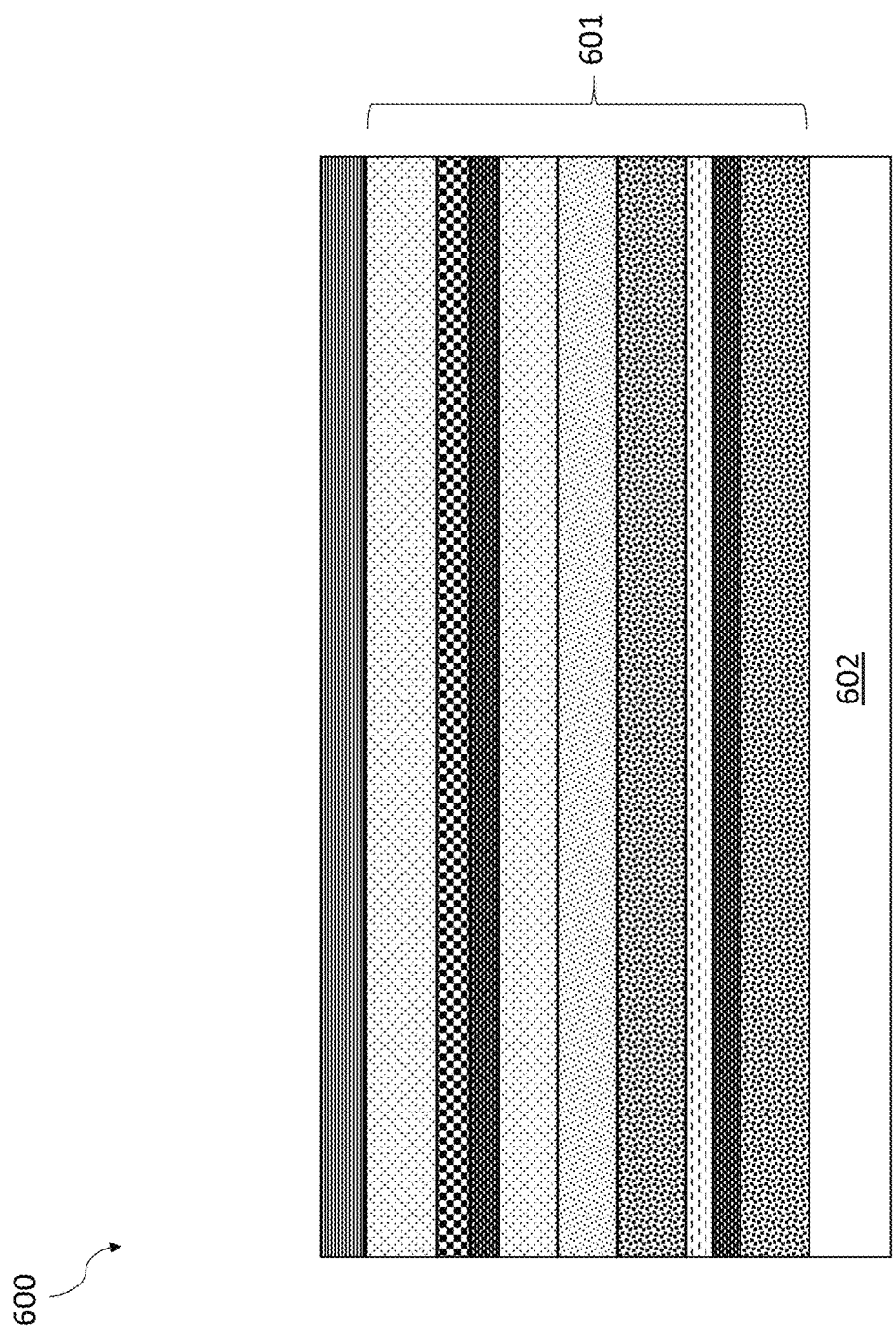
FIG. 6B

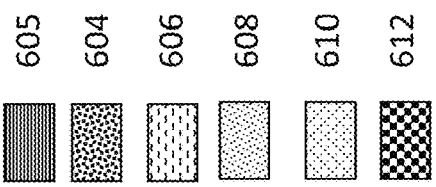
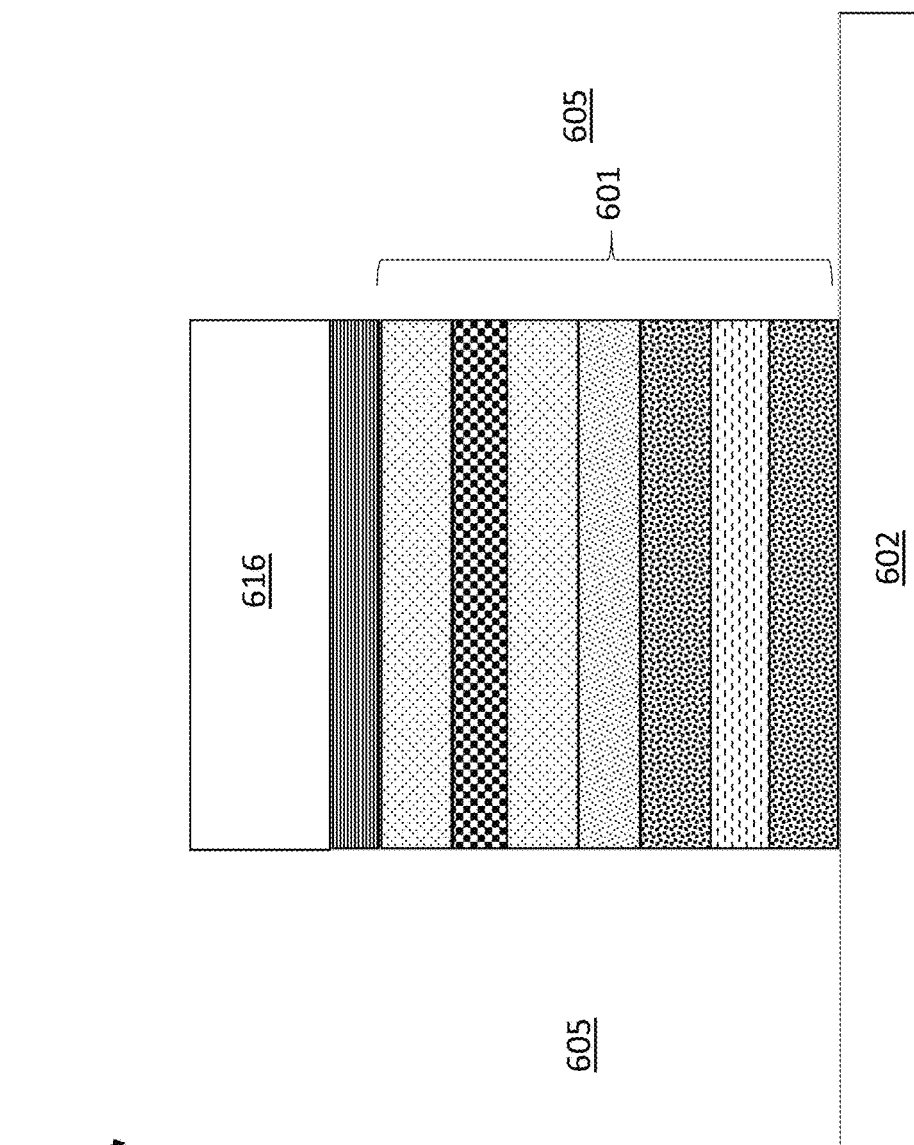
FIG. 6C

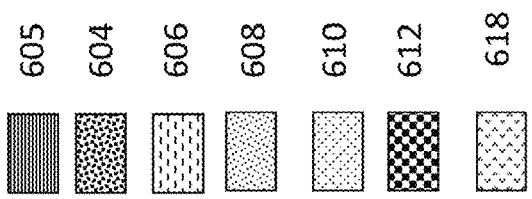
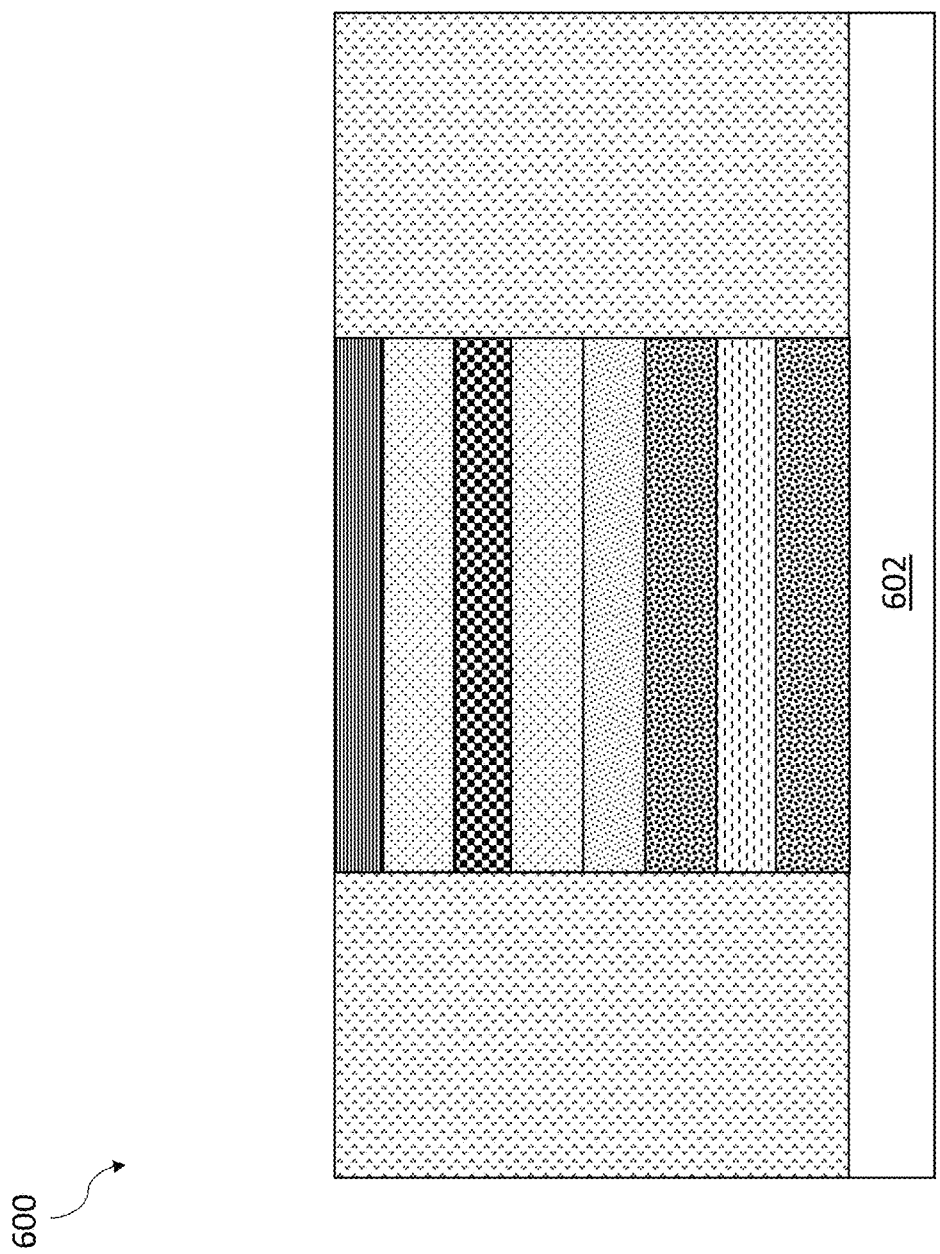
FIG. 6D

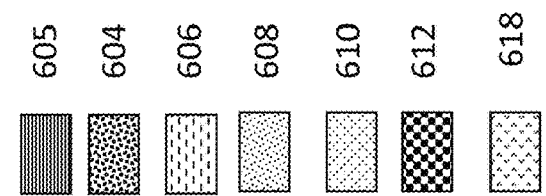
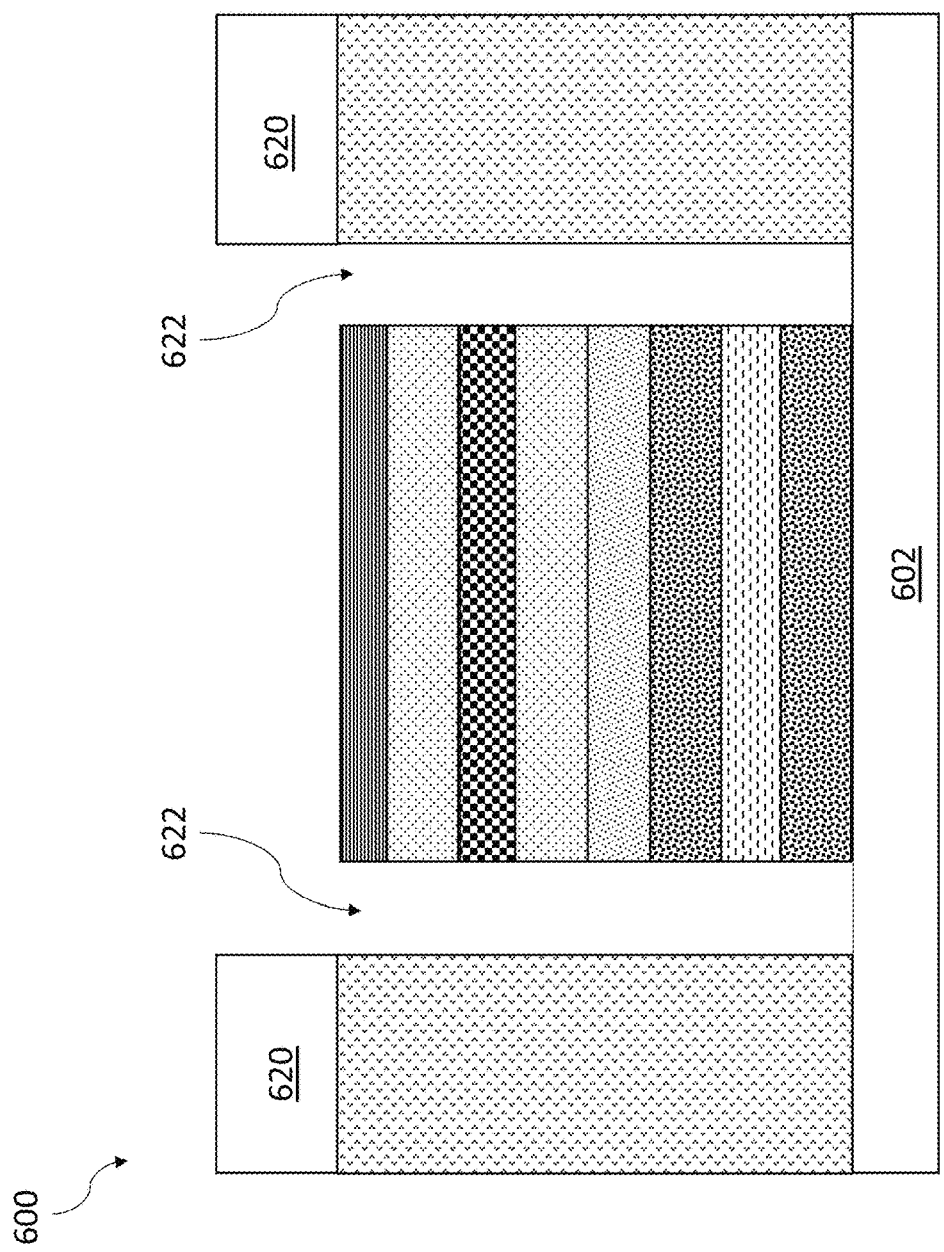
FIG. 6E

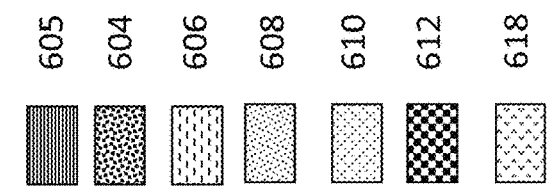
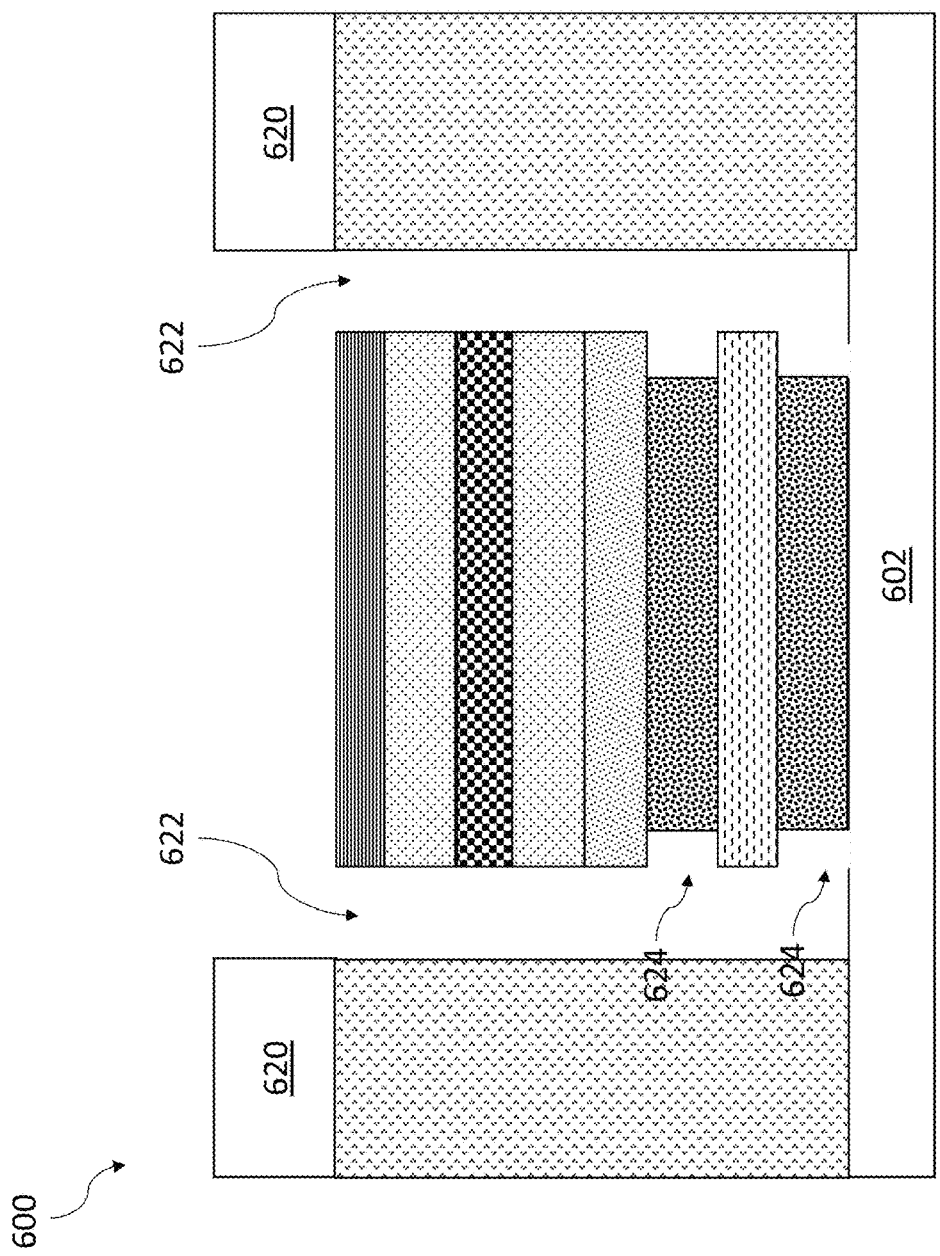
FIG. 6F

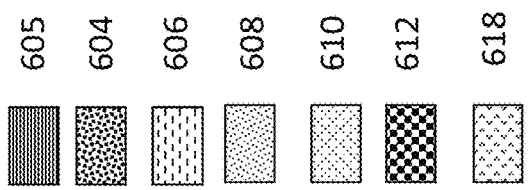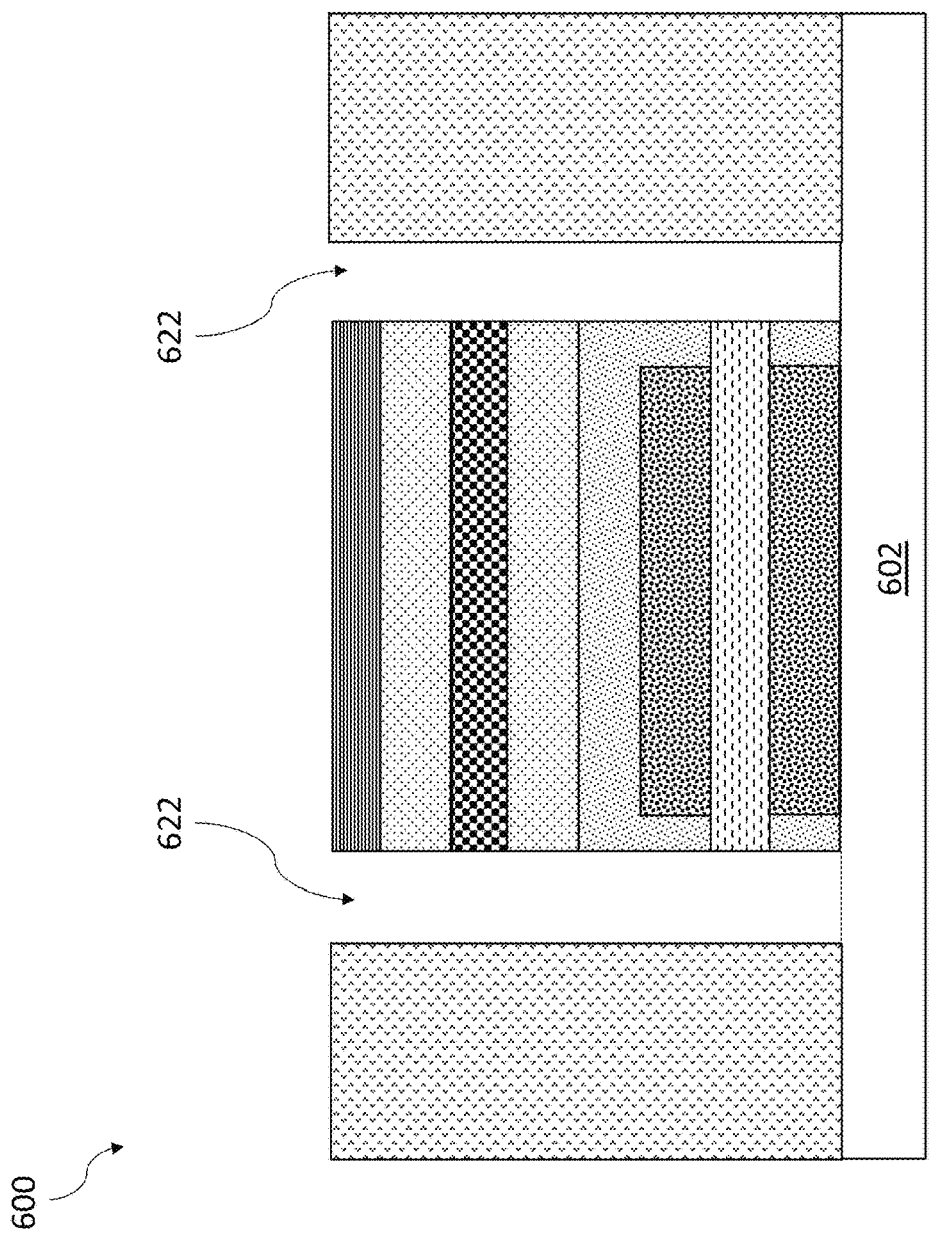
FIG. 6G

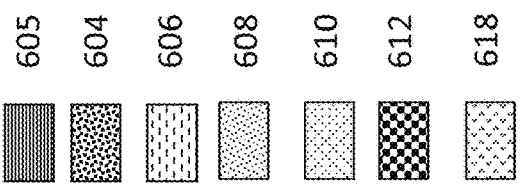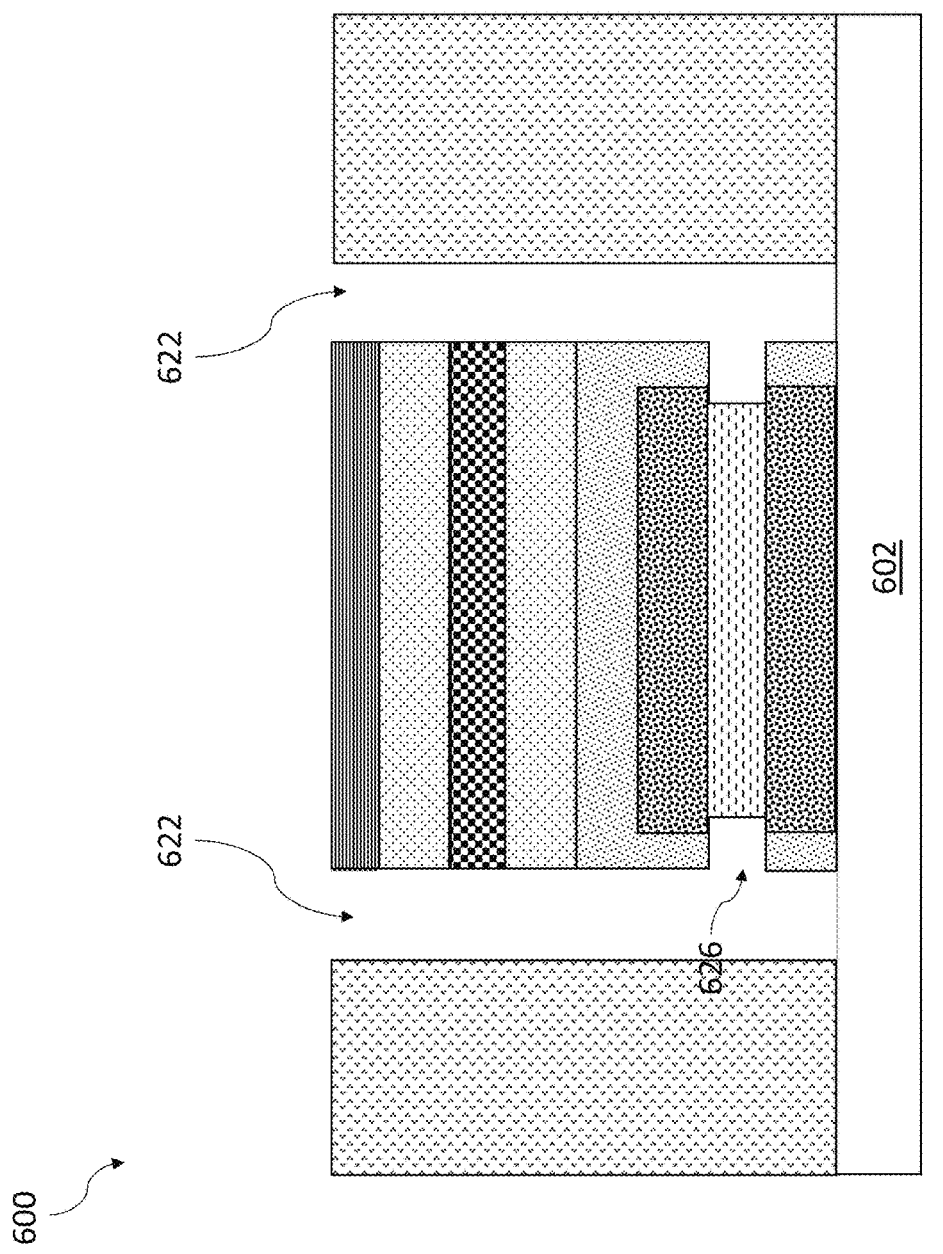
FIG. 6H

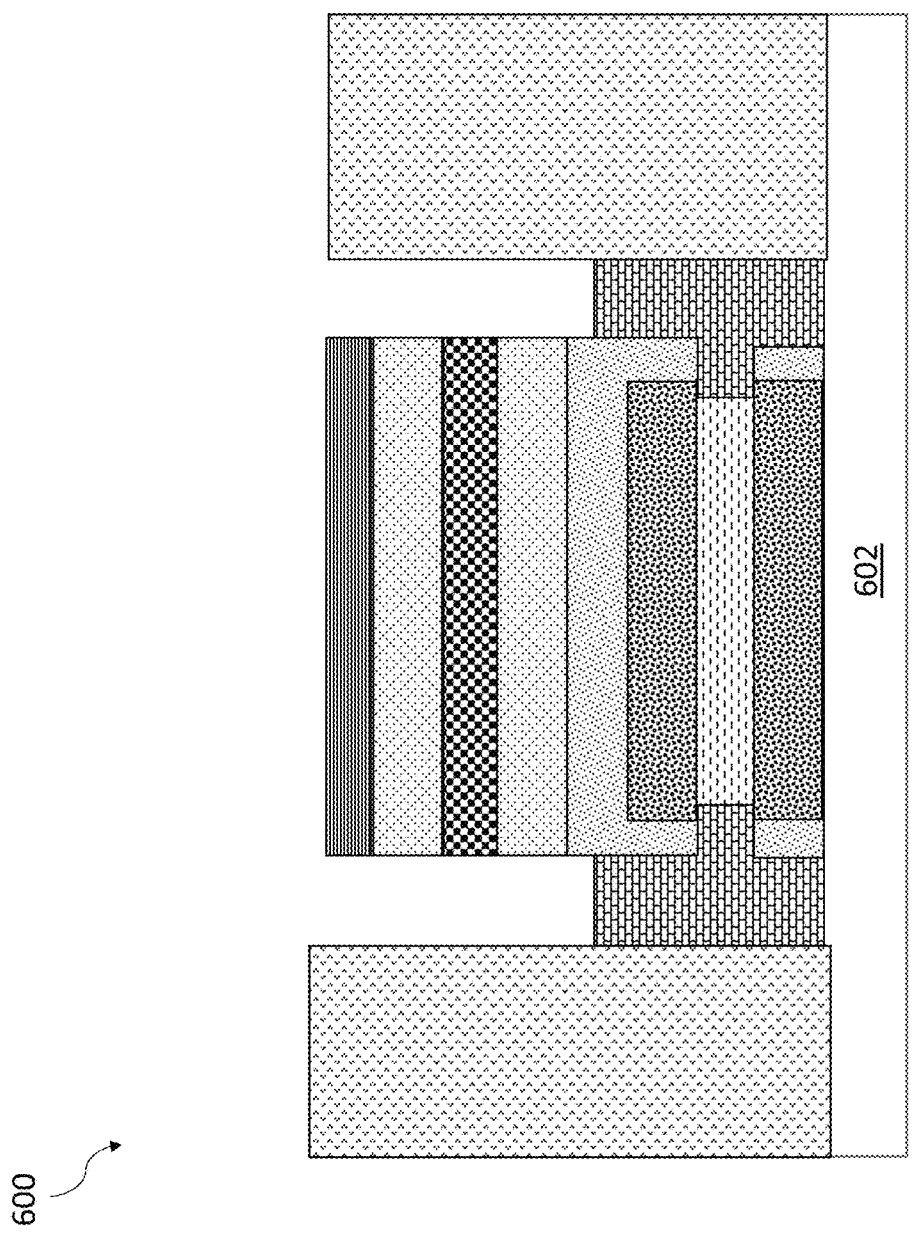

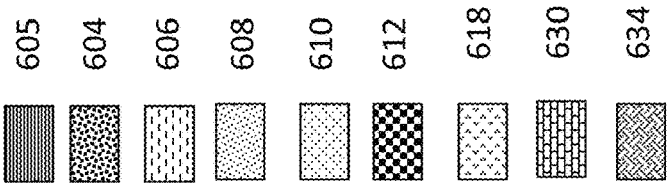
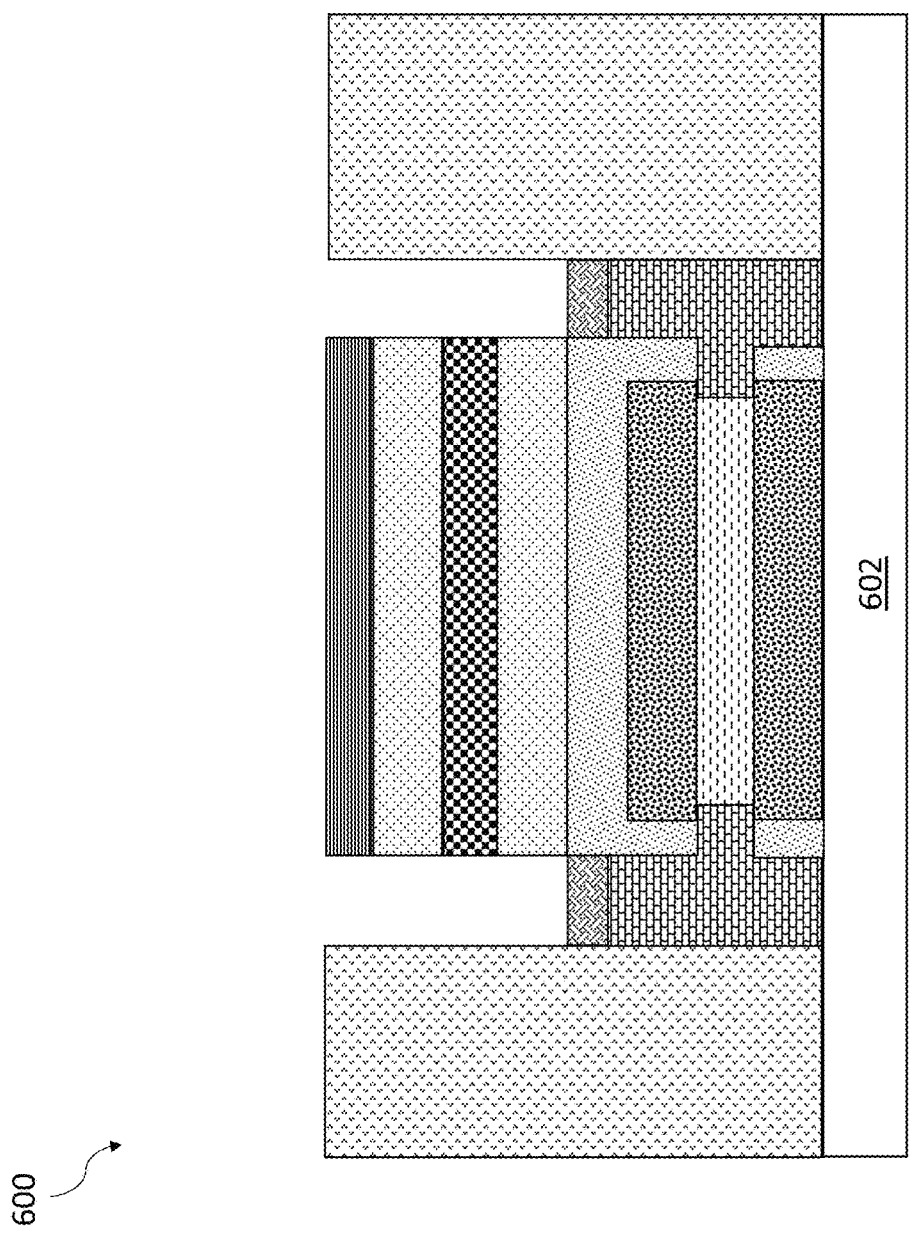
FIG. 6K

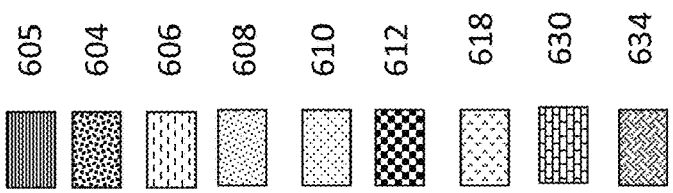
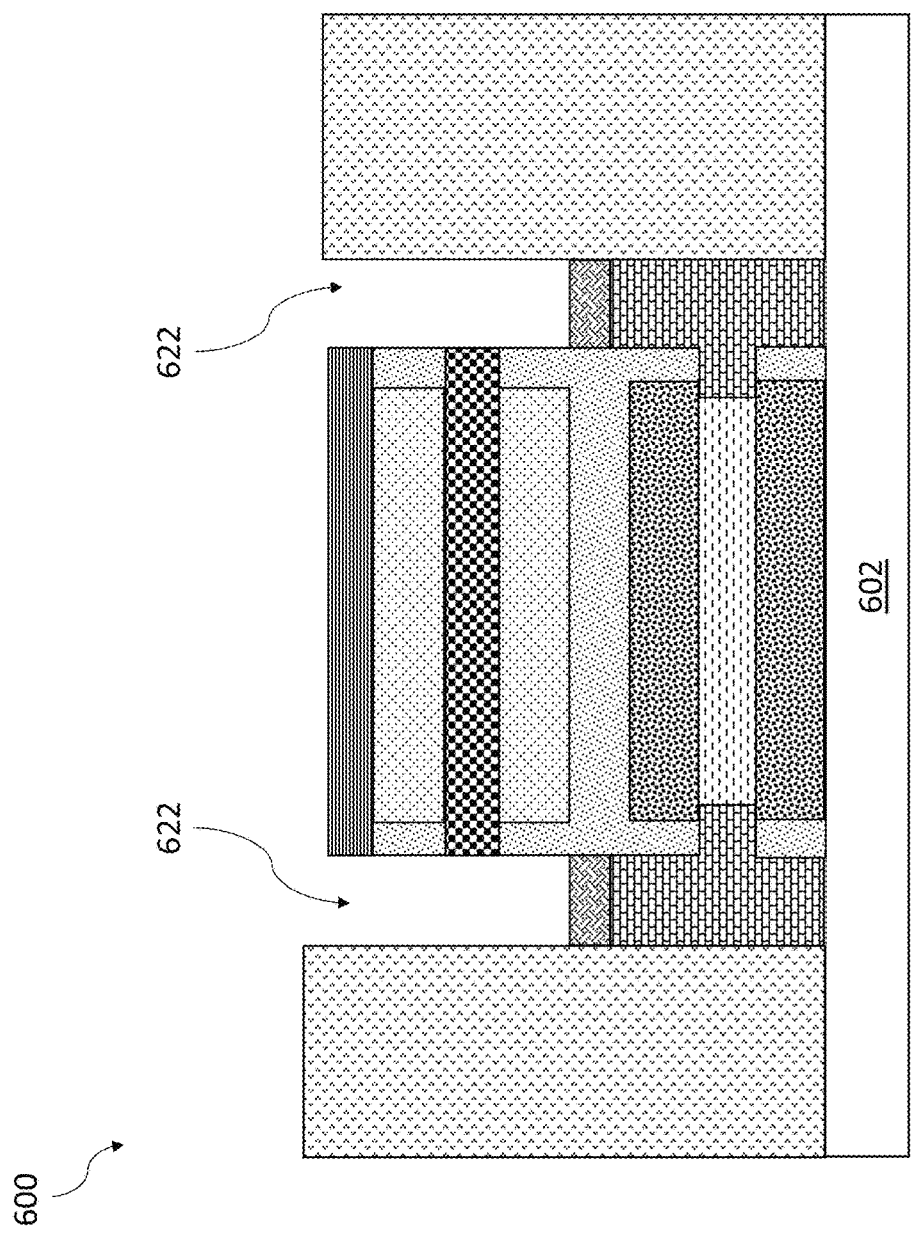
FIG. 6L

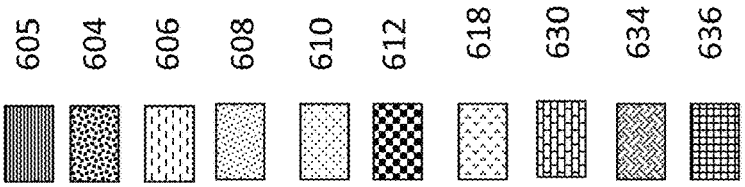
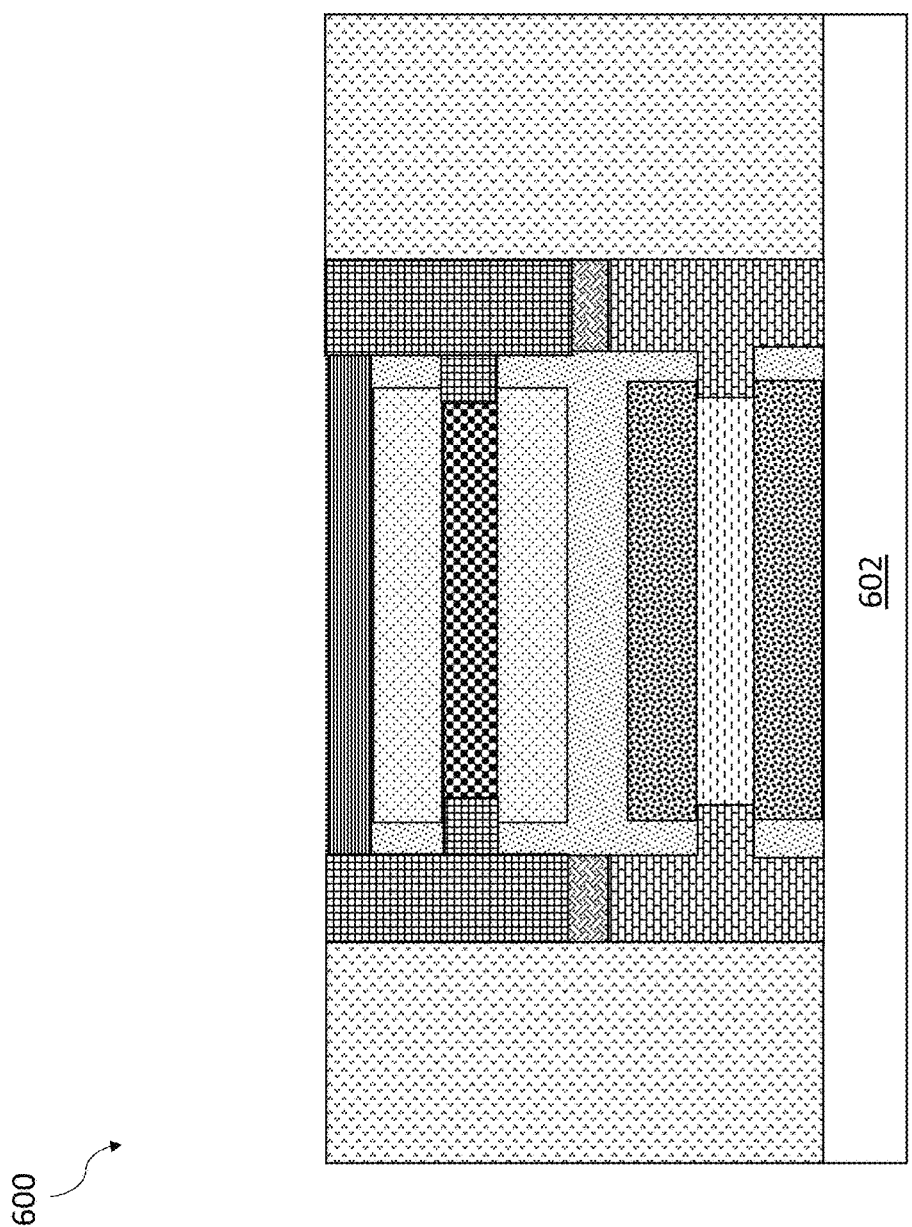
FIG. 6M

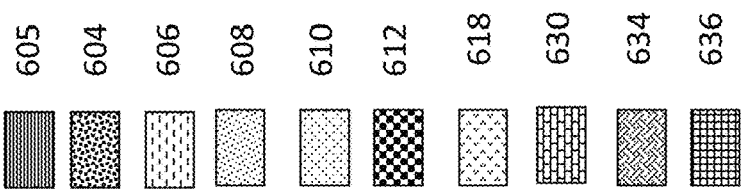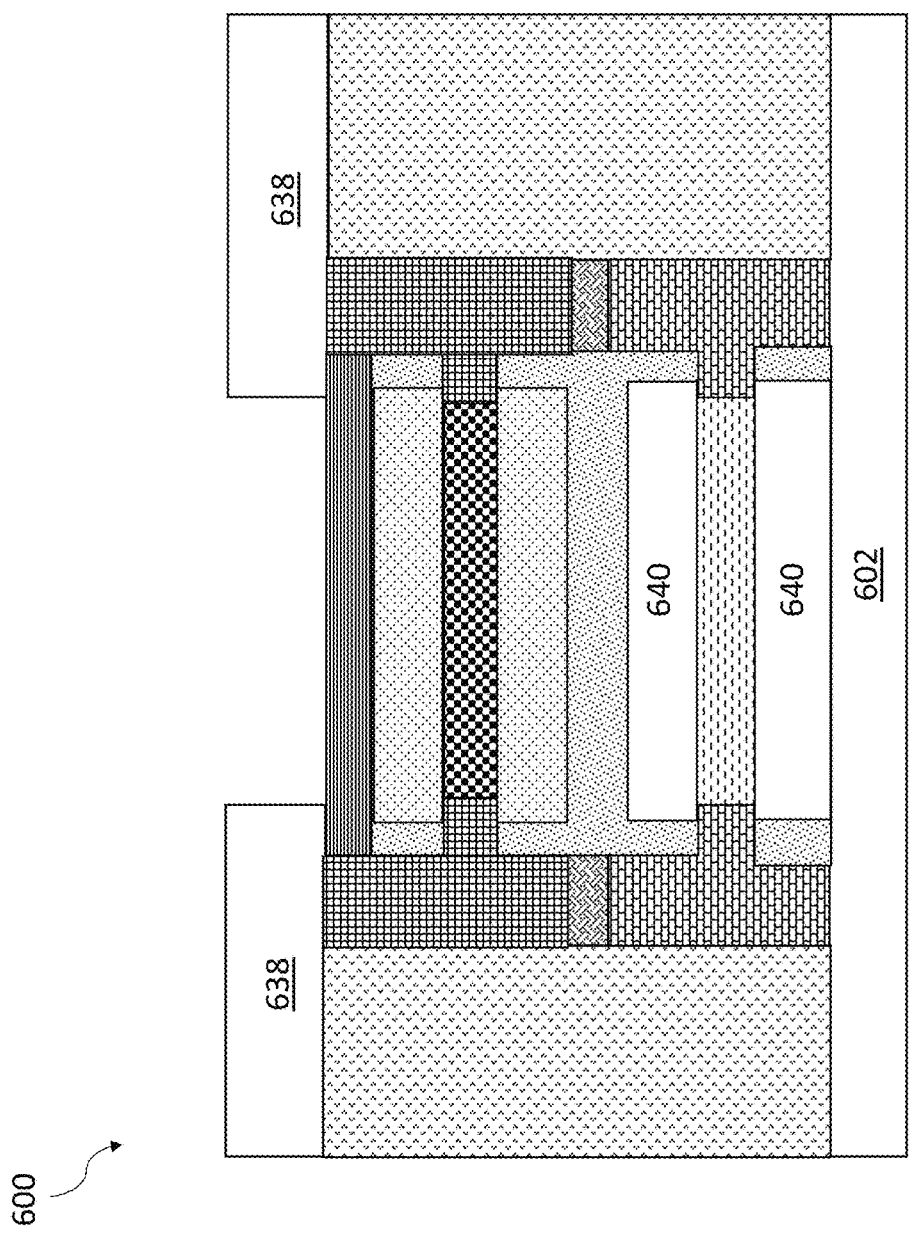
FIG. 6N

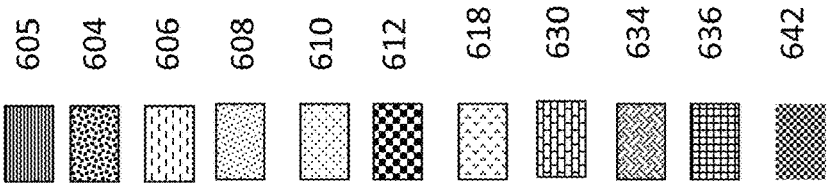
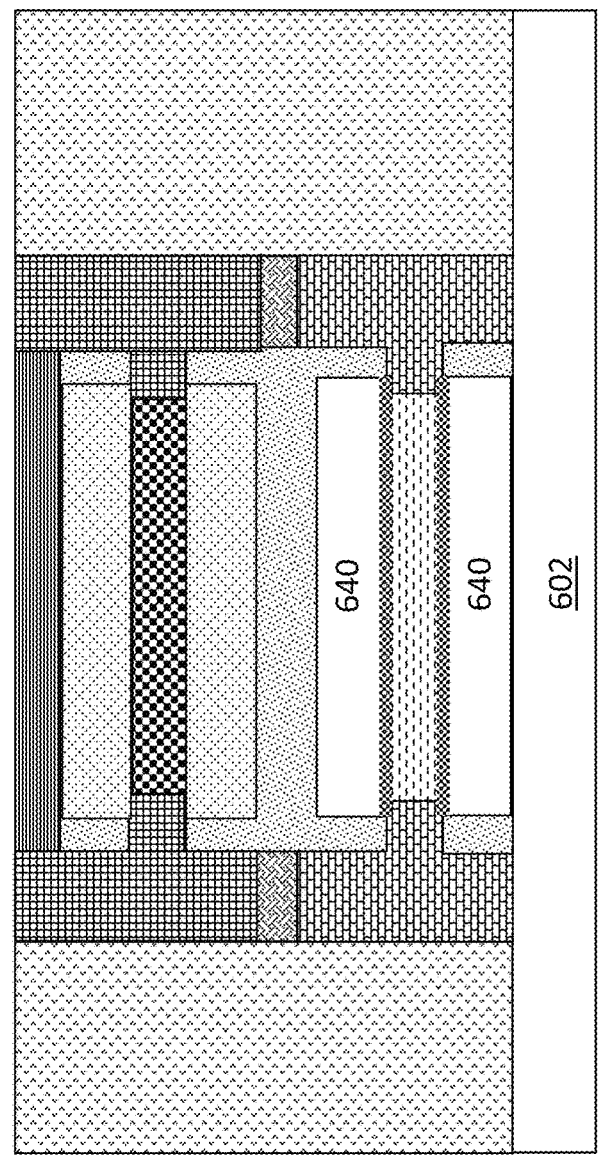
FIG. 60

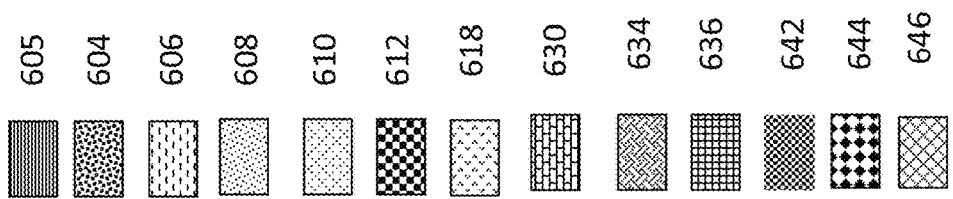
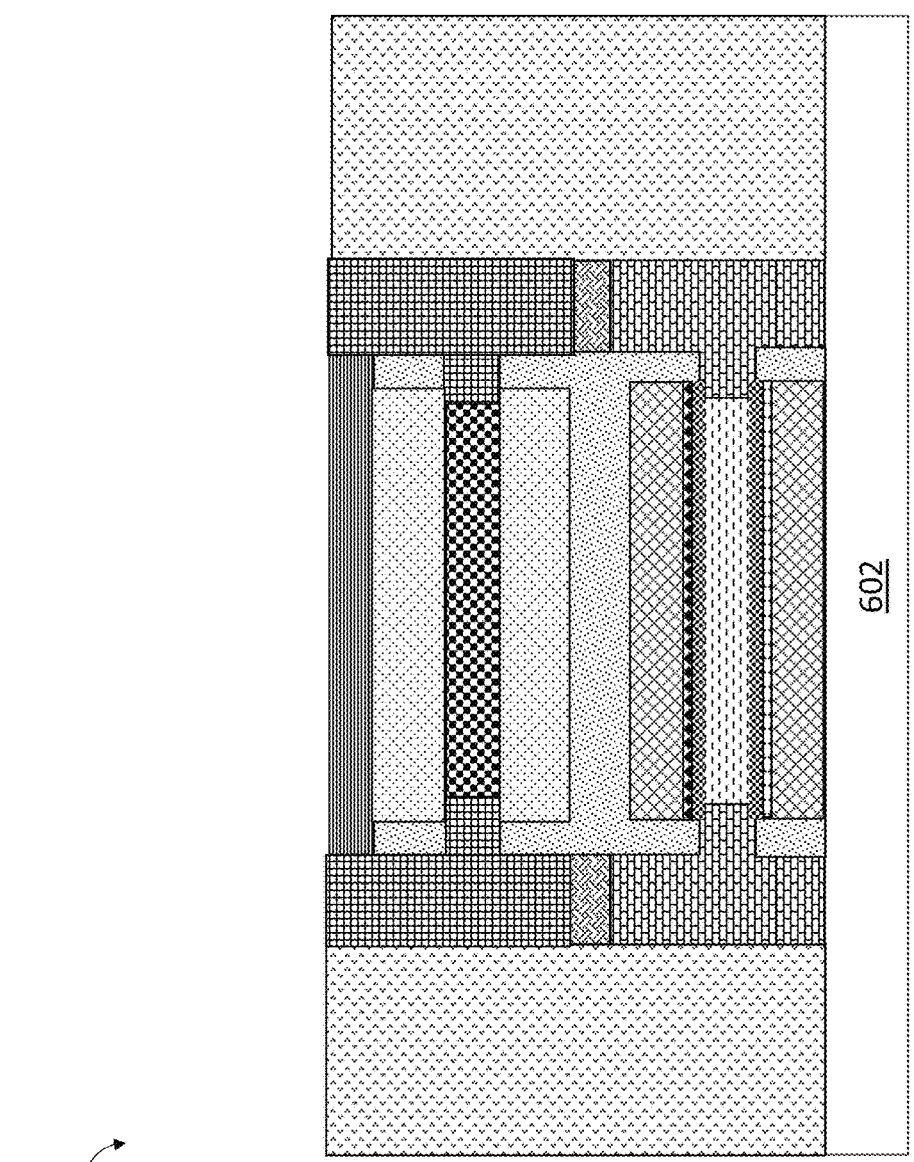
FIG. 6P

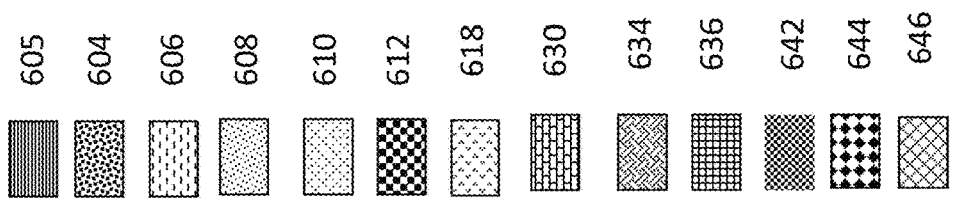
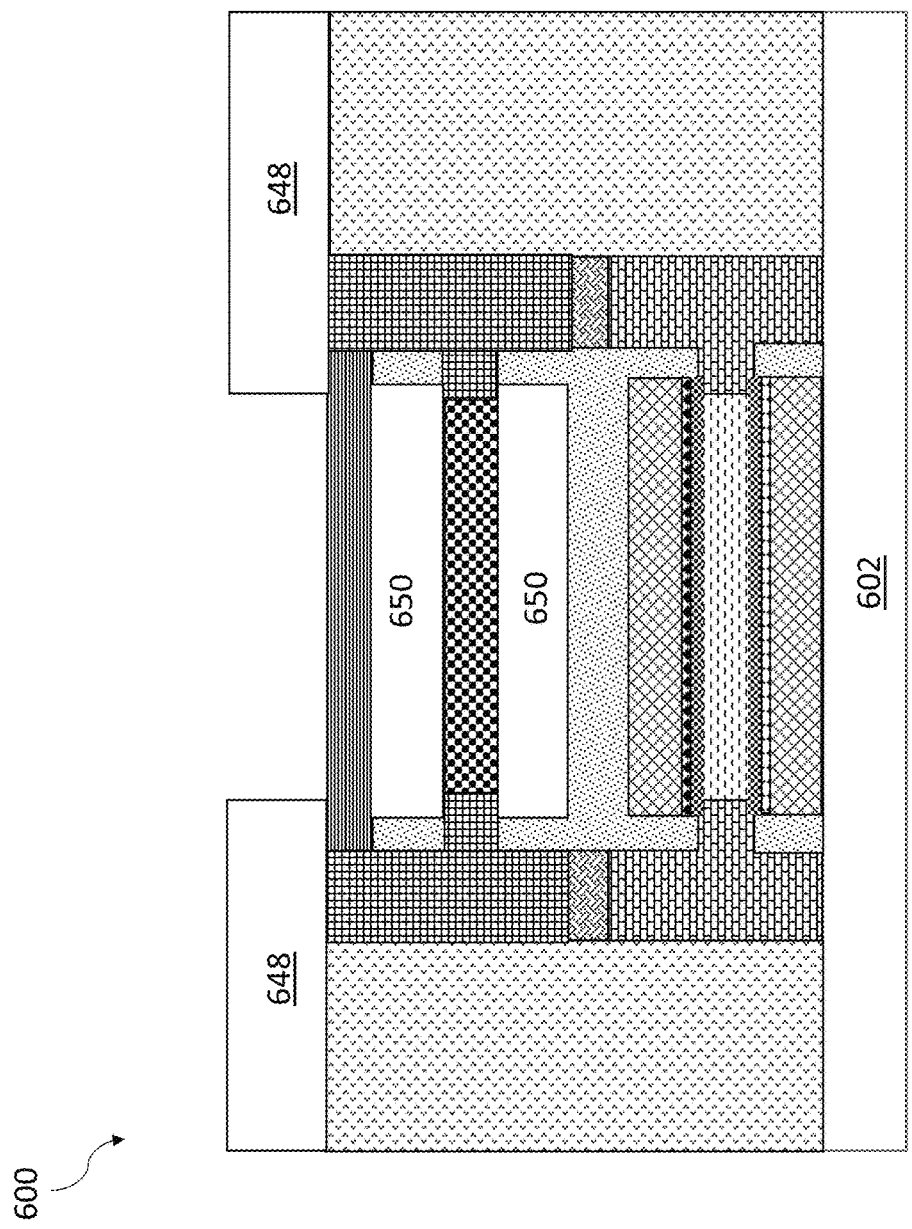
FIG. 6Q

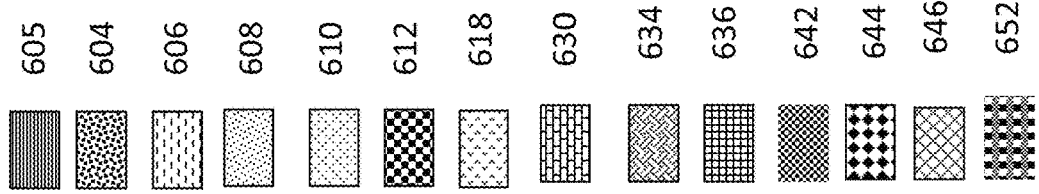
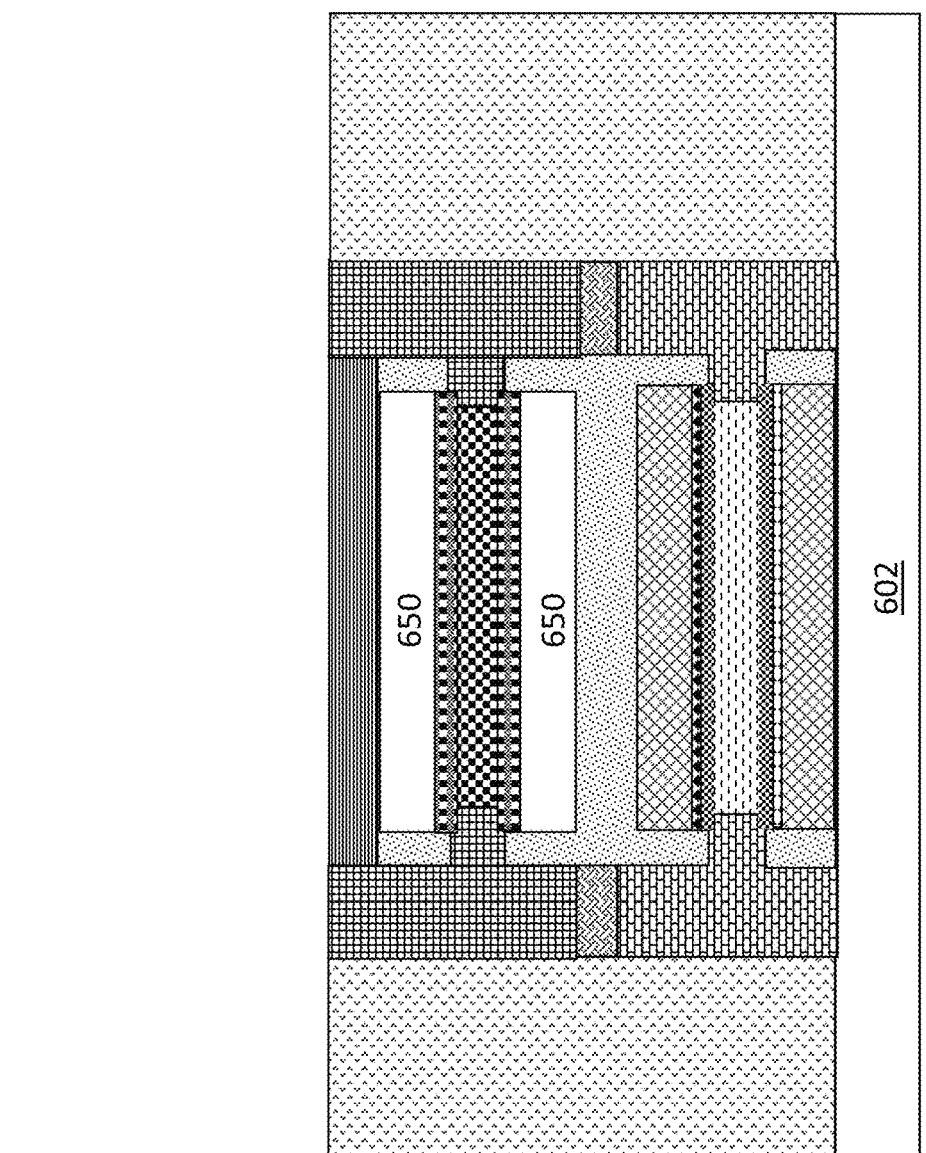
FIG. 6R

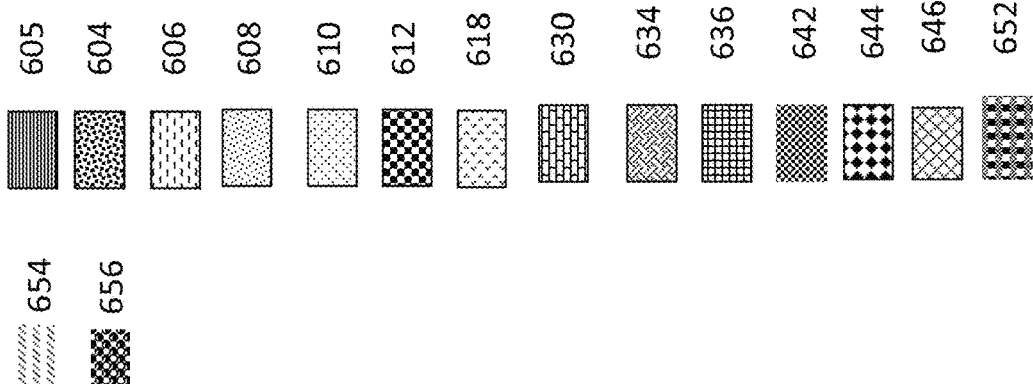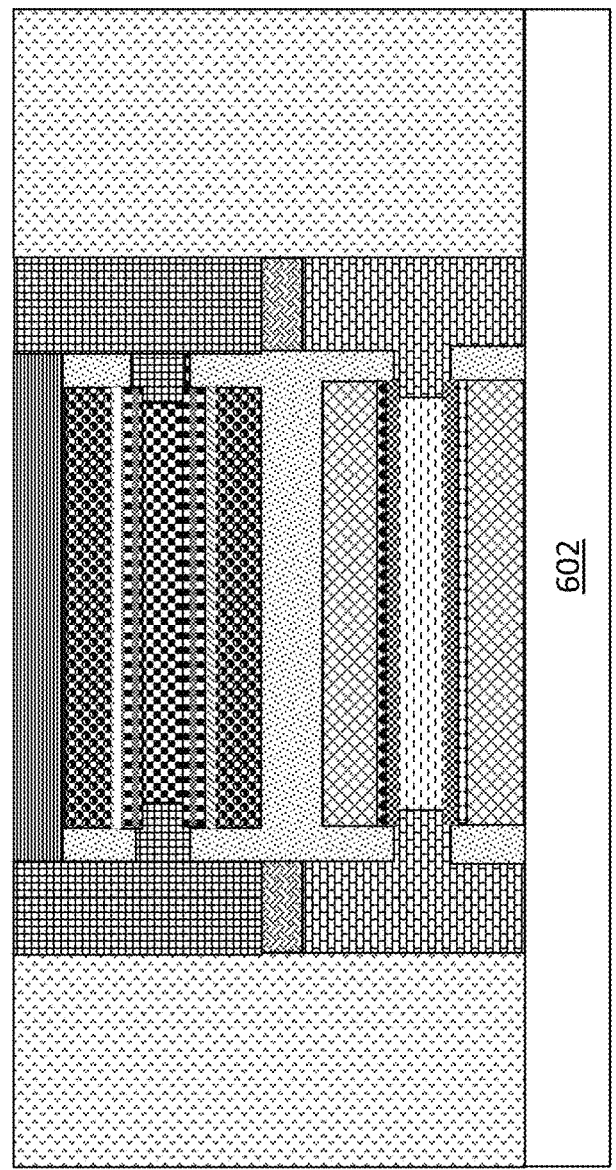
FIG. 6S

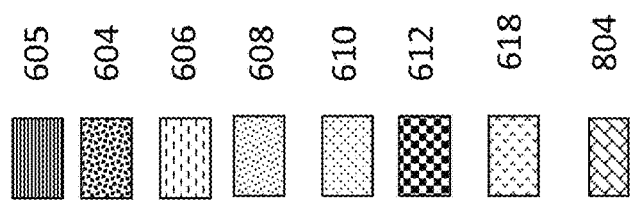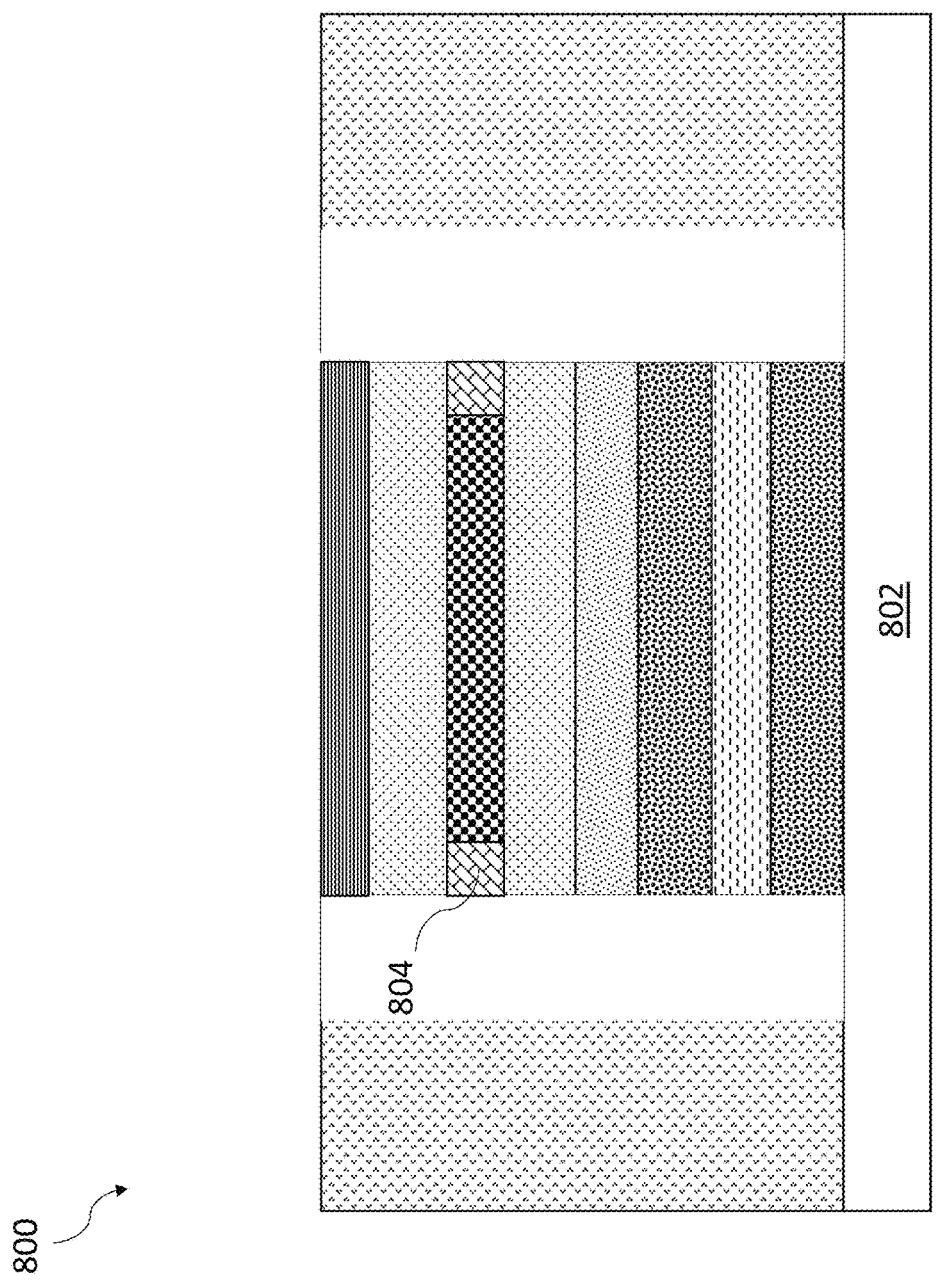
FIG. 8C

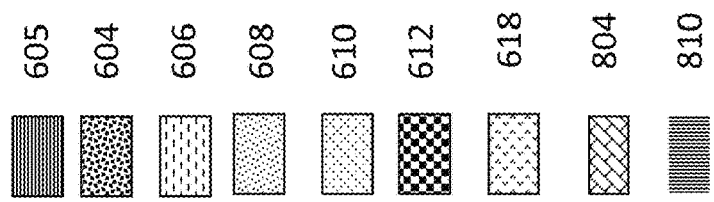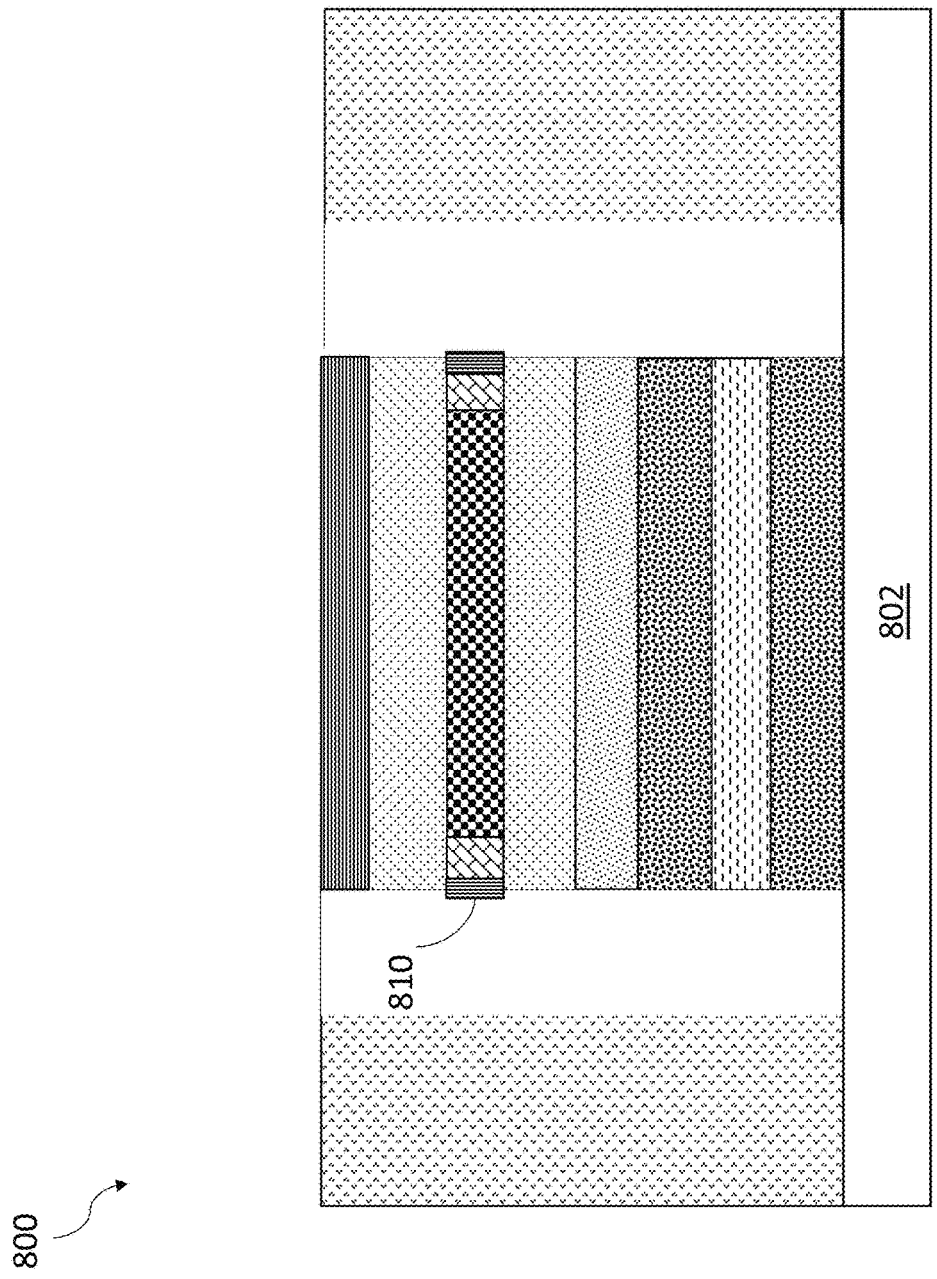
FIG. 8D

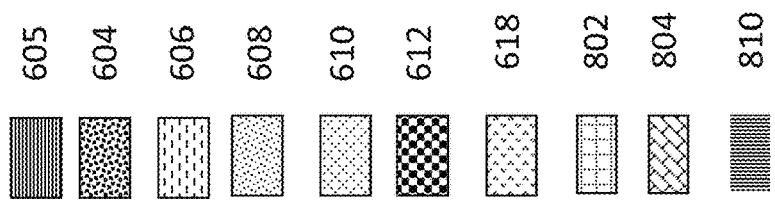
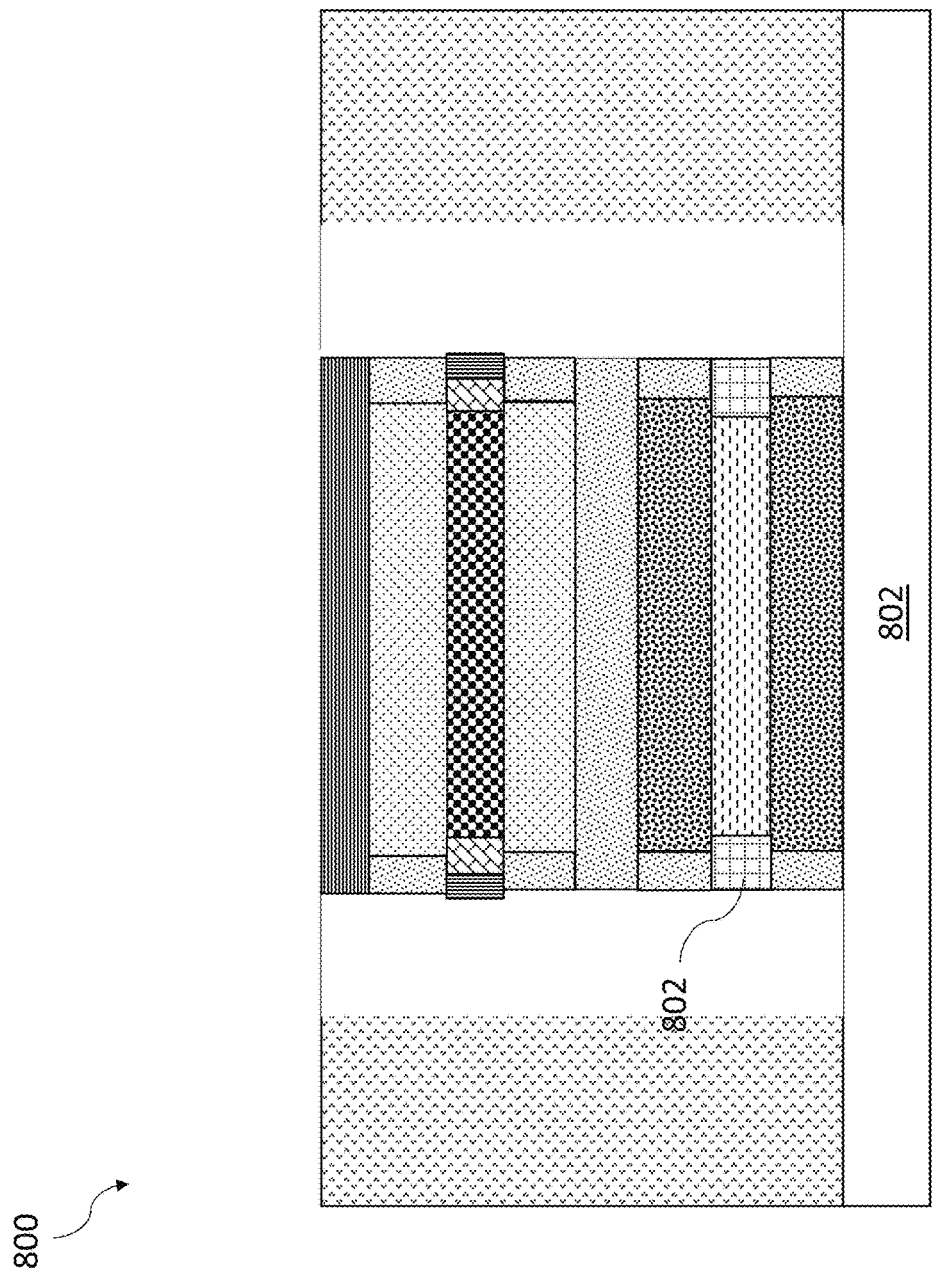
FIG. 8F

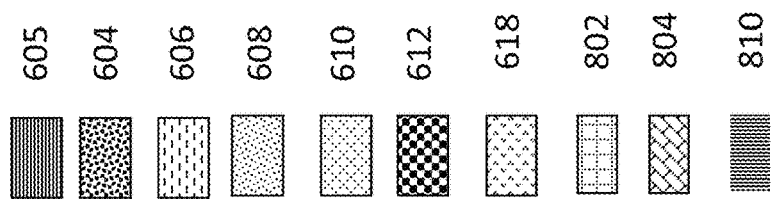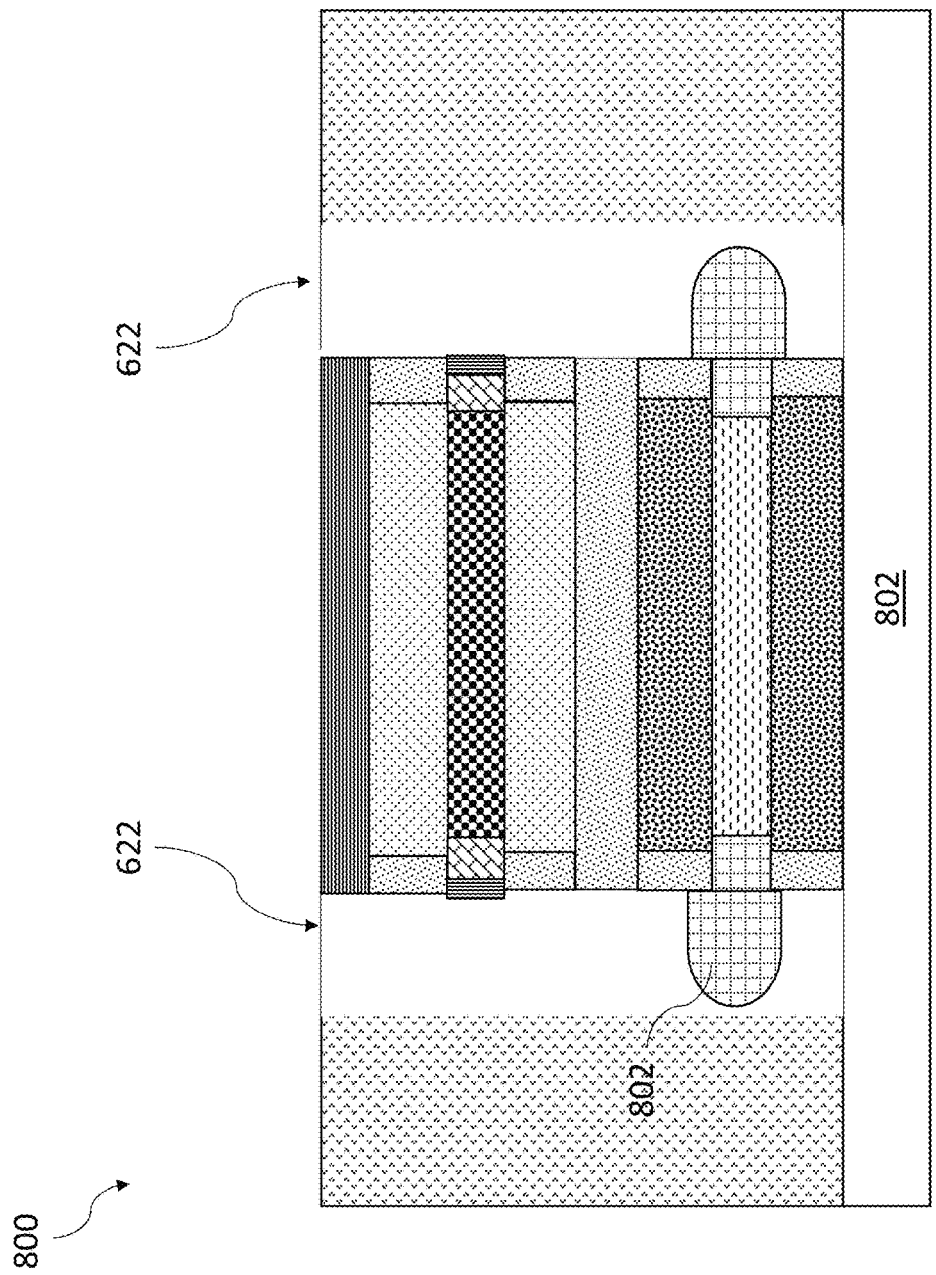
FIG. 8G

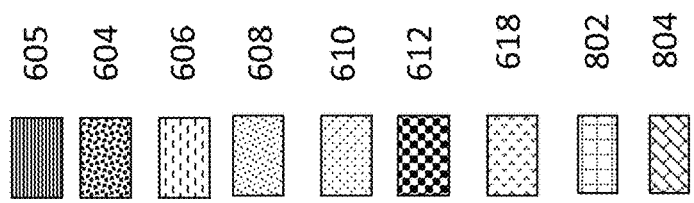
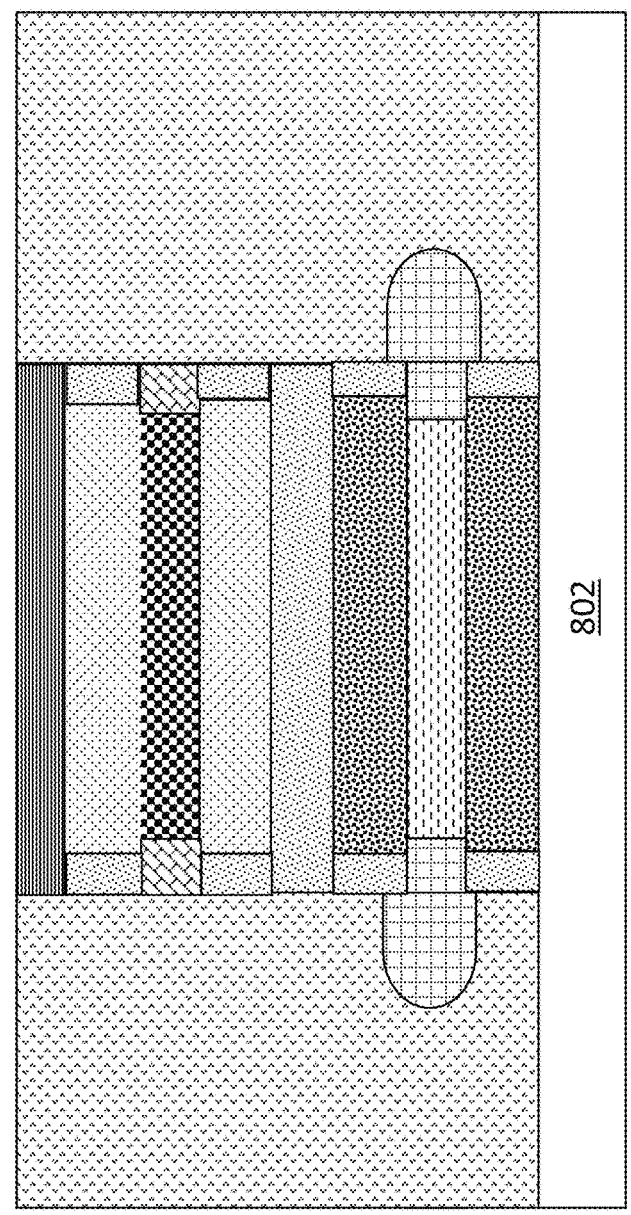
FIG. 8H

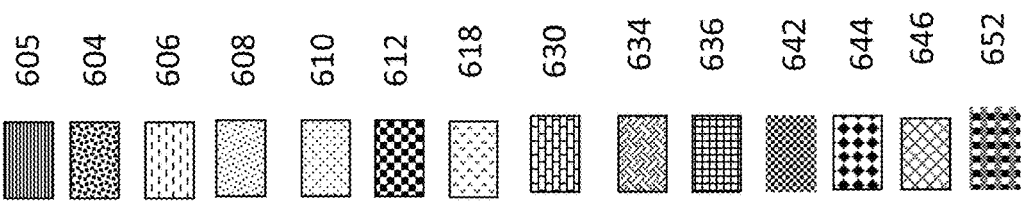
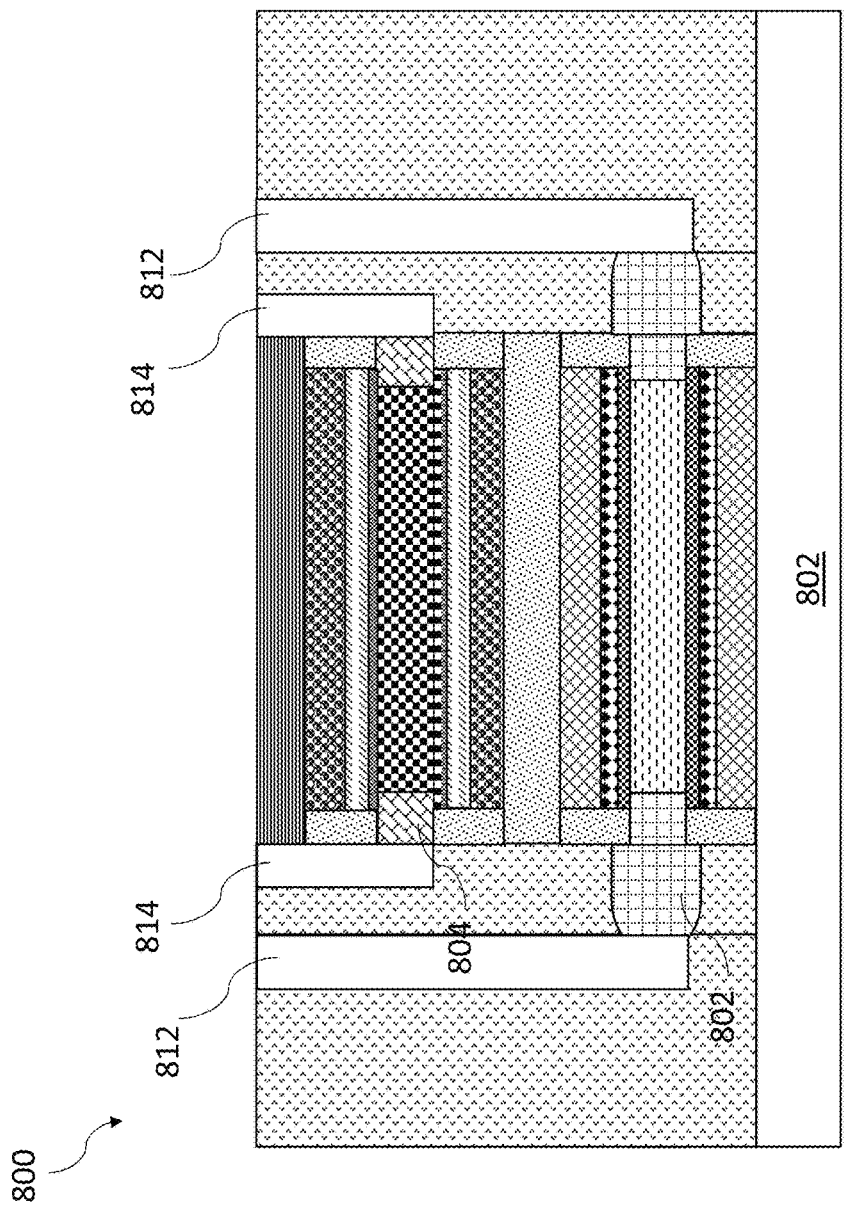
FIG. 8I

3D SELECTIVE MATERIAL TRANSFORMATION TO INTEGRATE 2D MATERIAL ELEMENTS

TECHNICAL FIELD

The present disclosure relates generally to the field of manufacturing transistors.

BACKGROUND

In the manufacture of semiconductor devices, various fabrication processes are executed, such as film-forming depositions, etch mask creation, patterning, material etching and removal, and doping treatments. These processes may be performed to form semiconductor device components on a substrate. Some example fabrication techniques allow the manufacture of transistors on a single active device plane, while wiring or metallization is formed above the active device plane. Such devices are accordingly characterized as two-dimensional (2D) circuits, manufactured using 2D fabrication techniques. Although scaling efforts have greatly increased the number of transistors per unit area in 2D circuits, these 2D fabrication techniques are approaching physical atomic limitations with single digit nanometer semiconductor device fabrication nodes.

SUMMARY

Three-dimensional (3D) integration, e.g., a stacking (or vertical arrangement) of multiple semiconductor devices (e.g., transistor structures), aims to overcome scaling limitations experienced in planar devices by increasing transistor density in volume rather than area.

One aspect of the present disclosure may be directed to a semiconductor device. The semiconductor device includes a transistor structure that may include a structure having a seed layer; a first source/drain extension in contact with the structure; a second source/drain extension in contact with the structure; a two-dimensional (2D) material around at least one of the seed layer, the first source/drain extension, or the second source/drain extension; a first source/drain structure in electrical contact with the 2D material through the first source/drain extension; a second source/drain structure in electrical contact with the 2D material through the second source/drain extension; and a gate structure around at least the 2D material.

The semiconductor device may include a second transistor structure disposed above the transistor structure and comprising: a second structure having a second seed layer; a third source/drain extension in contact with the second structure; a fourth source/drain extension in contact with the second structure; a second 2D material around at least one of the second seed layer, the third source/drain extension, or the fourth source/drain extension; a third source/drain structure in electrical contact with the second 2D material through the third source/drain extension; a fourth source/drain structure in electrical contact with the second 2D material through the fourth source/drain extension; and a second gate structure around at least the second 2D material, wherein the transistor has a first conductive type and the second transistor has a second conductive type, the first conductive type being opposite to the first conductive type.

The first 2D material and the second 2D material each include at least one of: $WS_2$, $WSe_2$, $WTe_2$, $MoS_2$, $MoSe_2$, $MoTe_2$, $HfS_2$, $ZrS_2$, $TiS_2$, GaSe, InSe, or phosphorene.

The first source/drain extension and the second source/drain extension may each include a doped metal material or a doped semiconductor material, and wherein the gate structure is around respective portions of the first source/drain extension and second source/drain extension. The seed layer may be around a semiconductor core. The semiconductor core may include one of: amorphous silicon, crystalline silicon, amorphous germanium, or crystalline germanium.

The first source/drain extension may include a first silicide metal between the first source/drain structure and a first end of the 2D material; and the second source/drain extension may include a second silicide metal between the second source/drain structure and a second end of the 2D material. The structure may comprise a dielectric material.

Another aspect of the present disclosure may be directed to a method for fabricating semiconductor devices. The method may include forming a structure vertically interposed by a first sacrificial dielectric and a second sacrificial dielectric, wherein the structure comprises a dielectric or a semiconductor; forming a source extension and a drain extension in contact with a first end and a second end of the structure, respectively; forming a source structure and a drain structure in electrical contact with the source extension and drain extension, respectively; exposing at least one of the structure, the source extension, or the drain extension at least by removing the first sacrificial dielectric and second sacrificial dielectric; and selectively growing a two-dimensional (2D) material around the structure.

The structure may include amorphous silicon, crystalline silicon, amorphous germanium, or crystalline germanium. Accordingly, the method may further include replacing end portions of the structure with a first silicide metal and a second silicide metal to form the source extension and drain extension, respectively, wherein the first silicide metal is interposed between the source structure and the first end of the structure, and the second silicide metal is interposed between the drain structure and the second end of the structure; and transforming a surface of the structure into a dielectric layer to selectively grow the 2D material on the dielectric layer. The 2D material may electrically coupled to the source structure and the drain structure through the first silicide metal and second silicide metal, respectively.

The structure may comprise a dielectric material. Accordingly, the method may further include replacing end portions of the structure with the source extension and the drain extension, respectively. The source extension may be interposed between the source structure and the first end of the structure, and the drain extension may be interposed between the drain structure and the second end of the structure. Each of the source extension and drain extension may include at least one of a semiconductor material or a metal material.

Yet another aspect of the present disclosure may be directed to a semiconductor device. The semiconductor device may include a first transistor structure and a second transistor structure. The first transistor structure may include a first two-dimensional (2D) material around a first structure having a first seed layer; a first source/drain extension in electrical contact with the first 2D material; a first source/drain structure electrically coupled to the first 2D material through the first source/drain extension; a second source/drain extension in electrical contact with the first 2D material; a second source/drain structure electrically coupled to the first 2D material through the second source/drain extension; and a first gate structure around at least the first 2D material. The semiconductor device includes a second transistor. The second transistor structure may include a second 2D material around a second structure having a second seed layer; a third source/drain extension in electrical contact with the second 2D material; a third source/drain structure electrically coupled to the second 2D material through the third source/drain extension; a fourth source/drain extension in electrical contact with the second 2D material; a fourth source/drain structure electrically coupled to the second 2D material through the fourth source/drain extension; and a second gate structure around at least the second 2D material. The second transistor structure may be disposed above the first transistor structure and isolated by a dielectric. The first transistor structure may have a first conductive type and the second transistor structure may have a second conductive type, the first conductive type being opposite to the first conductive type These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of simplicity, not every component may be labeled in every drawing. In the drawings:

FIGS. 2A to 2M illustrate respective cross-sectional views of a semiconductor device during various fabrication stages, made by the method of FIG. 1, in accordance with some embodiments.

FIGS. 4A to 4K illustrate respective cross-sectional views of a semiconductor device during various fabrication stages, made by the method of FIGS. 3A and 3B, in accordance with some embodiments.

FIGS. 6A to 6S illustrate respective cross-sectional views of a semiconductor device during various fabrication stages, made by the method of FIG. 5, in accordance with some embodiments.

FIGS. 8A to 8I illustrate respective cross-sectional views of a semiconductor device during various fabrication stages, made by the method of FIG. 7, in accordance with some embodiments.

DETAILED DESCRIPTION

Figure 1:
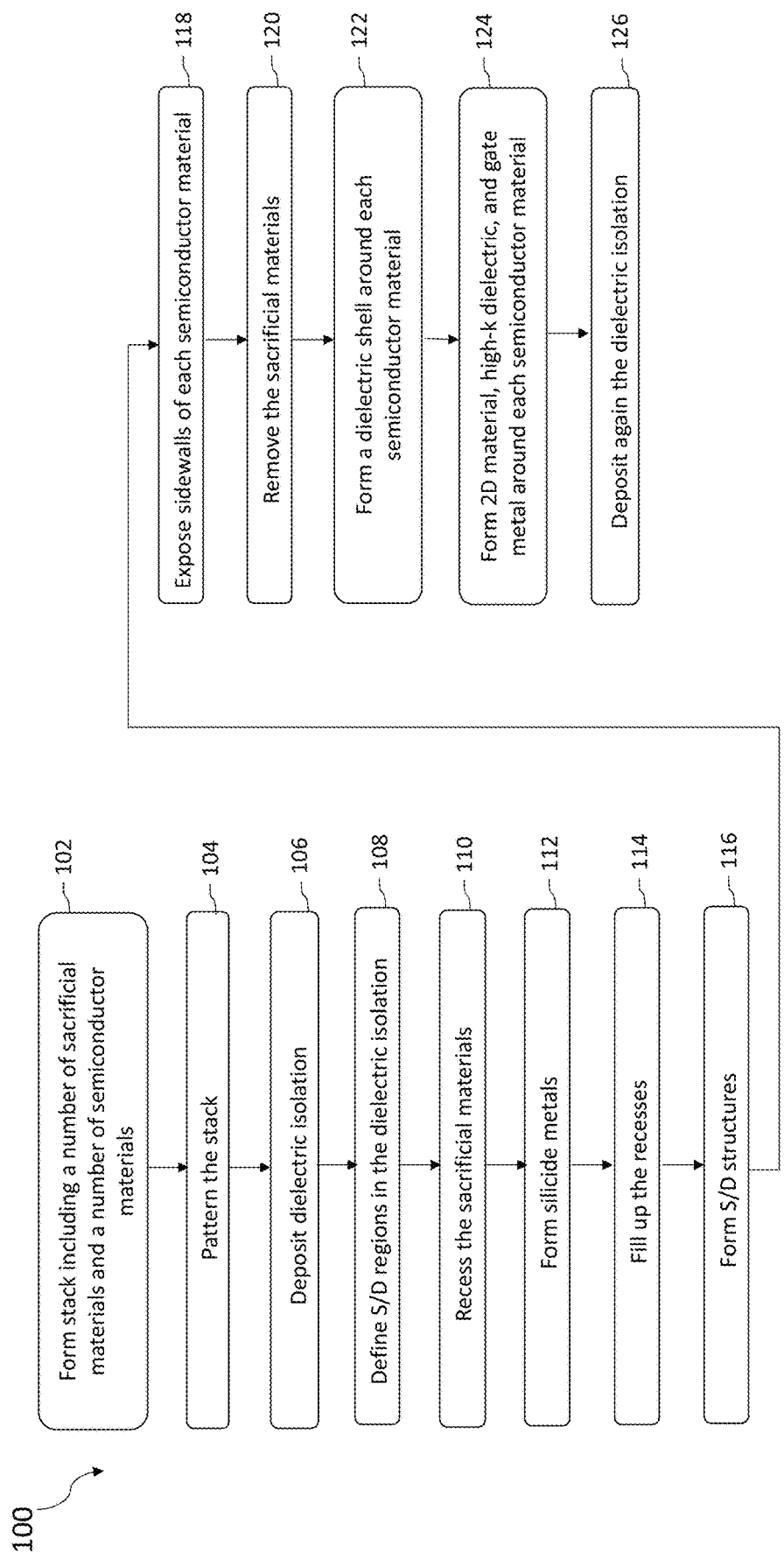
FIG. 1 illustrates a flow chart of an example method for making a semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Disclosed herein are embodiments related to one or more transistor structures formed based on a template structure. In some embodiments, the template structure may be formed of a seed layer that can facilitate the growth of a two-dimensional (2D) material. In some embodiments, the template structure may be formed of a semiconductor core, with its outer surface covered by a seed layer that can also facilitate the growth of a two-dimensional (2D) material. Based on such a template structure, advantageously, the transistor structures, as disclosed herein, may be formed as gate-all-around (GAA) transistor structures with 2D materials. In one aspect, any number of template structures can be easily stacked to form a single transistor structure having improved characteristics in an area efficient manner. In one aspect, any number of transistor structures can be stacked (e.g., vertical direction) to improve area efficiency. In one aspect, 2D materials allow significant boost in performance relative to Si, such that transistor structures disclosed herein may have improved performances or characteristics (e.g., improved transconductance (gm), improved gain bandwidth (Ft), improved saturation current (Idsat), etc.).

Reference will now be made to the figures, which for the convenience of visualizing the 3D fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative, and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, although certain figures show various layers defining transistor structures or other electric structures in a circular configuration, other shapes are also contemplated, and indeed the techniques described herein may be implemented in any shape or geometry.

FIG. 1 illustrates a flowchart of an example method 100 for forming a semiconductor device (e.g., a transistor) with at least a 2D material that operatively serves as a channel of the transistor. For example, the transistor may be a gate-all-around (GAA) transistor with a gate structure wrapping around or otherwise surrounding such a channel of a 2D material. It is noted that the method 100 is merely an example, and is not intended to limit the present disclosure. Accordingly, it is understood that additional operations may be provided before, during, and after the method 100 of FIG. 1, and that some other operations may only be briefly described herein.

In various embodiments, operations of the method 100 may be associated with cross-sectional views of an example semiconductor device 200 at various fabrication stages as shown in FIGS. 2A to 2M, respectively, which will be discussed in further detail below. It should be understood that the semiconductor device 200, shown in FIGS. 2A to 2M, may include a number of other devices such as inductors, fuses, capacitors, coils, etc., while remaining within the scope of the present disclosure.

In brief overview, the method 100 starts with operation 102 of forming a stack of a number of sacrificial materials and a number of semiconductor materials. The method 100 proceeds to operation 104 of patterning the stack. The method 100 proceeds to operation 106 of depositing a dielectric isolation. The method 100 proceeds to operation 108 of defining source/drain regions in the dielectric isolation. The method 100 proceeds to operation 110 of recessing each of the sacrificial materials. The method 100 proceeds to operation 112 of forming silicide metals. The method 100 proceeds to operation 114 of filling up the recesses. The method 100 proceeds to operation 116 of forming source/drain structures. The method 100 proceeds to operation 118 of exposing sidewalls of each of the semiconductor materials. The method 100 proceeds to operation 120 of removing the sacrificial materials. The method 100 proceeds to operation 122 of forming a dielectric layer around each of the semiconductor materials. The method 100 proceeds to operation 124 of forming a two-dimensional (2D) material, a high-k dielectric, and a gate metal around each of the semiconductor materials. The method 100 proceeds to operation 126 of depositing again the dielectric isolation.

Figure 2A:
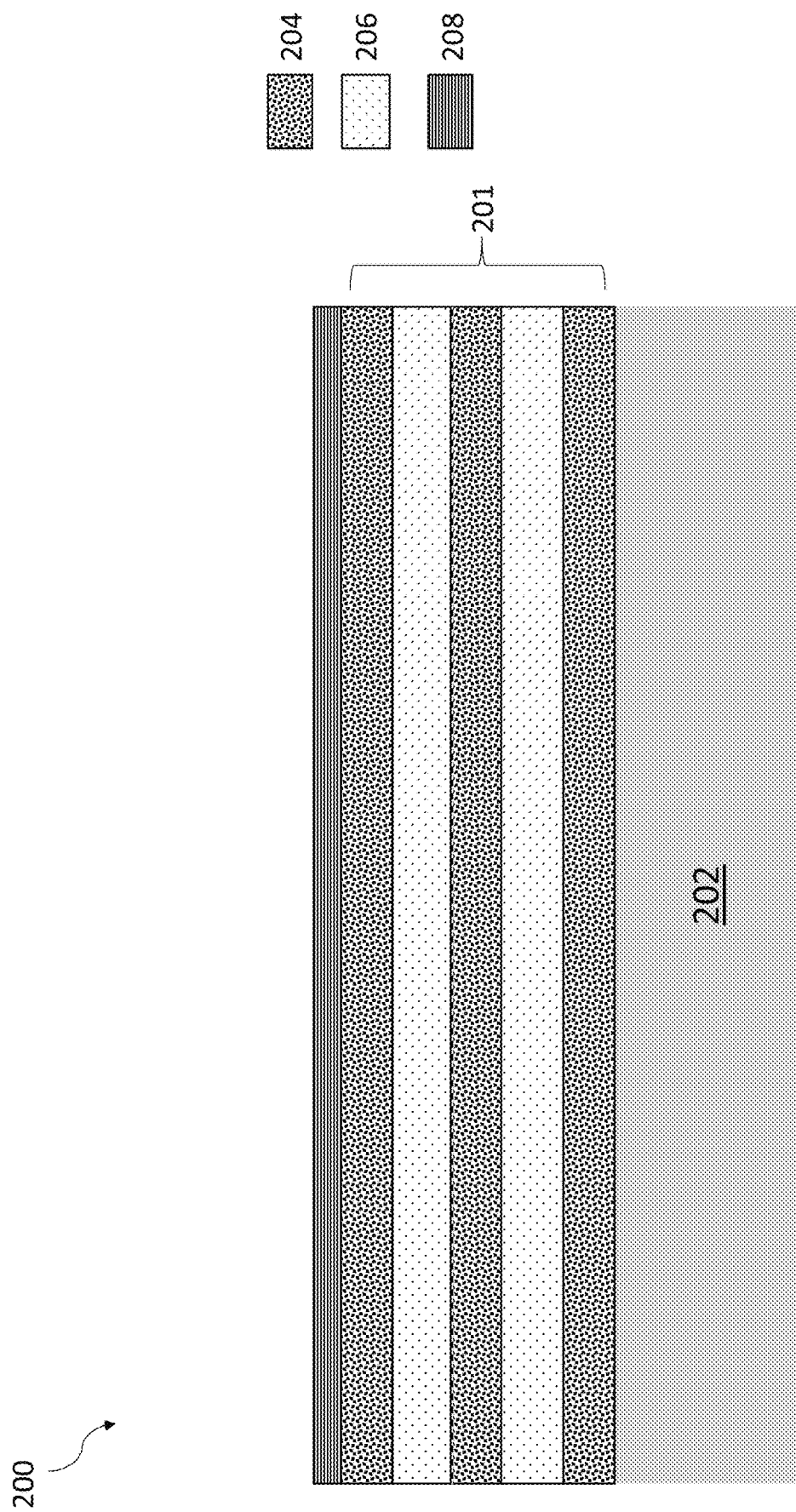

Corresponding to operation 102 of FIG. 1, FIG. 2A is a cross-sectional view of the semiconductor device 200 in which a stack 201 is formed on a substrate 202, at one of the various stages of fabrication, in accordance with various embodiments.

As shown in FIG. 2A, the stack 201, formed on the substrate 202, includes a number of sacrificial materials 204 and a number of semiconductor materials 206 alternately stacked on top of one another, where the stack 201 is overlaid by a cap layer 208. Although the stack 201 has three sacrificial materials 204 and two semiconductor materials 206 in the illustrated embodiment of FIG. 2A, it should be understood that the stack 201 can include any number of sacrificial materials 204 and any number of semiconductor materials 206 alternately stacked, while remaining within the scope of present disclosure.

In various embodiments, the sacrificial material 204 (e.g., including a dielectric material) can have an etching selectively with respect to one or more other materials formed next to itself, allowing the sacrificial material to be selectively removed while keeping the adjacent materials substantially intact (which will be discussed in further detail below). The semiconductor material 206 may be selected from the group consisting of: amorphous silicon, crystalline silicon, poly silicon, amorphous germanium, crystalline germanium, poly germanium, and combinations thereof. In this way, surfaces (e.g., top and bottom surfaces, and sidewalls) of the semiconductor material 206, upon at least removing the sacrificial material 204, can be exposed, allowing those surface to be transformed into a material or a seed layer the facilitates growth of a 2D material. The 2D material can function as a channel of the semiconductor device 200 or a portion of the channel. Accordingly, such a semiconductor material 206 can sometimes be referred to as a semiconductor bridge, semiconductor core, semiconductor sheet, or otherwise template structure for growing a 2D material channel, in accordance with various embodiments.

Corresponding to operation 104 of FIG. 1, FIG. 2B is a cross-sectional view of the semiconductor device 200 in which the stack 201 is patterned, at one of the various stages of fabrication, in accordance with various embodiments. The stack 201 may be patterned by performing at least one of the following processes: (1) forming a (e.g., photoresist) mask 210 on the stack 201; (2) etching the stack 201 to define a width and length of the semiconductor material 206 (a majority of which will be surrounded by a 2D material) using the mask 210; and (3) removing the mask 210. In some embodiments, the mask 210 may be formed on the cap layer 208. In some embodiments, the etching may be anisotropic (e.g., vertically applied over the workpiece), which allows the (patterned) stack 201 to have its sidewalls substantially aligned with the mask 210. In various embodiments, the removed portions of the stack 201, which exposes ends of each of the semiconductor material 206, can define a pair of openings 209, as shown.

Corresponding to operation 106 of FIG. 1, FIG. 2C is a cross-sectional view of the semiconductor device 200 in which the openings 209 (FIG. 2B) are filled with a dielectric isolation 211, at one of the various stages of fabrication, in accordance with various embodiments. In some embodiments, the dielectric isolation 211 can have an etching selectivity with respect to one or more other materials formed next to itself. For example, the dielectric isolation 211 may have an etching selectivity with respect to the sacrificial material 204, which allows the sacrificial material 204 to be partially etched or fully removed while keeping the dielectric isolation 211 substantially intact.

Figure 2D:
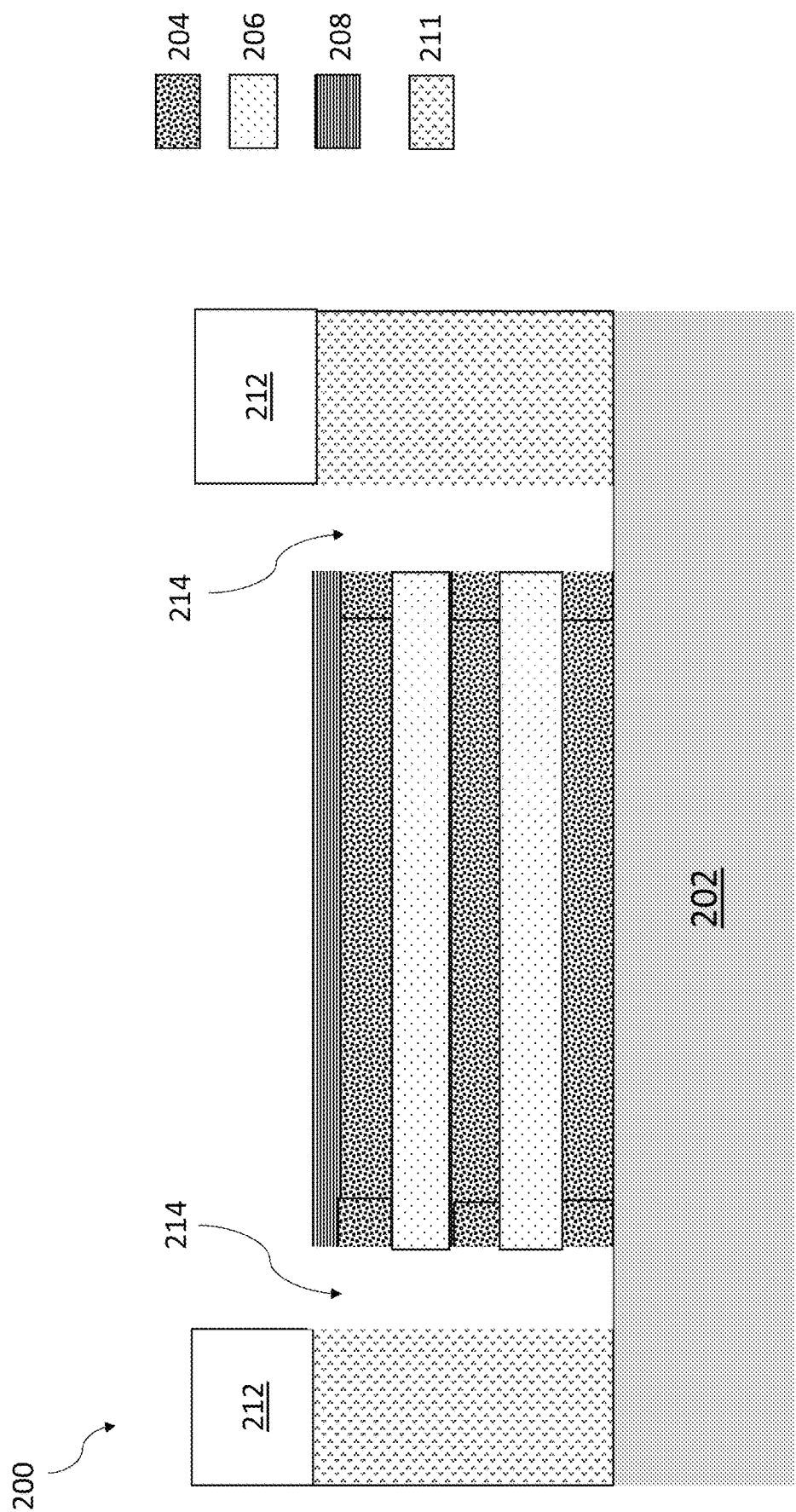

Corresponding to operation 108 of FIG. 1, FIG. 2D is a cross-sectional view of the semiconductor device 200 in which a pair of source/drain regions (or source/drain openings) 214 are defined in the dielectric isolation 211, at one of the various stages of fabrication, in accordance with various embodiments. The source/drain regions 214 may be patterned by performing at least one of the following processes: (1) forming a (e.g., photoresist) mask 212 on the dielectric isolation 211; (2) etching the dielectric isolation 211 to define a footprint of a pair of source/drain structures using the mask 212 (and the cap layer 208); and (3) removing the mask 212. In some embodiments, the mask 212 may be formed on the dielectric isolation 211. In some embodiments, the etching may be anisotropic (e.g., vertically applied over the workpiece), which again exposes ends of each of the semiconductor material 206.

Figure 2E:
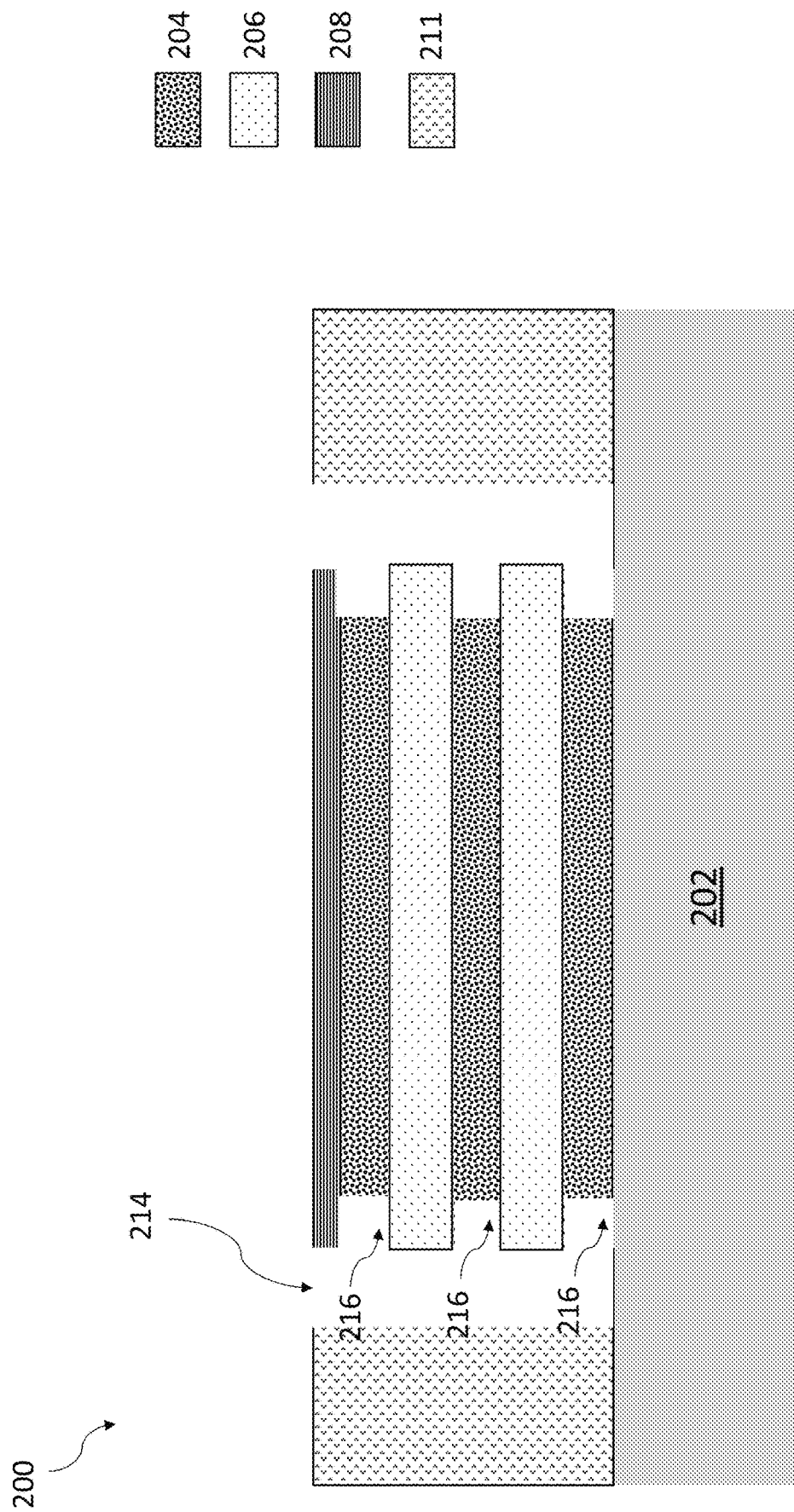

Corresponding to operation 110 of FIG. 1, FIG. 2E is a cross-sectional view of the semiconductor device 200 in which a pair of recesses 216 are formed in respective ends of the sacrificial material 204, at one of the various stages of fabrication, in accordance with various embodiments. The recesses 216 can be formed at least by etching the sacrificial material 204 through the source/drain regions 214. The etching may be isotropic, anisotropic, or combinations thereof. Specifically, the etching may include applying etchants on exposed sidewalls of the sacrificial materials 204 and the semiconductor materials 206, while the etchants may induce a limited etching amount on the semiconductor materials 206 (and the dielectric isolation 211). As such, the sacrificial materials 204 may each be inwardly indented on each end with a certain distance. Such a distance can be controlled according to a time duration of the etching process, for example.

Figure 2F:
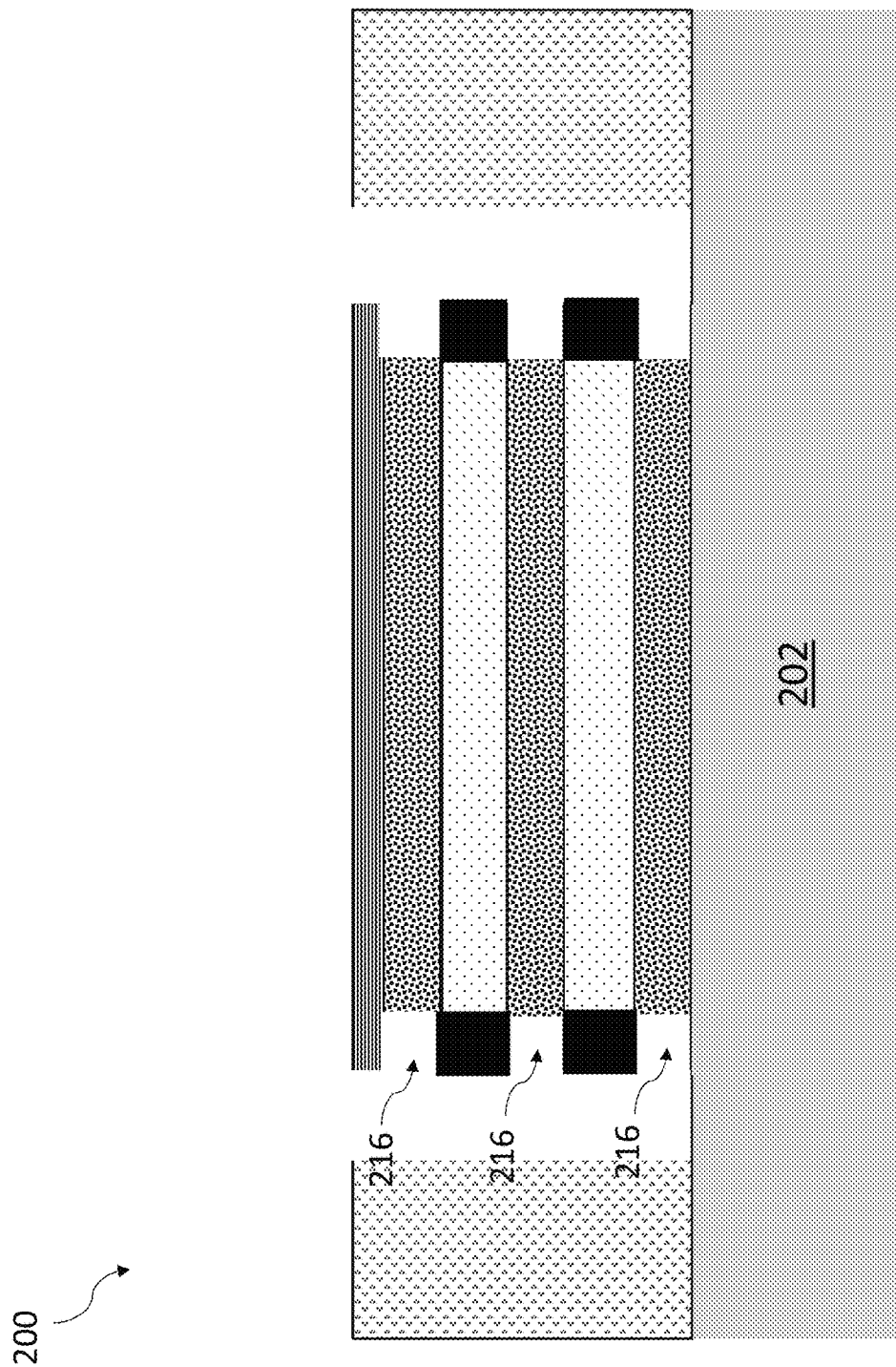

Corresponding to operation 112 of FIG. 1, FIG. 2F is a cross-sectional view of the semiconductor device 200 including a number of silicide metals 218, at one of the various stages of fabrication, in accordance with various embodiments. A pair of the silicide metals 218 can be formed on respective ends of each of the semiconductor materials 206. For example in FIG. 2F (and the following figures), the silicide metal 218 can surround a protruding portion of the corresponding semiconductor material 206 with respect to the "recessed" sacrificial material 204. The silicide metal 218 may be formed by performing at least some of the following processes: (1) depositing a metal layer (e.g., titanium, nickel, cobalt, or combinations thereof) surrounding the protruding portion of a corresponding semiconductor material 206; and (2) annealing the workpiece causing the metal layer to react with at least the protruding portion of the semiconductor material 206. As a result, the silicide metal 218 may include titanium silicide, nickel silicide (NiSi), cobalt silicide (CoSi), or any of various other metal-semiconductor compound materials.

Corresponding to operation 114 of FIG. 1, FIG. 2G is a cross-sectional view of the semiconductor device 200 in which the recesses 216 (FIG. 2F) are filled with a dielectric material 220, at one of the various stages of fabrication, in accordance with various embodiments. The dielectric material 220 can provide electrical isolation for adjacent conductive (e.g., metal or silicide metal) structures. As such, the neighboring silicide metals 218, e.g., vertically stacked on top of one another, can be electrically isolated by the filling dielectric material 220.

Corresponding to operation 116 of FIG. 1, FIG. 2H is a cross-sectional view of the semiconductor device 200 including source/drain structures 222, at one of the various stages of fabrication, in accordance with various embodiments. The source/drain structures 222 may be formed by performing at least some of the following processes: (1) filling the source/drain regions 214 (FIG. 2E) with a metal material (e.g., tungsten, titanium, nickel, cobalt, or combinations thereof); and (2) performing a chemical mechanical polishing (CAR') process until the cap layer 208 is (e.g., again) exposed to remove excessive metal material.

Figure 2I:
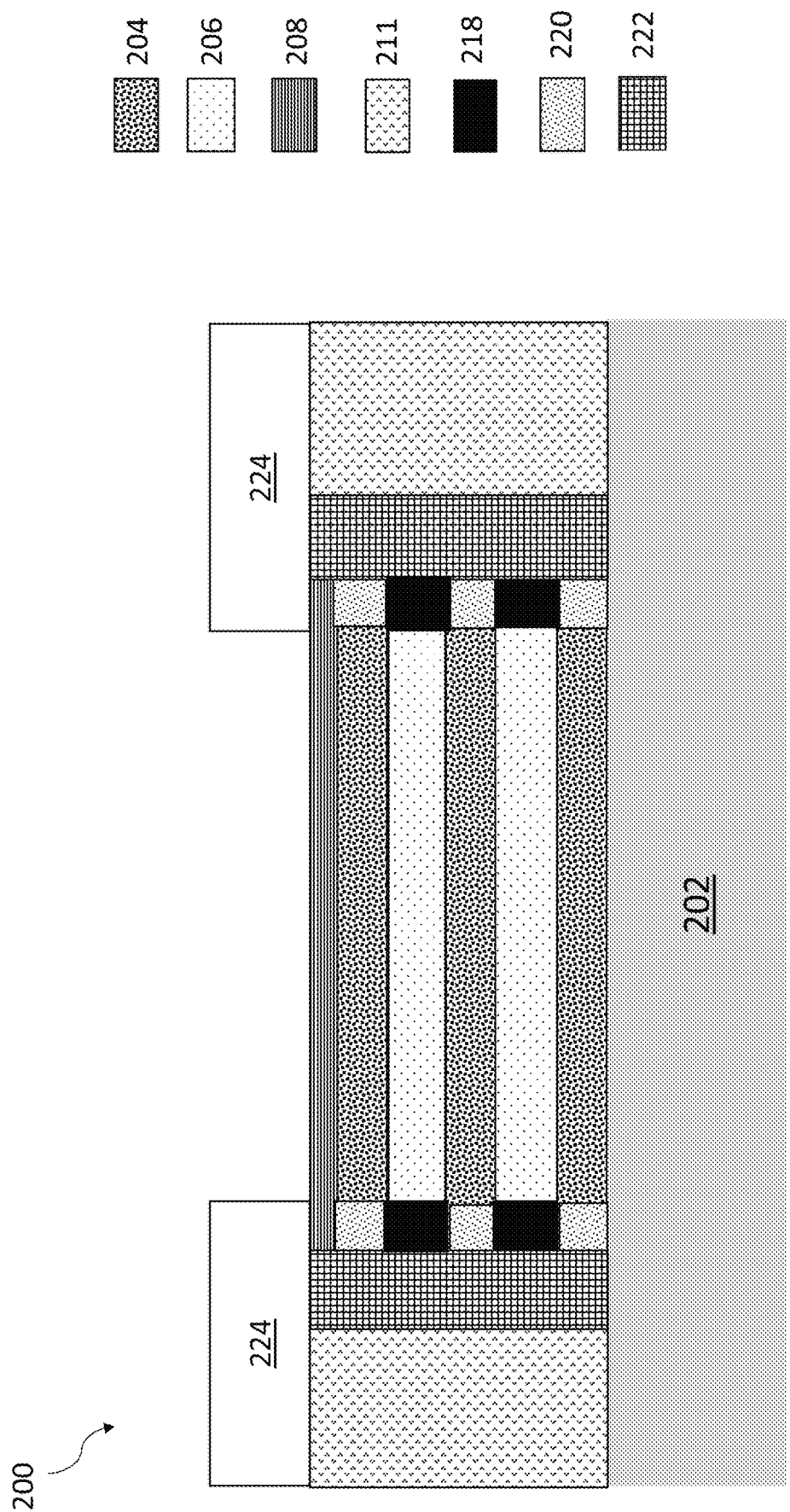

Corresponding to operation 118 of FIG. 1, FIG. 2I is a cross-sectional view of the semiconductor device 200 in which sidewalls of each of the semiconductor materials 206 are exposed, at one of the various stages of fabrication, in accordance with various embodiments. The sidewalls of each of the semiconductor materials 206 (facing toward and away from the plane) are exposed by performing at least some of the following processes: (1) forming a (e.g., photoresist) mask 224 having at least an opening; and (2) etching the workpiece (including both the sacrificial materials 204 and the semiconductor materials 206) using the mask 224. Specifically, the opening of the mask 224 is configured to open up the sidewalls of each of the sacrificial materials 204 that face toward and away from the plane, and the sidewalls of each of the semiconductor materials 206 that face toward and away from the plane.

Corresponding to operation 120 of FIG. 1, FIG. 2J is a cross-sectional view of the semiconductor device 200 in which top and bottom surfaces of each of the semiconductor materials 206 are exposed, at one of the various stages of fabrication, in accordance with various embodiments. The top and bottom surfaces of each of the semiconductor materials 206 are exposed by performing at least some of the following processes: (1) continuing using the (e.g., photoresist) mask 224; and (2) performing a selective etching on the sacrificial materials 204. Such a selective etching may leave the cap layer 208, semiconductor materials 206, dielectric isolation 211, and dielectric material 220 substantially intact. Consequently, a number of cavities 226, each of which exposes a bottom surface of a first neighbouring semiconductor material 206 and/or a top surface of a second neighbouring semiconductor material 206, can be formed, which further opens up a full perimeter of each of the semiconductor materials 206.

Figure 2K:
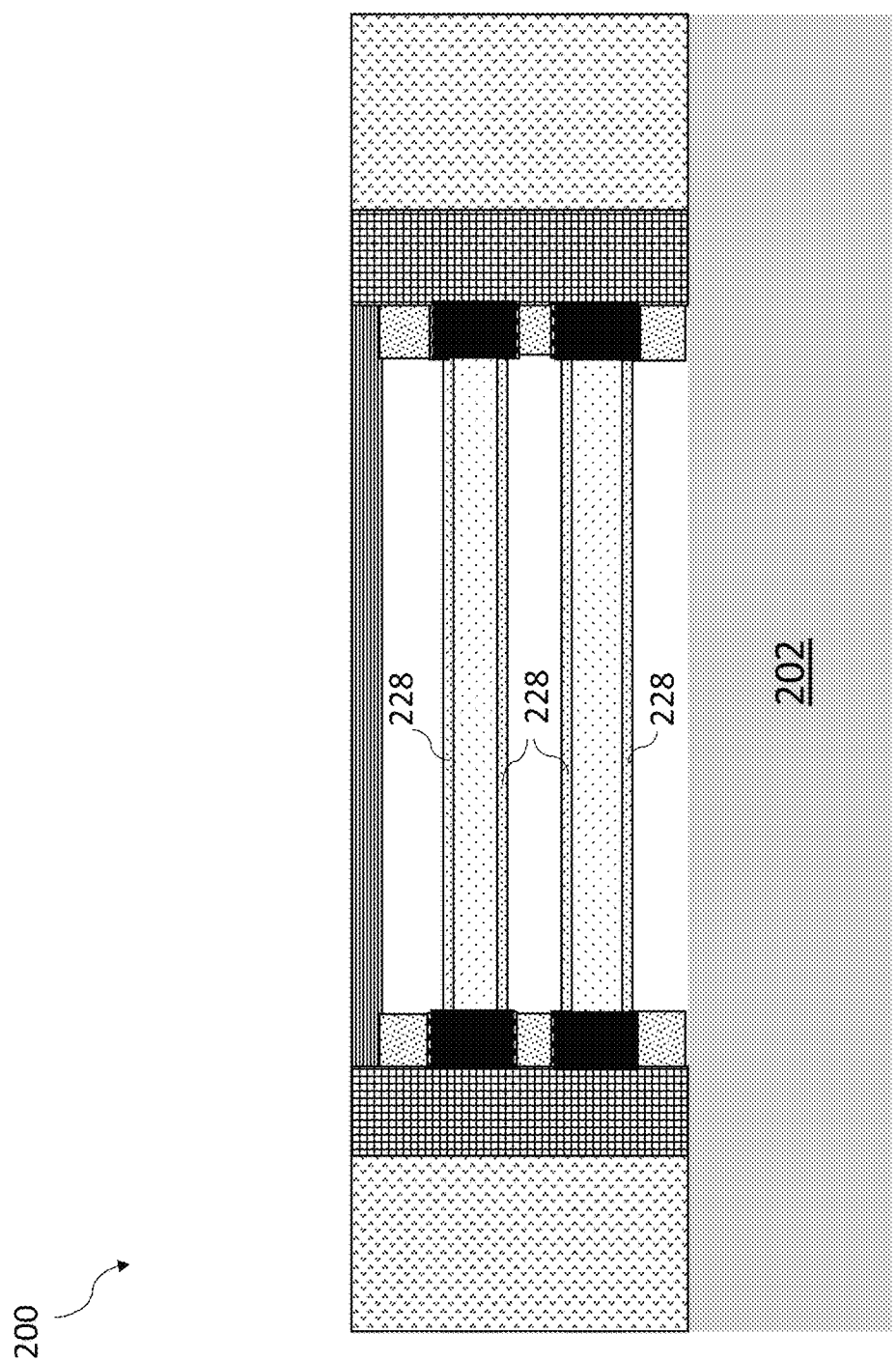

Corresponding to operation 122 of FIG. 1, FIG. 2K is a cross-sectional view of the semiconductor device 200 in which a dielectric layer 228 is formed around each of the semiconductor materials 206, at one of the various stages of fabrication, in accordance with various embodiments. In some embodiments, the dielectric layer 228 may be formed by oxidizing the exposed surfaces (e.g., the top and bottom surfaces, and the sidewalls) of each of the semiconductor materials 206. Such a dielectric layer 228 can serve as a seed layer for the growth of a 2D material. Consequently, the 2D material can wrap around the full perimeter of each of the semiconductor materials 206, which will be discussed as follows.

Corresponding to operation 124 of FIG. 1, FIG. 2L is a cross-sectional view of the semiconductor device 200 including a 2D material 230, a high-k dielectric 232, and a gate metal 234 around each of the semiconductor materials 206, at one of the various stages of fabrication, in accordance with various embodiments. In the illustrated embodiment of FIG. 2L, the 2D material 230 wraps around the full perimeter of each of the semiconductor materials 206 (with the dielectric layer interposed therebetween), the high-k dielectric 232 wrap around the 2D material 230, and the gate metal 234 wraps around the high-k dielectric 232. Alternatively or additionally, the 2D material 230 may further wrap around portions of the silicide metals 218 that are formed adjacent each of the semiconductor materials 206, respectively.

The 2D material 230 can include, but are not limited to, graphene, transition metal dichalcogenides (TMDs), $WS_2$, $WSe_2$, $WTe_2$, $MoS_2$, $MoSe_2$, $MoTe_2$, $HfS_2$, $ZrS_2$, $TiS_2$, GaSe, InSe, phosphorene, among others. The 2D material 230, as described herein, may be deposited by an atomic layer deposition (ALD) process and may be 5-15 angstroms thick, the thinness lending to their name—2D material. Other deposition techniques may also be used, including but not limited to chemical vapor deposition (CVD), physical vapor deposition (PVD), and plasma-enhanced deposition techniques. The 2D material 230 may be annealed during or after the device formation process to recrystallize or grow the crystals and thereby improve electrical characteristics.

The high-k dielectric 232 can be any type of material that has a relatively large dielectric constant. As one example, a silicon oxide based gate dielectric such as silicon dioxide ($SiO_2$) may be selectively formed on a gate layer of silicon. Additionally or alternatively, other gate dielectric materials may be utilized such as silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide ($HfSiO_4$), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof. The formation methods of high-k dielectric 232 may include molecular beam deposition (MBD), atomic layer deposition (ALD), PECVD, and the like.

The gate metal 234 may include a p-type work function layer, an n-type work function layer, multi-layers thereof, or combinations thereof, in some embodiments. Accordingly, the gate metal is sometimes referred to as a work function layer or work function metal. Example p-type work function metals that may be included in the gate structures for p-type devices include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may be included in the gate structures for n-type devices include Ti, Ag, TaAl, TaAlC, TiAlN, TaC, TaCN, TaSiN, Mn, Zr, other suitable n-type work function materials, or combinations thereof. The work function layer(s) may be deposited by CVD, physical vapor deposition (PVD), ALD, and/or other suitable process.

In various embodiments, the high-k dielectric 232 and gate metal 234 can be collectively referred to as a gate structure. Upon forming such a gate structure, a GAA transistor can be formed. In the present example, the semiconductor device 200, configured as a GAA transistor, includes two semiconductor materials 206 wrapped by the 2D materials 230, respectively. These two 2D materials can collectively function as a channel of the GAA transistor. Further, each of the 2D materials is (e.g., electrically) in contact with the source/drain structures 222 through a respective pair of the silicide metals 218. In some embodiments, the silicide metals 218 may sometimes be referred to as extensions of the source/drain structures 222, e.g., source/drain extensions. Still further, the gate structure, formed of the high-k dielectric 232 and gate metal 234, wraps around each of the 2D materials.

In the illustrative embodiment of FIG. 2L, the gate structure may not fully fill up the cavities 226. As such, which corresponds to operation 126 of FIG. 1, FIG. 2M is a cross-sectional view of the semiconductor device 200 in which the cavities 226 are each filled up with the dielectric isolation 211, at one of the various stages of fabrication, in accordance with various embodiments.

Figure 3A:
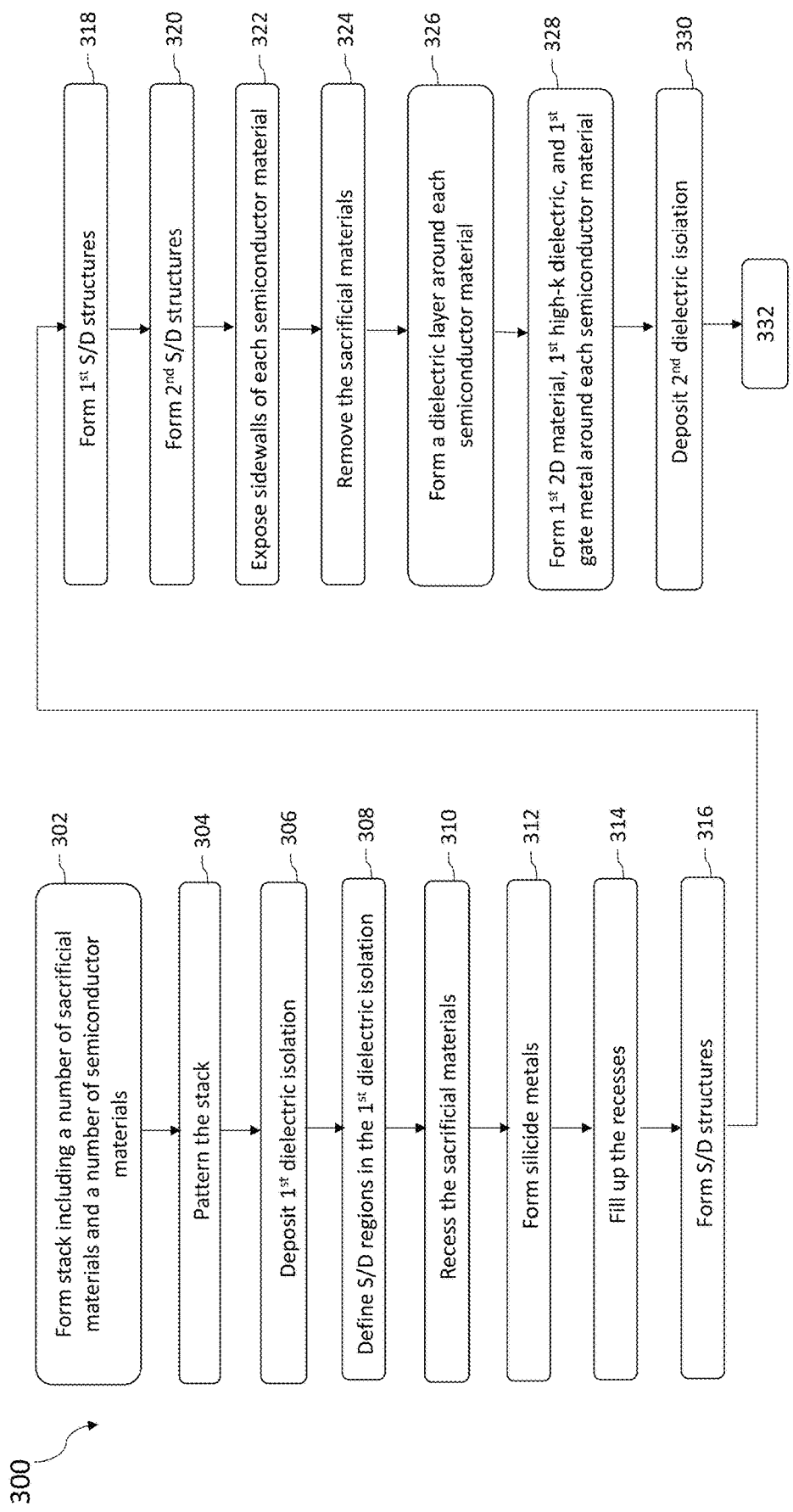
FIGS. 3A and 3B collectively illustrate a flow chart of an example method for making another semiconductor device, in accordance with some embodiments.
Figure 3B:
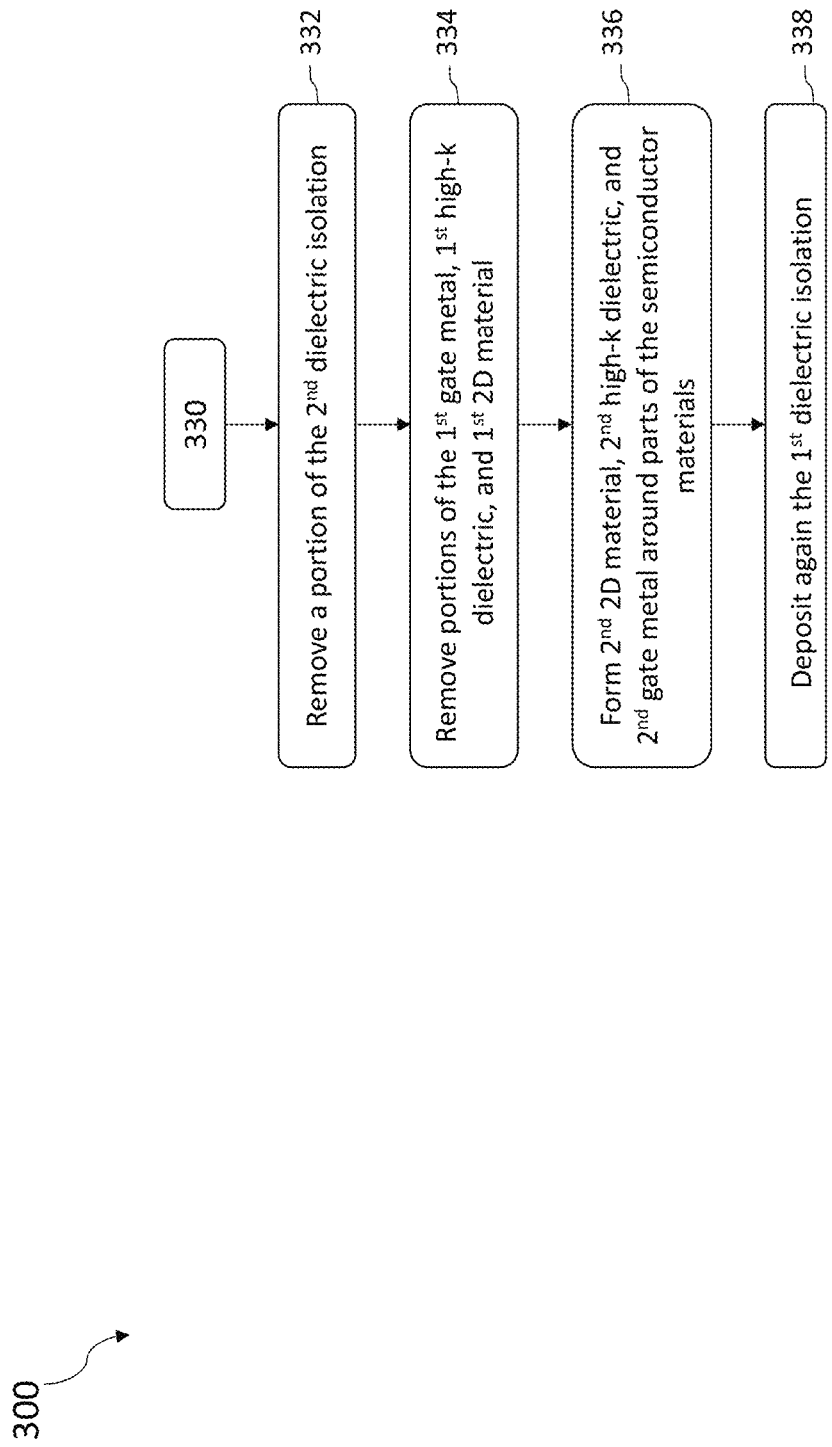

FIGS. 3A and 3B collectively illustrate a flowchart of an example method 300 for forming another semiconductor device (e.g., two different conductive types of transistors stacked on top of one another), each of the transistors having at least a 2D material that operatively serves as its channel. For example, the two transistors may each be a gate-all-around (GAA) transistor with a gate structure wrapping around or otherwise surrounding such a channel of a 2D material. It is noted that the method 300 is merely an example, and is not intended to limit the present disclosure. Accordingly, it is understood that additional operations may be provided before, during, and after the method 300 of FIGS. 3A-B, and that some other operations may only be briefly described herein.

In various embodiments, some of the operations described above with respect to the method 100 (e.g., operations 102 to 116) may be reused in the method 300, and thus, the following discussions will be focused on the different operations. Such (different) operations of the method 300 may be associated with cross-sectional views of an example semiconductor device 400 at various fabrication stages as shown in FIGS. 4A to 4K, respectively, which will be discussed in further detail below. Further, some of the reference numerals used for the structures in the corresponding operations 102 through 116 (e.g., 202, 204, 204, 208, 211, 218, 220, 222, etc.) may be reused in FIGS. 4A to 4M. It should be understood that the semiconductor device 400, shown in FIGS. 4A to 4K, may include a number of other devices such as inductors, fuses, capacitors, coils, etc., while remaining within the scope of the present disclosure.

In brief overview, the method 300 starts with operation 302 of forming a stack of a number of sacrificial materials and a number of semiconductor materials. The method 300 proceeds to operation 304 of patterning the stack. The method 300 proceeds to operation 306 of depositing a first dielectric isolation. The method 300 proceeds to operation 308 of defining source/drain regions in the first dielectric isolation. The method 300 proceeds to operation 310 of recessing each of the sacrificial materials. The method 300 proceeds to operation 312 of forming silicide metals. The method 300 proceeds to operation 314 of filling up the recesses. The method 300 proceeds to operation 316 of forming source/drain structures. The method 300 proceeds to operation 318 of forming first source/drain structures. The method 300 proceeds to operation 320 of forming second source/drain structures. The method 300 proceeds to operation 322 of exposing sidewalls of each of the semiconductor materials. The method 300 proceeds to operation 324 of removing the sacrificial materials. The method 300 proceeds to operation 326 of forming a dielectric layer around each of the semiconductor materials. The method 300 proceeds to operation 328 of forming a first two-dimensional (2D) material, a first high-k dielectric, and a first gate metal around each of the semiconductor materials. The method 300 proceeds to operation 330 of depositing a second dielectric isolation. The method 300 proceeds to operation 332 of removing a portion of the second dielectric isolation. The method 300 proceeds to operation 334 of removing respective portions of the first gate metal, the high-k dielectric, and the first 2D material. The method 300 proceeds to operation 336 of forming a second 2D material, a second high-k dielectric, and a second gate metal around one or more of the semiconductor materials. The method 300 proceeds to operation 338 of depositing again the first dielectric isolation.

As mentioned above, the operations 302 to 316 are substantially similar to the operations 102 to 116 of the method 100 in FIG. 1, respectively. That is, upon performing operation 316, the semiconductor device 400 can include a number of semiconductor materials 206 vertically spaced from one another with a number of sacrificial materials 204 (e.g., similar to the semiconductor device 200 shown in FIG. 2H). Further, each of the semiconductor materials 206 has its ends in electrical contact with the source/drain structures 222 through a pair of silicide metals 218, respectively. The method 300 is configured to form two GAA transistors, with respectively different 2D materials as their channels. Accordingly, in the following discussion, at least a lower one of the semiconductor materials 206 and at least an upper one of the semiconductor materials 206, which serve as template structures to grow 2D materials, are herein referred to as "first semiconductor material 206A" and "second semiconductor material 206B," respectively. The silicide metals 218 in electrical contact with the first semiconductor material 206A are herein referred to as "first silicide metals 218A," and the silicide metals 218 in electrical contact with the second semiconductor material 206B are herein referred to as "second silicide metals 218B."

Figure 4A:
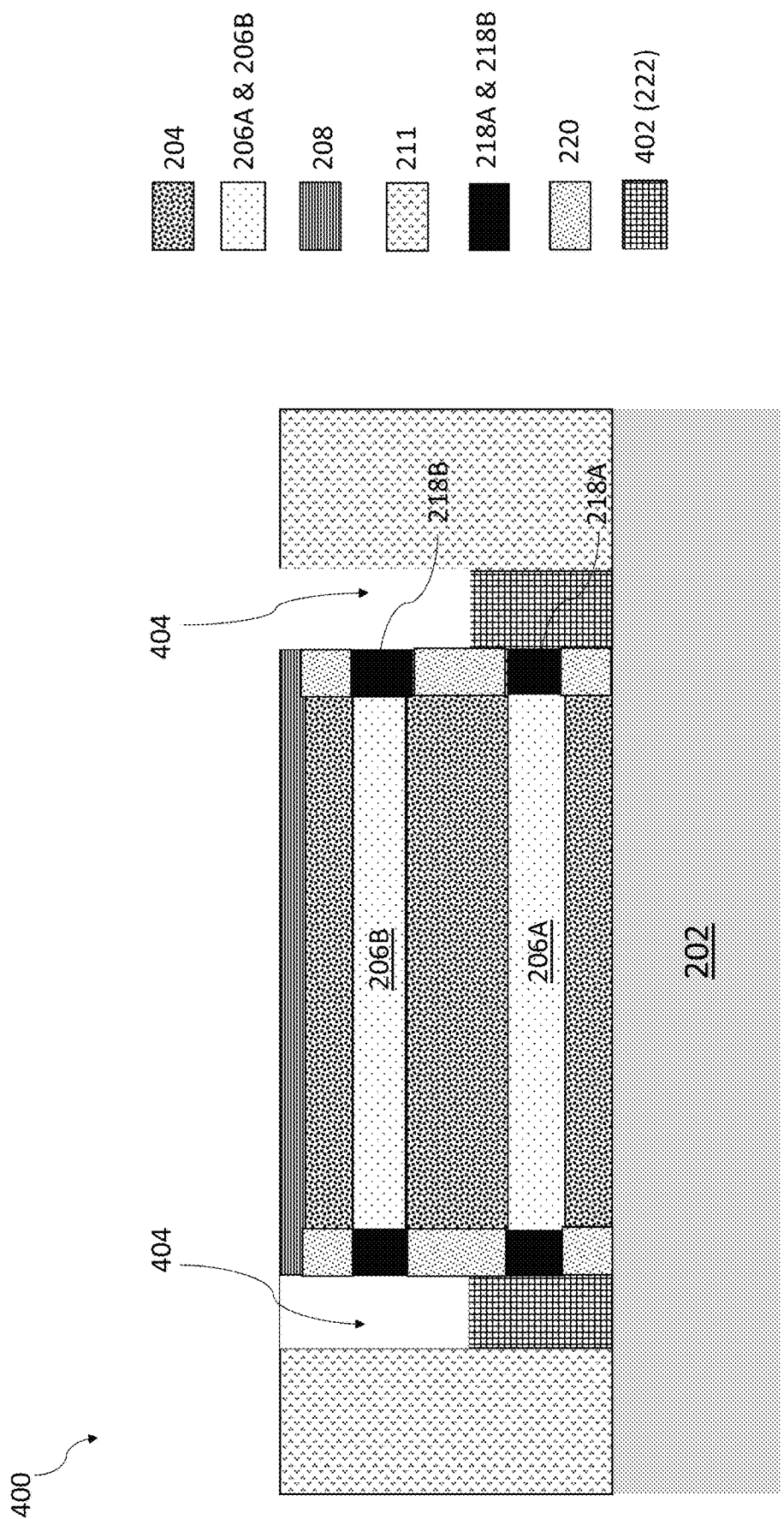

Corresponding to operation 318 of FIG. 3A, FIG. 4A is a cross-sectional view of the semiconductor device 400 including first source/drain structures 402, at one of the various stages of fabrication, in accordance with various embodiments. The first source/drain structures 402 can be formed by removing (e.g., etching) upper portions of the source/drain structures 222. Specifically, the removed portion may at least extend into the source/drain structure 222 with a depth that reaches a middle point of the dielectric material 220 interposed between the second silicide metal 218B and the first silicide metals 218A. As such, the first silicide metal 218A can still be fully connected to the first source/drain structure 402, while being electrically isolated from other conductive structure. The removed portions of the source/drain structures 222 can form a pair of openings 404 exposing the second silicide metals 218B, as shown.

Figure 4B:
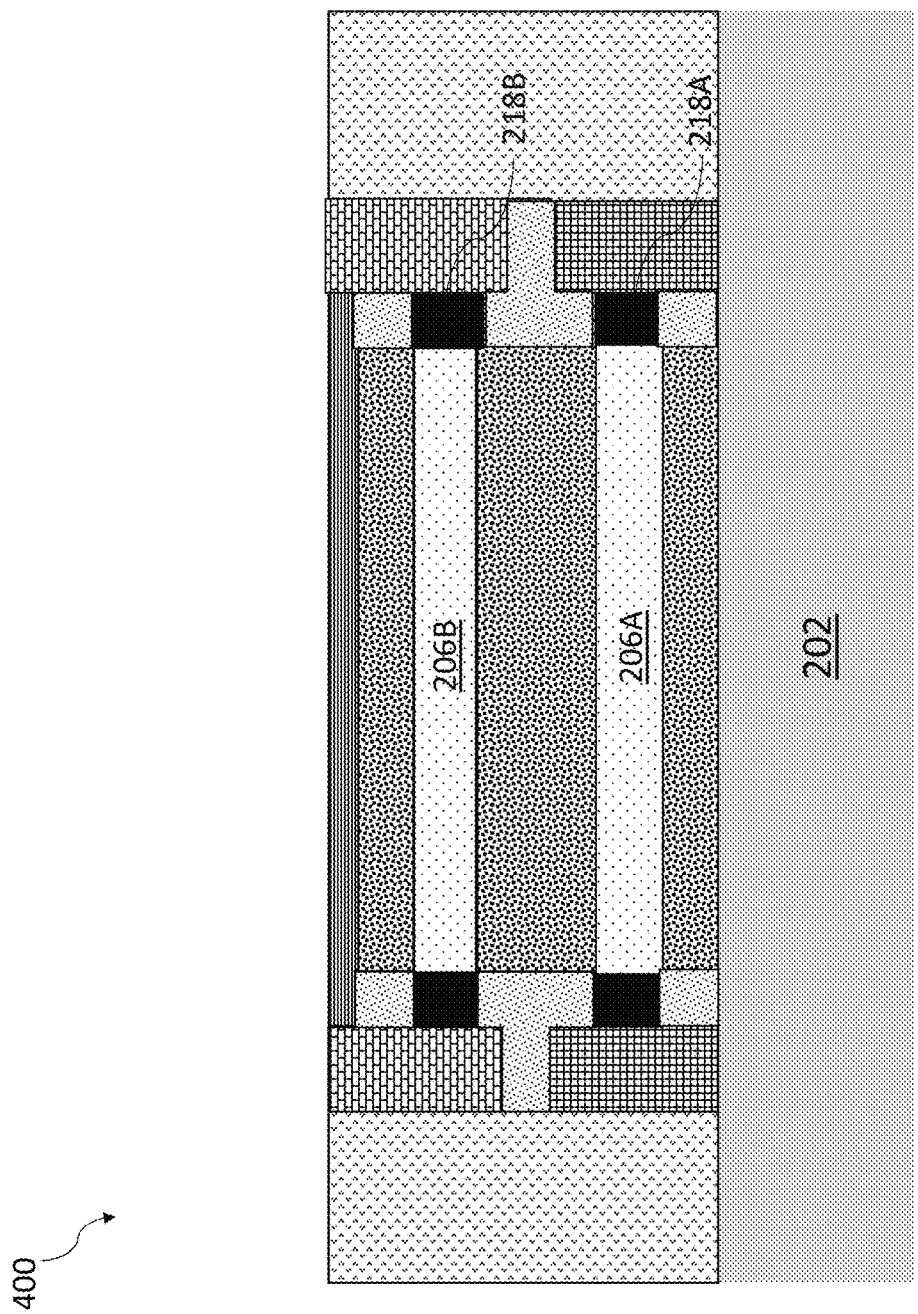

Corresponding to operation 320 of FIG. 3A, FIG. 4B is a cross-sectional view of the semiconductor device 400 including second source/drain structures 406, at one of the various stages of fabrication, in accordance with various embodiments. The second source/drain structures 402 can be formed by performing at least some of the following processes: (1) filling the openings 404 with the dielectric material 220; (2) recessing an upper portion of the newly filled dielectric material 220 (to a depth that is slightly below a bottom surface of the second silicide metal 218B); (3) filling the recess with a metal material (e.g., tungsten, titanium, nickel, cobalt, or combinations thereof); and (4) performing a CMP process until the cap layer 208 is (e.g., again) exposed to remove excessive metal material.

In various embodiments, in addition to being electrically isolated from each other by the dielectric material 220, the metal material of the second source/drain structure 406 may be different from the metal material of the first source/drain structure 402. For example, the first semiconductor material 206A may be used to form a first GAA with a first conductive type (e.g., p-type), and the second semiconductor material 206B may be used to form a second GAA with a second, different conductive type (e.g., n-type). As such, the first source/drain structure 402 may include a metal material suitable for a p-type transistor, and the second source/drain structure 406 may include a metal material suitable for an n-type transistor.

Figure 4C:
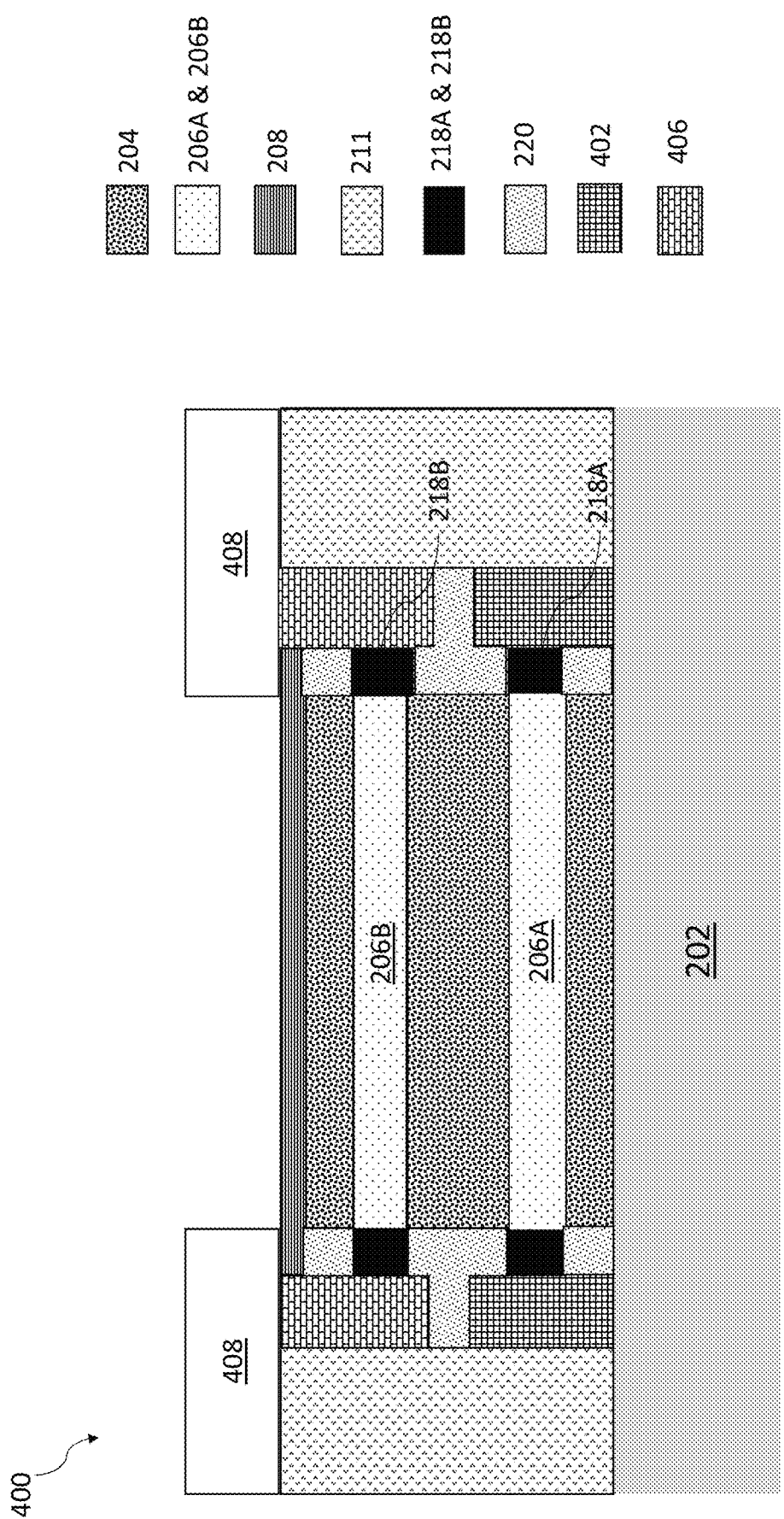

Corresponding to operation 322 of FIG. 3A, FIG. 4C is a cross-sectional view of the semiconductor device 400 in which sidewalls of each of the first and second semiconductor materials, 206A and 206B, are exposed, at one of the various stages of fabrication, in accordance with various embodiments. The sidewalls of each of the semiconductor materials, 206A and 206B, (facing toward and away from the plane) are exposed by performing at least some of the following processes: (1) forming a (e.g., photoresist) mask 408 having at least an opening; and (2) etching the workpiece (including both the sacrificial materials 204 and the semiconductor materials 206A-B) using the mask 408. Specifically, the opening of the mask 408 is configured to open up the sidewalls of each of the sacrificial materials 204 that face toward and away from the plane, and the sidewalls of each of the semiconductor materials 206A-B that face toward and away from the plane.

Figure 4D:
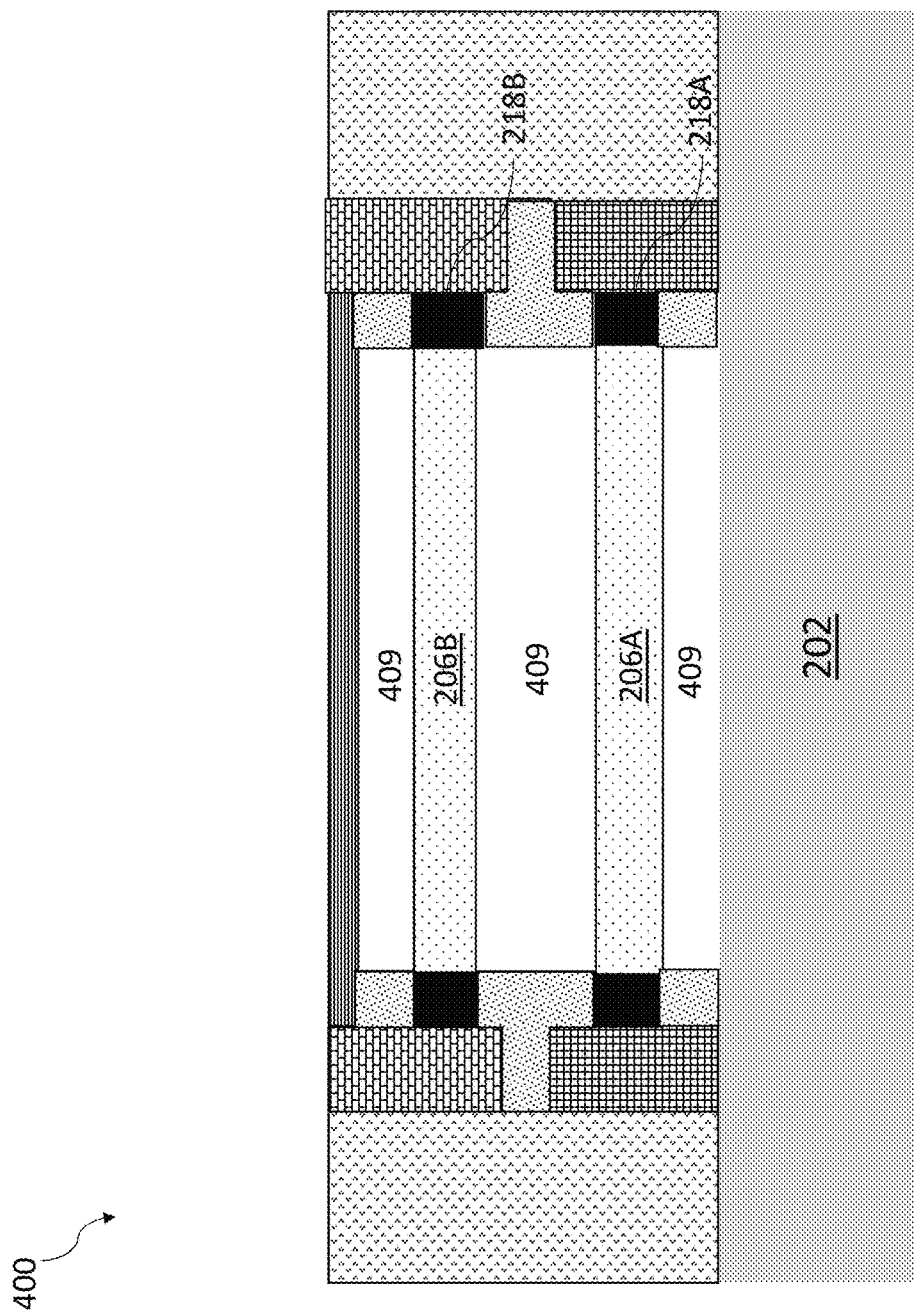

Corresponding to operation 324 of FIG. 3A, FIG. 4D is a cross-sectional view of the semiconductor device 400 in which top and bottom surfaces of each of the semiconductor materials 206A-B are exposed, at one of the various stages of fabrication, in accordance with various embodiments. The top and bottom surfaces of each of the semiconductor materials 206A-B are exposed by performing at least some of the following processes: (1) continuing using the (e.g., photoresist) mask 408; and (2) performing a selective etching on the sacrificial materials 204. Such a selective etching may leave the cap layer 208, semiconductor materials 206A-B, dielectric isolation 211, and dielectric material 220 substantially intact. Consequently, a number of cavities 409, each of which exposes a bottom surface of a first neighbouring semiconductor material 206A/B and/or a top surface of a second neighbouring semiconductor material 206A/B, can be formed, which further opens up a full perimeter of each of the semiconductor materials 206A-B.

Corresponding to operation 326 of FIG. 3A, FIG. 4E is a cross-sectional view of the semiconductor device 400 in which a dielectric layer 410 is formed around each of the semiconductor materials 206A-B, at one of the various stages of fabrication, in accordance with various embodiments. In some embodiments, the dielectric layer 410 may be formed by oxidizing the exposed surfaces (e.g., the top and bottom surfaces, and the sidewalls) of each of the semiconductor materials 206A-B. Such a dielectric layer 410 can serve as a seed layer for the growth of a 2D material. Consequently, the 2D material can wrap around the full perimeter of each of the semiconductor materials 206A-B, which will be discussed as follows.

Figure 4F:
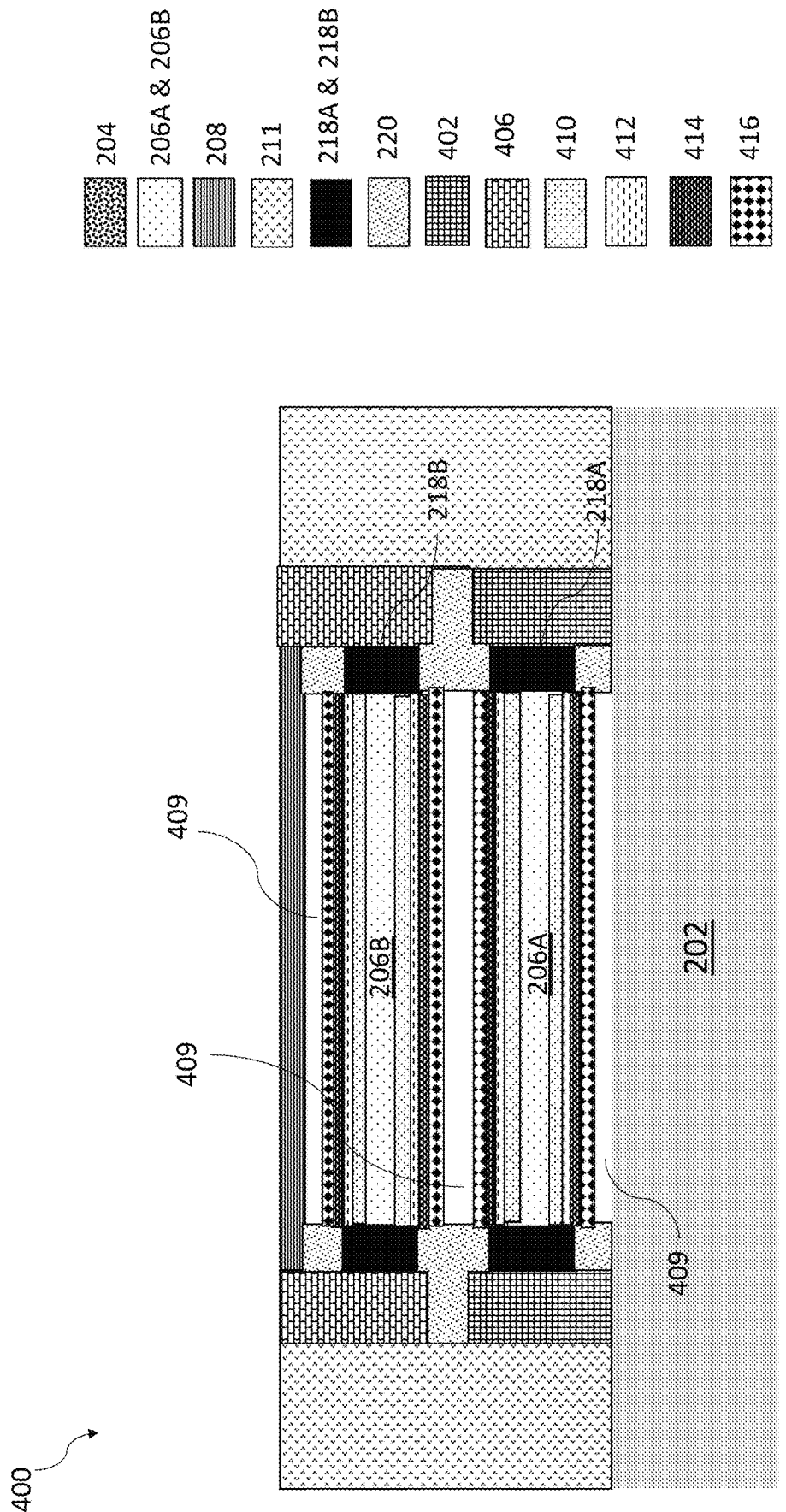

Corresponding to operation 328 of FIG. 3A, FIG. 4F is a cross-sectional view of the semiconductor device 400 including a first 2D material 412, a first high-k dielectric 414, and a first gate metal 414 around each of the semiconductor materials 206A-B, at one of the various stages of fabrication, in accordance with various embodiments. In the illustrated embodiment of FIG. 4F, the first 2D material 412 wraps around the full perimeter of each of the semiconductor materials 206A-B (with the dielectric layer interposed therebetween), the first high-k dielectric 414 wrap around the first 2D material 412, and the first gate metal 416 wraps around the first high-k dielectric 412.

The first 2D material 412 can include, but are not limited to, graphene, transition metal dichalcogenides (TMDs), $WS_2$, $WSe_2$, $WTe_2$, $MoS_2$, $MoSe_2$, $MoTe_2$, $HfS_2$, $ZrS_2$, $TiS_2$, GaSe, InSe, phosphorene, among others. In various embodiments, the first 2D material 412 may be selected from the group above as a suitable channel material for a p-type transistor. The first 2D material 412, as described herein, may be deposited by an atomic layer deposition (ALD) process and may be 5-15 angstroms thick, the thinness lending to their name—2D material. Other deposition techniques may also be used, including but not limited to chemical vapor deposition (CVD), physical vapor deposition (PVD), and plasma-enhanced deposition techniques. The first 2D material 412 may be annealed during or after the device formation process to recrystallize or grow the crystals and thereby improve electrical characteristics.

The first high-k dielectric 414 can be any type of material that has a relatively large dielectric constant. As one example, a silicon oxide based gate dielectric such as silicon dioxide ($SiO_2$) may be selectively formed on a gate layer of silicon. Additionally or alternatively, other gate dielectric materials may be utilized such as silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide (HfSiO4), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof. The formation methods of first high-k dielectric 412 may include molecular beam deposition (MBD), atomic layer deposition (ALD), PECVD, and the like.

The first gate metal 416 may include a p-type work function layer, or multi-layers thereof, in some embodiments. Accordingly, the gate metal is sometimes referred to as a work function layer or work function metal. Example p-type work function metals that may be included in the gate structures for p-type devices include TiN, TaN, Ru, Mo, Al, WN, $ZrSi_2$, $MoSi_2$, $TaSi_2$, $NiSi_2$, WN, other suitable p-type work function materials, or combinations thereof. The work function layer(s) may be deposited by CVD, physical vapor deposition (PVD), ALD, and/or other suitable process.

In various embodiments, the first high-k dielectric 414 and first gate metal 416 can be collectively referred to as a first gate structure. Upon forming such a gate structure, a first GAA transistor can be formed. In the present example, the semiconductor device 400, configured as two GAA transistors stacked on top of one another, includes two semiconductor materials 206A-B wrapped by the first 2D materials 412, respectively. As will be discussed below, the first 2D material 412 around the second semiconductor material 206B will be removed, together with the corresponding first high-k dielectric and first gate metal. The (remaining) first 2D material 412 wrapping around the first semiconductor material 206A can function as a channel of one of the two GAA transistors. Further, the (remaining) first 2D material 412 is (e.g., electrically) in contact with the source/drain structures 402 through a respective pair of the first silicide metals 218A. Still further, the first gate structure, formed of the remaining first high-k dielectric 414 and remaining first gate metal 416, wraps around the remaining first 2D material 412.

In the illustrative embodiment of FIG. 4F, the first gate structure may not fully fill up the cavities 409. As such, which corresponds to operation 330 of FIG. 3A, FIG. 4G is a cross-sectional view of the semiconductor device 400 in which the cavities 409 are each filled up with a second dielectric isolation 418, at one of the various stages of fabrication, in accordance with various embodiments. In various embodiments, the second dielectric isolation 418 may be different from the (first) dielectric isolation 211.

Figure 4H:
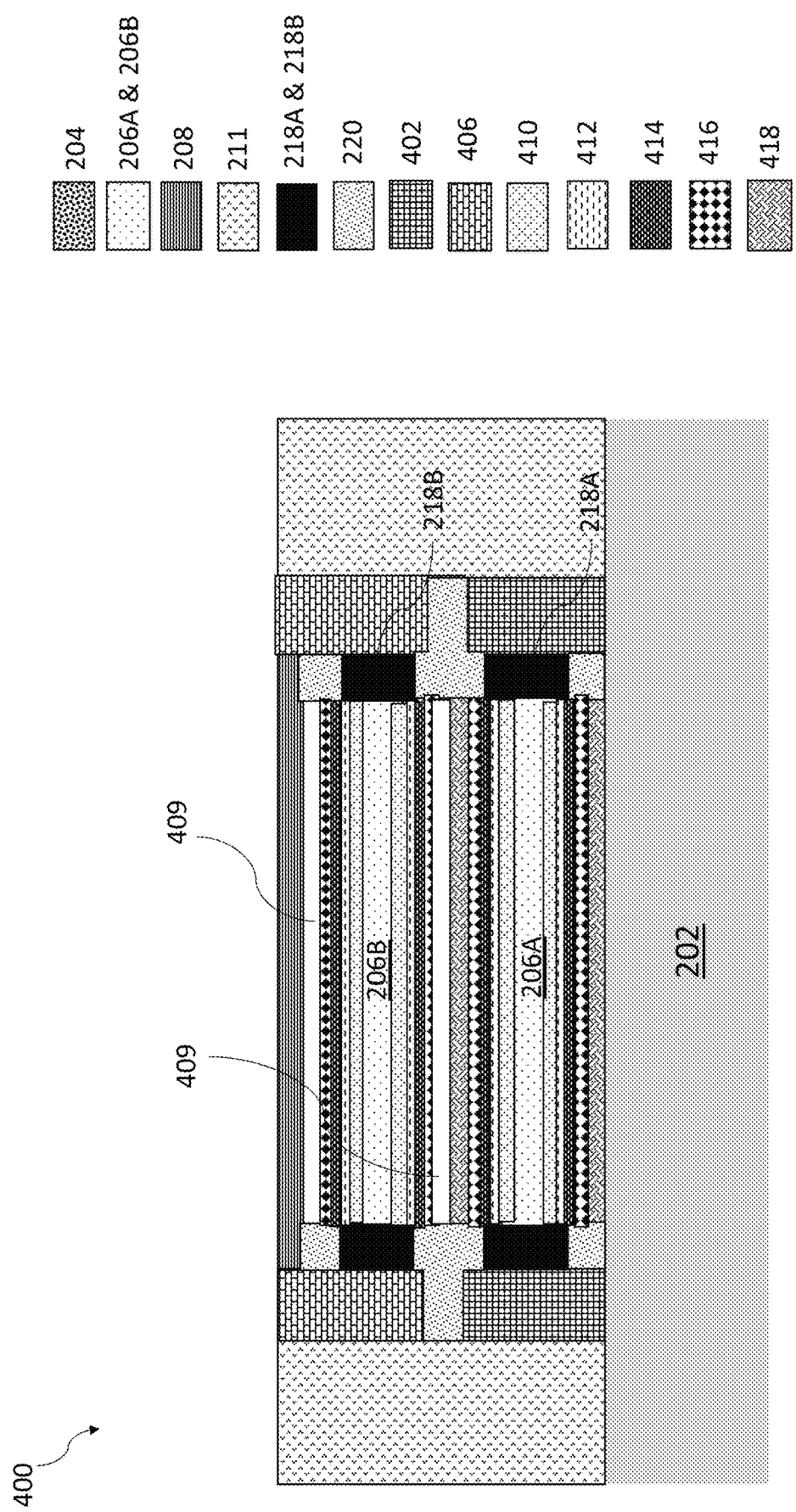

Corresponding to operation 332 of FIG. 3B, FIG. 4H is a cross-sectional view of the semiconductor device 400 in which a portion of the second dielectric isolation 418 is removed, at one of the various stages of fabrication, in accordance with various embodiments. As shown, the portion of the second dielectric isolation 418 that is around the second semiconductor material 206B is removed. As such, some of the cavities 409 may be again formed, which exposes the first metal gate 416 wrapping around the second semiconductor material 206B.

Figure 4I:
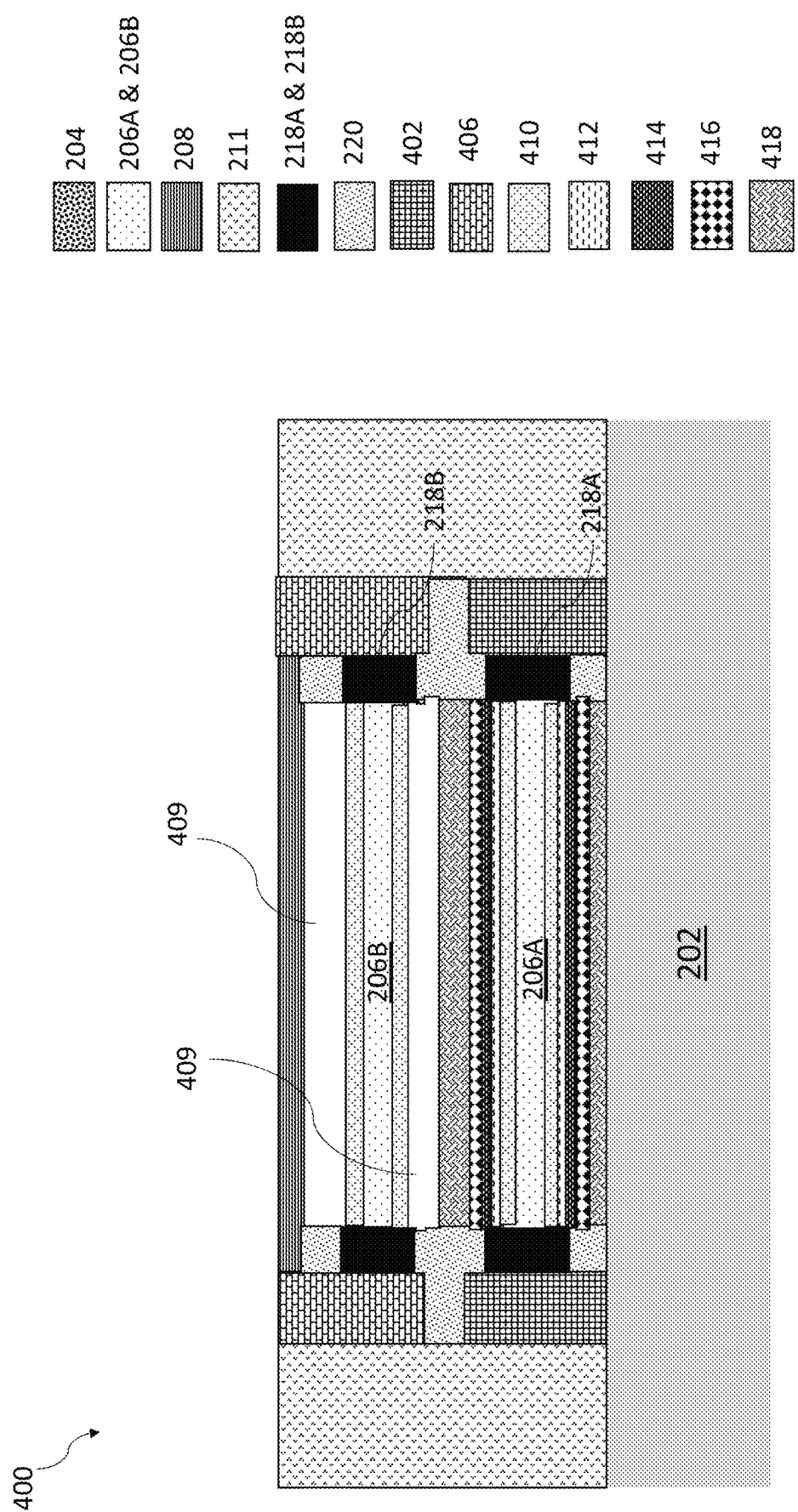

Corresponding to operation 334 of FIG. 3B, FIG. 4I is a cross-sectional view of the semiconductor device 400 in which respective portions of the first metal gate 416, the first high-k dielectric 414, the first 2D material 414 wrapping around the second semiconductor material 206B are removed, at one of the various stages of fabrication, in accordance with various embodiments. These respective portions of the first metal gate 416, the first high-k dielectric 414, the first 2D material 414 may be removed using a number of etching processes through the reopened cavities 409 (FIG. 4H). Further, a last of these etching processes, configured to remove the first 2D material 414, may have an etching selectively with respect to the dielectric layer 410. That is, such an etching process can remove the first 2D material 414, while keeping the dielectric layer 410 substantially intact.

Corresponding to operation 336 of FIG. 3B, FIG. 4J is a cross-sectional view of the semiconductor device 400 including a second 2D material 420, a second high-k dielectric 422, and a second gate metal 424 around the second semiconductor material 206B, at one of the various stages of fabrication, in accordance with various embodiments. In the illustrated embodiment of FIG. 4J, the second 2D material 420 wraps around the full perimeter of the second semiconductor material 206B (with the dielectric layer interposed therebetween), the second high-k dielectric 422 wrap around the second 2D material 420, and the second gate metal 424 wraps around the second high-k dielectric 422.

The second 2D material 420 can include, but are not limited to, graphene, transition metal dichalcogenides (TMDs), $WS_2$, $WSe_2$, $WTe_2$, $MoS_2$, $MoSe_2$, $MoTe_2$, $HfS_2$, $ZrS_2$, $TiS_2$, GaSe, InSe, phosphorene, among others. In various embodiments, the second 2D material 420 may be selected from the group above as a suitable channel material for an n-type transistor. The second 2D material 420, as described herein, may be deposited by an atomic layer deposition (ALD) process and may be 5-15 angstroms thick, the thinness lending to their name—2D material. Other deposition techniques may also be used, including but not limited to chemical vapor deposition (CVD), physical vapor deposition (PVD), and plasma-enhanced deposition techniques. The second 2D material 420 may be annealed during or after the device formation process to recrystallize or grow the crystals and thereby improve electrical characteristics.

The second high-k dielectric 422, which can be the same as the first high-k dielectric 414, can be any type of material that has a relatively large dielectric constant. As one example, a silicon oxide based gate dielectric such as silicon dioxide ($SiO_2$) may be selectively formed on a gate layer of silicon. Additionally or alternatively, other gate dielectric materials may be utilized such as silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide ($HfSiO_4$), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof. The formation methods of second high-k dielectric 422 may include molecular beam deposition (MBD), atomic layer deposition (ALD), PECVD, and the like.

The second gate metal 424 may include an n-type work function layer, or multi-layers thereof, in some embodiments. Accordingly, the gate metal is sometimes referred to as a work function layer or work function metal. Example n-type work function metals that may be included in the gate structures for n-type devices include Ti, Ag, TaAl, TaAlC, TiAlN, TaC, TaCN, TaSiN, Mn, Zr, other suitable n-type work function materials, or combinations thereof. The work function layer(s) may be deposited by CVD, physical vapor deposition (PVD), ALD, and/or other suitable process.

In various embodiments, the second high-k dielectric 422 and second gate metal 424 can be collectively referred to as a second gate structure. Upon forming such a gate structure, a second GAA transistor can be formed. In the present example, the second 2D material 420 wrapping around the second semiconductor material 206B can function as a channel of the other of the two GAA transistors. Further, the second 2D material 420 is (e.g., electrically) in contact with the source/drain structures 406 through a respective pair of the second silicide metals 218B. Still further, the second gate structure, formed of the second high-k dielectric 422 and second gate metal 424, wraps around the second 2D material 420.

In the illustrative embodiment of FIG. 4J, the second gate structure may not fully fill up the cavities 409. As such, which corresponds to operation 338 of FIG. 3B, FIG. 4K is a cross-sectional view of the semiconductor device 400 in which the cavities 409 are each filled up with the first dielectric isolation 211, at one of the various stages of fabrication, in accordance with various embodiments.

Figure 5:
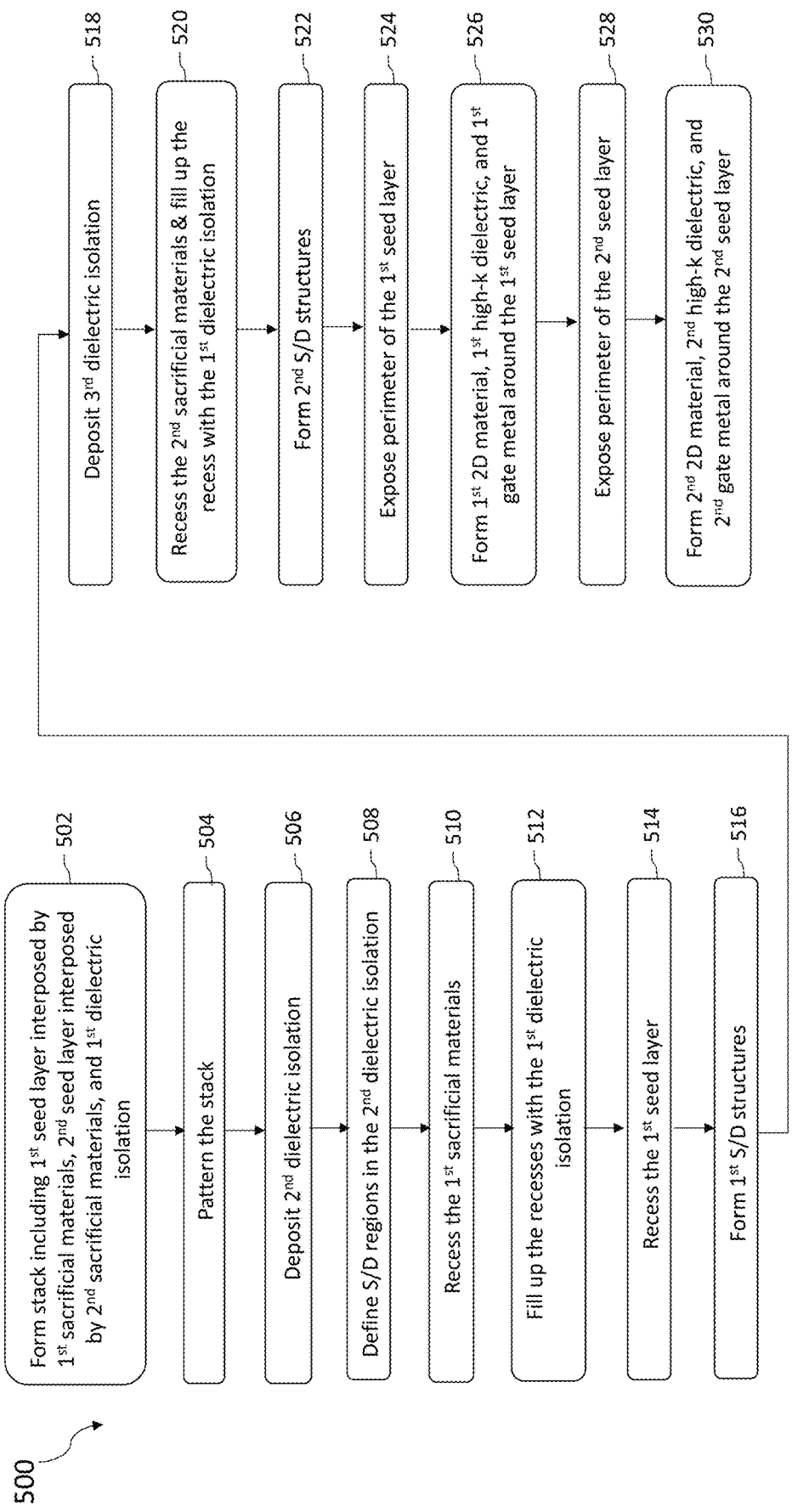
FIG. 5 illustrates a flow chart of an example method for making yet another semiconductor device, in accordance with some embodiments.
Figure 61:
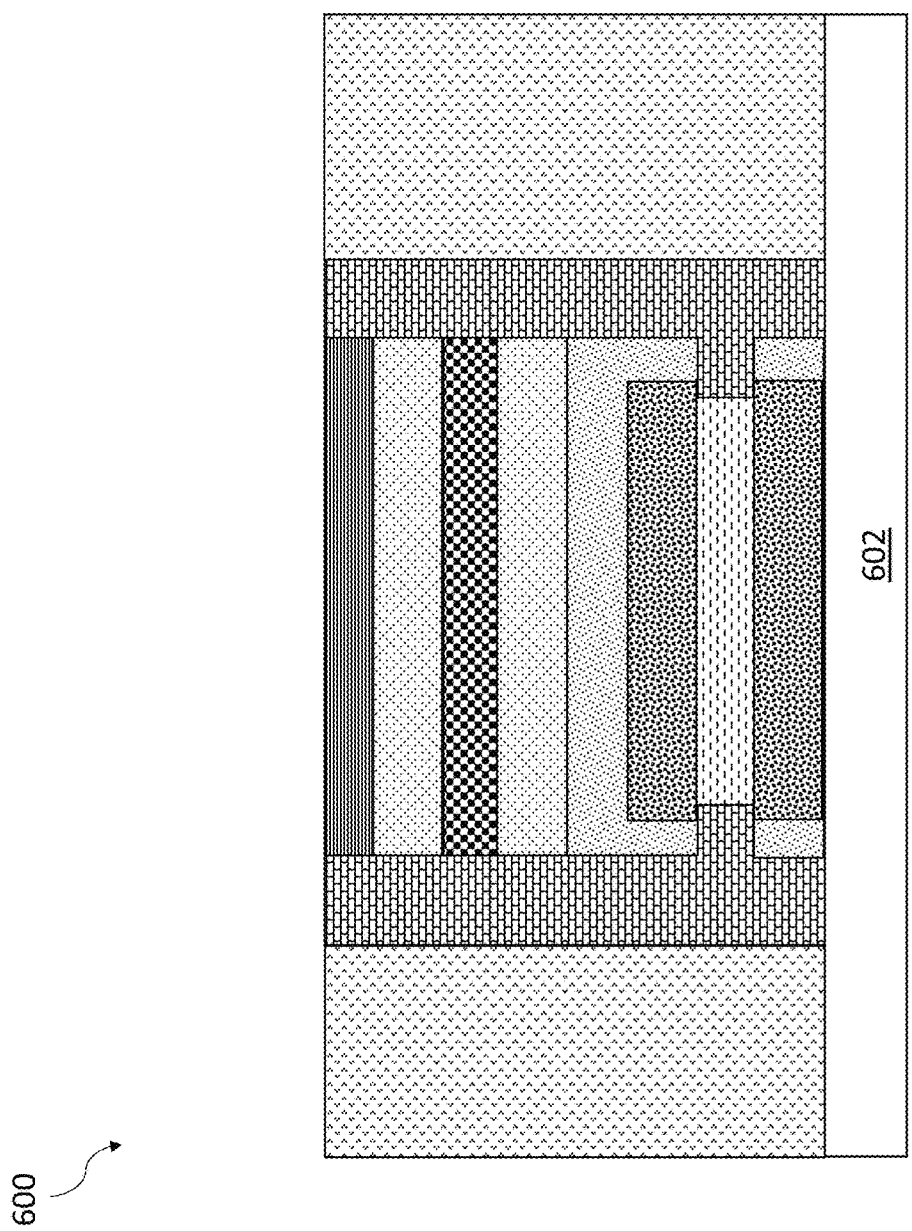

FIG. 5 illustrates a flowchart of an example method 500 for forming yet another semiconductor device (e.g., two different conductive types of transistors stacked on top of one another), each of the transistors having at least a 2D material that operatively serves as its channel. For example, the two transistors may each be a gate-all-around (GAA) transistor with a gate structure wrapping around or otherwise surrounding such a channel of a 2D material. It is noted that the method 500 is merely an example, and is not intended to limit the present disclosure. Accordingly, it is understood that additional operations may be provided before, during, and after the method 500 of FIG. 5, and that some other operations may only be briefly described herein.

In various embodiments, operations of the method 500 may be associated with cross-sectional views of an example semiconductor device 600 at various fabrication stages as shown in FIGS. 6A to 6S, respectively, which will be discussed in further detail below. It should be understood that the semiconductor device 600, shown in FIGS. 6A to 6S, may include a number of other devices such as inductors, fuses, capacitors, coils, etc., while remaining within the scope of the present disclosure.

In brief overview, the method 500 starts with operation 502 of forming a stack including a first seed layer interposed by first sacrificial materials, a second seed layer interposed by second sacrificial materials, and a first dielectric isolation. The method 500 proceeds to operation 504 of patterning the stack. The method 500 proceeds to operation 506 of depositing a second dielectric isolation. The method 500 proceeds to operation 508 of defining source/drain regions in the second dielectric isolation. The method 500 proceeds to operation 510 of recessing the first sacrificial materials. The method 500 proceeds to operation 512 of filling up the recesses with the first dielectric isolation. The method 500 proceeds to operation 514 of recessing the first seed layer. The method 500 proceeds to operation 516 of forming first source/drain structures. The method 500 proceeds to operation 518 of depositing a third dielectric isolation. The method 500 proceeds to operation 520 of forming second source/drain structures. The method 500 proceeds to operation 522 of exposing a perimeter of the first seed layer. The method 500 proceeds to operation 524 of forming a first two-dimensional (2D) material, a first high-k dielectric, and a first gate metal around the first seed layer. The method 500 proceeds to operation 526 of exposing a perimeter of the second seed layer. The method 500 proceeds to operation 528 of forming a second 2D material, a second high-k dielectric, and a second gate metal around the second seed layer.

Corresponding to operation 502 of FIG. 5, FIG. 6A is a cross-sectional view of the semiconductor device 600 in which a stack 601 is formed on a substrate 602, at one of the various stages of fabrication, in accordance with various embodiments.

As shown in FIG. 6A, the stack 601, formed on the substrate 602, includes a first seed layer 606 interposed by a number of first sacrificial materials 604, and a second seed layer 612 interposed by a number of second sacrificial materials 610. In some embodiments, one seed layer, together with the sacrificial materials interposing the seed layer, may sometimes be referred to as a sub-stack. Between such two sub-stacks stacked on top of one another, the stack 601 further includes a first dielectric isolation 608. The stack 601 is overlaid by a cap layer 605. Although the stack 601 has two sub-stacks in the illustrated embodiment of FIG. 6A, it should be understood that the stack 601 can include any number of sub-stacks, while remaining within the scope of present disclosure.

In various embodiments, each of the first and second sacrificial materials, 604 and 610, (e.g., including a dielectric material) can have an etching selectively with respect to one or more other materials formed next to itself, allowing the sacrificial material to be selectively removed while keeping the adjacent materials substantially intact (which will be discussed in further detail below). In various embodiments, surfaces (e.g., top and bottom surfaces, and sidewalls) of each of the first and second seed layers, 606 and 612, upon at least removing the corresponding interposing sacrificial materials, can be exposed, allowing those surface to facilitate growth of a 2D material. The 2D material can function as the channel of a corresponding GAA transistor. Example materials of the seed layers, 606 and 612, include, but are not limited to, dielectric materials (e.g., $SiO_2$). Accordingly, such a seed layer can sometimes be referred to as a bridge or otherwise template structure for growing a 2D material channel, in accordance with various embodiments.

In various embodiments, compositions and/or materials of the first seed layer 606 may be configured to facilitate the growth of a first 2D material suitable for an n-type transistor, and compositions and/or materials of the second seed layer 612 may be configured to facilitate the growth of a second 2D material suitable for a p-type transistor. FIG. 6B illustrates an alternative configuration of the stack 601, in which a common base seed layer 614 is included in the stack 601 for growing the respective first and second seed layers, 606 and 612, in the sub-stacks.

Corresponding to operation 504 of FIG. 5, FIG. 6C is a cross-sectional view of the semiconductor device 600 in which the stack 601 is patterned, at one of the various stages of fabrication, in accordance with various embodiments. The stack 601 can be patterned by performing at least one of the following processes: (1) forming a (e.g., photoresist) mask 616 on the stack 601; (2) etching the stack 601 to define a width and length of each of the first and second seed layers, 606 and 612, (a majority of which will be surrounded by a 2D material) using the mask 616; and (3) removing the mask 616. In some embodiments, the mask 616 may be formed on the cap layer 605. In some embodiments, the etching may be anisotropic (e.g., vertically applied over the workpiece), which allows the (patterned) stack 601 to have its sidewalls substantially aligned with the mask 616. In various embodiments, the removed portions of the stack 601, which exposes ends of each of the first and second seed layers, can define a pair of openings 605, as shown.

Corresponding to operation 506 of FIG. 5, FIG. 6D is a cross-sectional view of the semiconductor device 600 in which the openings 605 (FIG. 6C) are filled with a second dielectric isolation 618, at one of the various stages of fabrication, in accordance with various embodiments. In some embodiments, the dielectric isolation 618 can have an etching selectively with respect to one or more other materials formed next to itself. For example, the first dielectric isolation 618 may have an etching selectively with respect to the first and second sacrificial materials, 604 and 610, which allows the first and/or second sacrificial material to be partially etched or fully removed while keeping the first dielectric isolation 618 substantially intact.

Corresponding to operation 508 of FIG. 5, FIG. 6E is a cross-sectional view of the semiconductor device 600 in which a pair of source/drain regions (or source/drain openings) 622 are defined in the first dielectric isolation 618, at one of the various stages of fabrication, in accordance with various embodiments. The source/drain regions 622 can be patterned by performing at least one of the following processes: (1) forming a (e.g., photoresist) mask 620 on the first dielectric isolation 618; (2) etching the first dielectric isolation 618 to define the footprint of a pair of source/drain structures using the mask 620 (and the cap layer 605); and (3) removing the mask 620. In some embodiments, the mask 620 may be formed on the first dielectric isolation 618. In some embodiments, the etching may be anisotropic (e.g., vertically applied over the workpiece), which again exposes ends of each of the first and second seed layers, 606 and 612.

Corresponding to operation 510 of FIG. 5, FIG. 6F is a cross-sectional view of the semiconductor device 600 in which a pair of recesses 624 are formed on respective ends of each of the first sacrificial materials 604, at one of the various stages of fabrication, in accordance with various embodiments. The recesses 624 can be formed at least by etching the first sacrificial materials 604 through the source/drain regions 622. The etching may be isotropic, anisotropic, or combinations thereof. Specifically, the etching may include applying etchants on exposed sidewalls of the first and second sacrificial materials, 604 and 610, and the first and second seed layers, 606 and 612, while the etchants may induce a limited etching amount on the first and second seed layers, and on the second sacrificial materials 610. As such, the first sacrificial materials 604 may each be inwardly indented on each end with a certain distance. Such a distance can be controlled according to a time duration of the etching process, for example.

Corresponding to operation 512 of FIG. 5, FIG. 6G is a cross-sectional view of the semiconductor device 600 in which the recesses 624 (FIG. 6F) are filled with the first dielectric isolation 608, at one of the various stages of fabrication, in accordance with various embodiments. The recesses 624 may be filled up by performing at least some of the following processes: (1) depositing the first dielectric isolation 608 and filling the recesses 624 through the source/drain regions 622; and (2) removing (e.g., etching) excessive first dielectric isolation 608 using the cap layer 605 as a mask. As such, the newly deposited first dielectric isolation 608 can be self-aligned with the recesses 624.

Corresponding to operation 514 of FIG. 5, FIG. 6H is a cross-sectional view of the semiconductor device 600 in which a pair of recesses 626 are formed on ends of the first seed layer 606, at one of the various stages of fabrication, in accordance with various embodiments. The recesses 626 can be formed at least by etching the first seed layer 606 through the source/drain regions 622. The etching may be isotropic, anisotropic, or combinations thereof. Specifically, the etching may include applying etchants on exposed sidewalls of the first and second sacrificial materials, 604 and 610, and the first and second seed layers, 606 and 612, while the etchants may induce a limited etching amount on the second seed layer 612, and on the first and second sacrificial materials, 604 and 610. As such, the first seed layer 606 may be inwardly indented on each end with a certain distance. Such a distance can be controlled according to a time duration of the etching process, for example.

Corresponding to operation 516 of FIG. 5, FIGS. 6I and 6J are cross-sectional views of the semiconductor device 600 including a pair of first source/drain structures 630, at one of the various stages of fabrication, in accordance with various embodiments. Referring first to FIG. 6I, the source/drain regions 622 may be filled up with a metal material (e.g., tungsten, titanium, nickel, cobalt, or combinations thereof). Specifically, in addition to filling up the source/drain regions 622 (FIG. 6H), the metal material can fill up the recesses 626, which causes the metal material to inwardly extend toward the first seed layer 606 (from the sidewalls of the first dielectric isolation 608). Referring next to FIG. 6J, the filling metal material is recessed (to a depth that is slightly below a bottom surface of the lower second sacrificial material 610), thereby forming the first source/drain structures 630.

Corresponding to operation 518 of FIG. 5, FIG. 6K is a cross-sectional views of the semiconductor device 600 including a third dielectric isolation 634, at one of the various stages of fabrication, in accordance with various embodiments. The third dielectric isolation 634 is formed over the first source/drain structure 630. In some embodiments, the third dielectric isolation 634 is configured to electrically isolate the first source/drain structure 630 from other conductive structures (e.g., a later formed second source/drain structure).

Corresponding to operation 520 of FIG. 5, FIG. 6L is a cross-sectional view of the semiconductor device 600 in which a pair of recesses (not shown) are formed on respective ends of each of the second sacrificial materials 610 and then filled up with the first dielectric isolation 608, at one of the various stages of fabrication, in accordance with various embodiments.

The recesses can be formed at least by etching the second sacrificial materials 610 through the source/drain regions 622. The etching may be isotropic, anisotropic, or combinations thereof. Specifically, the etching may include applying etchants on exposed sidewalls of the second sacrificial materials 610 and the second seed layer 612, while the etchants may induce a limited etching amount on the second seed layer. As such, the second sacrificial materials 610 may each be inwardly indented on each end with a certain distance. Such a distance can be controlled according to a time duration of the etching process, for example. Next, the recesses may be filled up by performing at least some of the following processes: (1) depositing the first dielectric isolation 608 and filling the recesses through the source/drain regions 622; and (2) removing (e.g., etching) excessive first dielectric isolation 608 using the cap layer 605 as a mask. As such, the newly deposited first dielectric isolation 608 can be self-aligned with the recesses.

Corresponding to operation 522 of FIG. 5, FIG. 6M is a cross-sectional view of the semiconductor device 600 including a pair of second source/drain structures 636, at one of the various stages of fabrication, in accordance with various embodiments.

A pair of recesses (not shown) are formed on ends of the second seed layer 612. The recesses can be formed at least by etching the second seed layer 612 through the source/drain regions 622. The etching may be isotropic, anisotropic, or combinations thereof. Specifically, the etching may include applying etchants on exposed sidewalls of the second sacrificial materials 610 and the second seed layers 612, while the etchants may induce a limited etching amount on the second sacrificial materials 610. As such, the second seed layer 612 may be inwardly indented on each end with a certain distance. Such a distance can be controlled according to a time duration of the etching process, for example. Next, the source/drain regions 622 may be filled up with a metal material (e.g., tungsten, titanium, nickel, cobalt, or combinations thereof). Specifically, in addition to filling up the source/drain regions 622 (FIG. 6L), the metal material can fill up the recesses, which causes the metal material to inwardly extend toward the second seed layer 612 (from the sidewalls of the first dielectric isolation 608). Accordingly, the second source/drain structures 636 are formed.

Corresponding to operation 524 of FIG. 5, FIG. 6N is a cross-sectional view of the semiconductor device 600 in which a perimeter of the first seed layer 606 is exposed, at one of the various stages of fabrication, in accordance with various embodiments.

To expose the perimeter of the first seed layer 606, sidewalls of the first seed layer 606 (facing toward and away from the plane) are first exposed by performing at least some of the following processes: (1) forming a (e.g., photoresist) mask 638 having at least an opening; and (2) etching the workpiece (including the first and second sacrificial materials, 604 and 610, and the first and second seed layers, 606 and 612) using the mask 638. Specifically, the opening of the mask 638 is configured to open up at least the sidewalls of the first seed layer 606 that face toward and away from the plane.

Next, the top and bottom surfaces of the first seed layer 606 are exposed by performing at least some of the following processes: (1) continuing using the (e.g., photoresist) mask 638; and (2) performing a selective etching on the first sacrificial materials 604. Such a selective etching may leave the cap layer 605, first seed layer 606, second seed layer 612, second sacrificial materials 610, first dielectric isolation 607, and second dielectric isolation 618 substantially intact. Consequently, a pair of cavities 640, each of which exposes a bottom surface or a top surface of the first seed layer 606, can be formed, which further opens up the full perimeter of the first seed layer 606. As shown, the cavities 640 can further expose a full perimeter of the laterally extending portion of each of the first source/drain structures 630.

Corresponding to operation 526 of FIG. 5, FIGS. 6O and 6P are cross-sectional views of the semiconductor device 600 including a first 2D material 642, a first high-k dielectric 644, and a first gate metal 646, at one of the various stages of fabrication, in accordance with various embodiments. In the illustrated embodiment of FIGS. 6O and 6P, the first 2D material 642 wraps around the full perimeter of the first seed layer 606, the first high-k dielectric 644 wrap around the first 2D material 642, and the first gate metal 646 wraps around the first high-k dielectric 644.

The first 2D material 642 can include, but are not limited to, graphene, transition metal dichalcogenides (TMDs), $WS_2$, $WSe_2$, $WTe_2$, $MoS_2$, $MoSe_2$, $MoTe_2$, $HfS_2$, $ZrS_2$, $TiS_2$, GaSe, InSe, phosphorene, among others. In various embodiments, the first 2D material 642 may be selected from the group above as a suitable channel material for an n-type transistor. The first 2D material 642, as described herein, may be deposited by an atomic layer deposition (ALD) process and may be 5-15 angstroms thick, the thinness lending to their name—2D material. Other deposition techniques may also be used, including but not limited to chemical vapor deposition (CVD), physical vapor deposition (PVD), and plasma-enhanced deposition techniques. The first 2D material 642 may be annealed during or after the device formation process to recrystallize or grow the crystals and thereby improve electrical characteristics.

The first high-k dielectric 644 can be any type of material that has a relatively large dielectric constant. As one example, a silicon oxide based gate dielectric such as silicon dioxide ($SiO_2$) may be selectively formed on a gate layer of silicon. Additionally or alternatively, other gate dielectric materials may be utilized such as silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide ($HfSiO_4$), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof. The formation methods of first high-k dielectric 644 may include molecular beam deposition (MBD), atomic layer deposition (ALD), PECVD, and the like.

The first gate metal 646 may include an n-type work function layer, or multi-layers thereof, in some embodiments. Accordingly, the gate metal is sometimes referred to as a work function layer or work function metal. Example n-type work function metals that may be included in the gate structures for n-type devices include Ti, Ag, TaAl, TaAlC, TiAlN, TaC, TaCN, TaSiN, Mn, Zr, other suitable n-type work function materials, or combinations thereof. The n-type work function layer(s) may be deposited by CVD, physical vapor deposition (PVD), ALD, and/or other suitable process.

In various embodiments, the first high-k dielectric 644 and first gate metal 646 can be collectively referred to as a first gate structure. Upon forming such a gate structure, a first GAA transistor can be formed. In the present example, the semiconductor device 600, configured as two GAA transistors stacked on top of one another. The first 2D material 642 wrapping around the first seed layer 606 can function as a channel of one of the two GAA transistors. Further, the first 2D material 642 is (e.g., electrically) in contact with the first source/drain structures 630 through their laterally extending portions, respectively. Still further, the first gate structure, formed of first high-k dielectric 644 and first gate metal 646, wraps around the first 2D material 642.

Corresponding to operation 528 of FIG. 5, FIG. 6Q is a cross-sectional view of the semiconductor device 600 in which a perimeter of the second seed layer 612 is exposed, at one of the various stages of fabrication, in accordance with various embodiments.

To expose the perimeter of the second seed layer 612, sidewalls of the second seed layer 612 (facing toward and away from the plane) are first exposed by performing at least some of the following processes: (1) forming a (e.g., photoresist) mask 648 having at least an opening; and (2) etching the workpiece (including the first and second sacrificial materials, 604 and 610, and the first and second seed layers, 606 and 612) using the mask 648. Specifically, the opening of the mask 648 is configured to open up at least the sidewalls of the second seed layer 612 that face toward and away from the plane.

Next, the top and bottom surfaces of the second seed layer 612 are exposed by performing at least some of the following processes: (1) continuing using the (e.g., photoresist) mask 648; and (2) performing a selective etching on the second sacrificial materials 610. Such a selective etching may leave the cap layer 605, first seed layer 606, second seed layer 612, first dielectric isolation 607, and second dielectric isolation 618 substantially intact. Consequently, a pair of cavities 650, each of which exposes a bottom surface or a top surface of the second seed layer 612, can be formed, which further opens up the full perimeter of the second seed layer 612. As shown, the cavities 650 can further expose a full perimeter of the laterally extending portion of each of the second source/drain structures 636.

Corresponding to operation 530 of FIG. 5, FIGS. 6R and 6S are cross-sectional views of the semiconductor device 600 including a second 2D material 652, a second high-k dielectric 654, and a second gate metal 656, at one of the various stages of fabrication, in accordance with various embodiments. In the illustrated embodiment of FIGS. 6R and 6S, the second 2D material 652 wraps around the full perimeter of the second seed layer 612, the second high-k dielectric 654 wrap around the second 2D material 652, and the second gate metal 656 wraps around the second high-k dielectric 654.

The second 2D material 652 can include, but are not limited to, graphene, transition metal dichalcogenides (TMDs), $WS_2$, $WSe_2$, $WTe_2$, $MoS_2$, $MoSe_2$, $MoTe_2$, $HfS_2$, $ZrS_2$, $TiS_2$, GaSe, InSe, phosphorene, among others. In various embodiments, the second 2D material 652 may be selected from the group above as a suitable channel material for a p-type transistor. The second 2D material 652, as described herein, may be deposited by an atomic layer deposition (ALD) process and may be 5-15 angstroms thick, the thinness lending to their name—2D material. Other deposition techniques may also be used, including but not limited to chemical vapor deposition (CVD), physical vapor deposition (PVD), and plasma-enhanced deposition techniques. The second 2D material 652 may be annealed during or after the device formation process to recrystallize or grow the crystals and thereby improve electrical characteristics.

The second high-k dielectric 654 can be any type of material that has a relatively large dielectric constant. As one example, a silicon oxide based gate dielectric such as silicon dioxide ($SiO_2$) may be selectively formed on a gate layer of silicon. Additionally or alternatively, other gate dielectric materials may be utilized such as silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide ($HfSiO_4$), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof. The formation methods of second high-k dielectric 654 may include molecular beam deposition (MBD), atomic layer deposition (ALD), PECVD, and the like.

The second gate metal 656 may include a p-type work function layer, or multi-layers thereof, in some embodiments. Accordingly, the gate metal is sometimes referred to as a work function layer or work function metal. Example p-type work function metals that may be included in the gate structures for p-type devices include TiN, TaN, Ru, Mo, Al, WN, $ZrSi_2$, $MoSi_2$, $TaSi_2$, $NiSi_2$, WN, other suitable p-type work function materials, or combinations thereof. The work function layer(s) may be deposited by CVD, physical vapor deposition (PVD), ALD, and/or other suitable process.

In various embodiments, the second high-k dielectric 654 and second gate metal 656 can be collectively referred to as a second gate structure. Upon forming such a gate structure, a second GAA transistor can be formed. In the present example, the semiconductor device 600, configured as two GAA transistors stacked on top of one another. The second 2D material 652 wrapping around the second seed layer 612 can function as a channel of the other of the two GAA transistors. Further, the second 2D material 652 is (e.g., electrically) in contact with the second source/drain structures 636 through their laterally extending portions, respectively. Still further, the second gate structure, formed of second high-k dielectric 654 and second gate metal 656, wraps around the second 2D material 652.

Figure 7:
FIG. 7 illustrates a flow chart of an example method for making yet another semiconductor device, in accordance with some embodiments.

FIG. 7 illustrates a flowchart of an example method 700 for forming yet another semiconductor device (e.g., two different conductive types of transistors stacked on top of one another), each of the transistors having at least a 2D material that operatively serves as its channel. For example, the two transistors may each be a gate-all-around (GAA) transistor with a gate structure wrapping around or otherwise surrounding such a channel of a 2D material. It is noted that the method 700 is merely an example, and is not intended to limit the present disclosure. Accordingly, it is understood that additional operations may be provided before, during, and after the method 700 of FIG. 7, and that some other operations may only be briefly described herein.

Figure 8A:
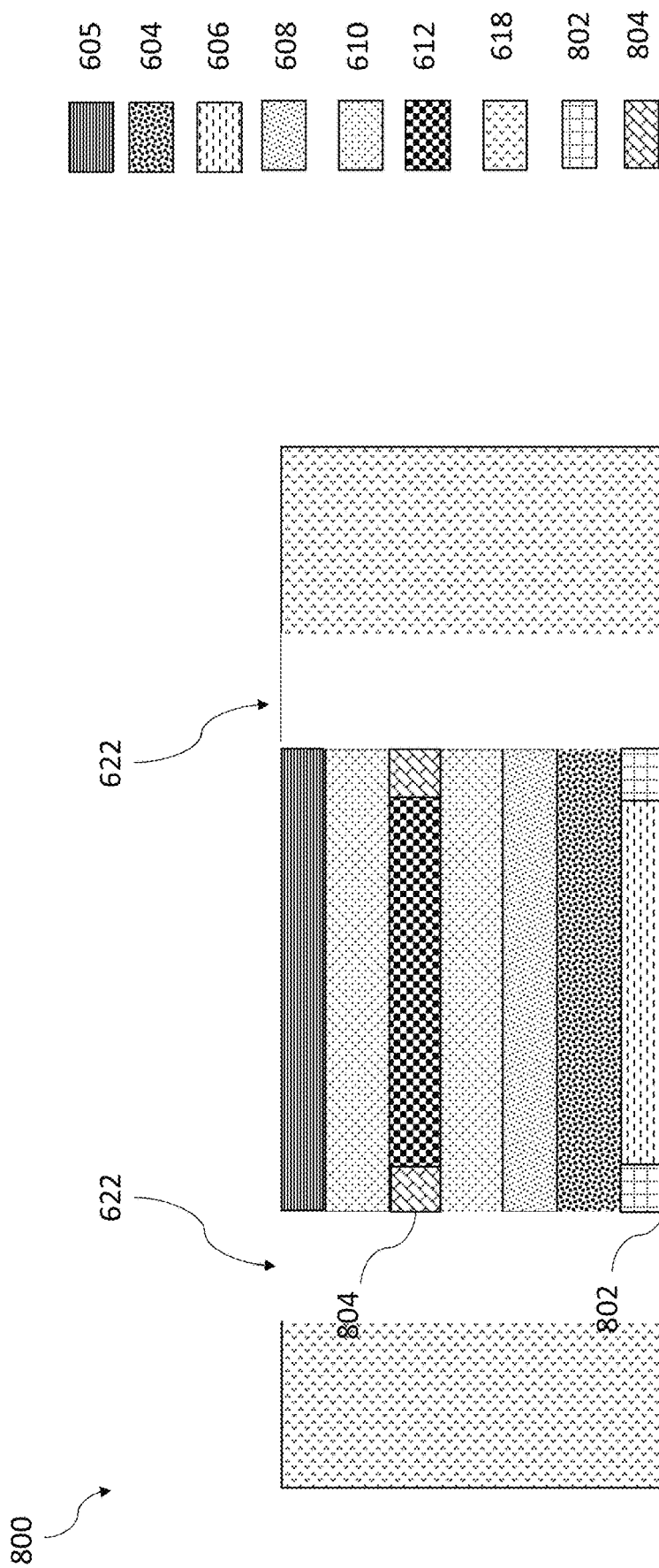
Figure 8B:
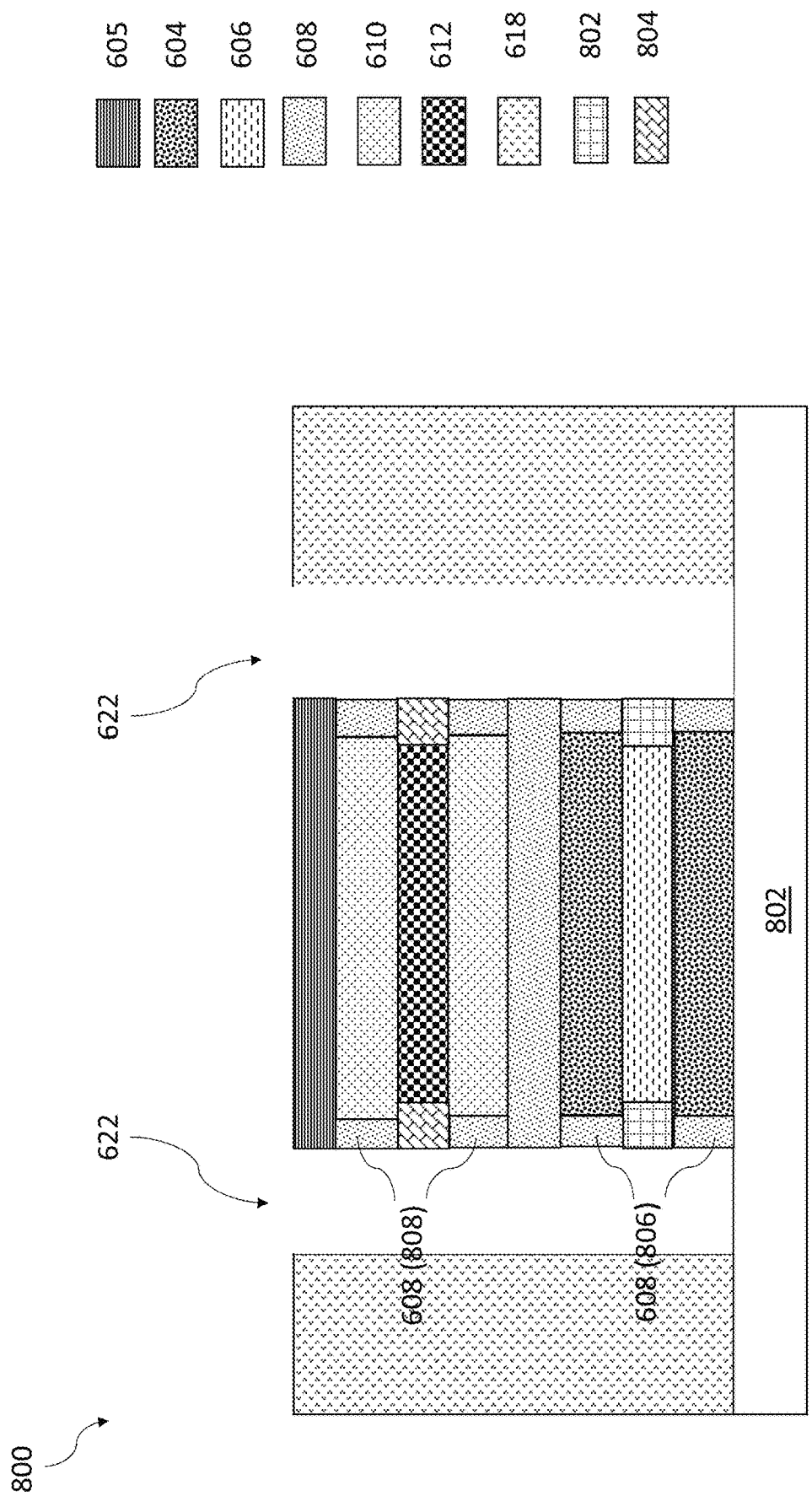

In various embodiments, some of the operations described above with respect to the method 500 (e.g., operations 502 to 508, 516-518, and 522-530) may be reused in the method 700, and thus, the following discussions will be focused on the different operations. Such (different) operations of the method 700 may be associated with cross-sectional views of an example semiconductor device 800 at various fabrication stages as shown in FIGS. 8A and 8B, respectively, which will be discussed in further detail below. Further, some of the reference numerals used for the structures in the corresponding operations 502 to 508, 516-518, and 522-530 (e.g., 602, 604, 605, 606, 608, 610, 612, 618, etc.) may be reused in FIGS. 8A and 8B. It should be understood that the semiconductor device 800, shown in FIGS. 8A and 8B, may include a number of other devices such as inductors, fuses, capacitors, coils, etc., while remaining within the scope of the present disclosure.

In brief overview, the method 700 starts with operation 702 of forming a stack of a number of sacrificial materials and a number of semiconductor materials. The method 700 proceeds to operation 704 of patterning the stack. The method 700 proceeds to operation 706 of depositing a first dielectric isolation. The method 700 proceeds to operation 708 of defining source/drain regions in the first dielectric isolation. The method 700 proceeds to operation 710 of forming first source/drain extensions and second source/drain extensions. The method 700 proceeds to operation 712 of filling up recesses of the first sacrificial materials and recesses of the second sacrificial materials with the first dielectric isolation. The method 700 proceeds to operation 714 of forming first source/drain structures. The method 700 proceeds to operation 716 of depositing a third dielectric isolation. The method 700 proceeds to operation 718 of forming second source/drain structures. The method 700 proceeds to operation 720 of exposing a perimeter of the first seed layer. The method 700 proceeds to operation 722 of forming a first two-dimensional (2D) material, a first high-k dielectric, and a first gate metal around the first seed layer. The method 700 proceeds to operation 724 of exposing a perimeter of the second seed layer. The method 700 proceeds to operation 726 of forming a second 2D material, a second high-k dielectric, and a second gate metal around the second seed layer.

As mentioned above, the operations 702 to 708 are substantially similar to the operations 502 to 508 of the method 500 in FIG. 5, respectively. That is, upon performing operation 708, the semiconductor device 800 can include a pair of source/drain regions (or openings) 622 disposed on opposite sides of a patterned stack, which includes a first seed layer 606 vertically interposed by a pair of first sacrificial materials 604 and a second seed layer 612 vertically interposed by a pair of second sacrificial materials 610 (e.g., similar to the semiconductor device 600 shown in FIG. 6E). Further, the pair of source/drain regions 622 are formed in a second dielectric isolation 618.

Next, corresponding to operation 710, FIG. 8A is a cross-sectional view of the semiconductor device 800 including a pair of first source/drain extensions 802 and a pair of second source/drain extensions 804, at one of the various stages of fabrication, in accordance with various embodiments.

The first source/drain extensions 802 are disposed on recessed ends of the first seed layer 606, respectively, and the second source/drain extensions 804 are disposed on recessed ends of the second seed layer 612, respectively. Specifically, the first source/drain extensions 802 may each be inwardly indented toward the first seed layer 606 with respect to the first sacrificial materials 604, and the second source/drain extensions 804 may each be inwardly indented toward the second seed layer 612 with respect to the second sacrificial materials 610.

To form the first source/drain extensions 802 and second source/drain extensions 804, respective end portions of the first seed layer 606 may first be recessed by a selective etching process through the source/drain regions 622. Next, the recesses of the first seed layer 606 are filled with a highly doped metal material or semiconductor material (e.g., poly-Si). In the example where the first seed layer 606 is configured as a template to grow a 2D material for an n-type transistor, the first source/drain extensions 802 may be heavily doped in n-type. Next, respective end portions of the second seed layer 612 may be recessed by a selective etching process through the source/drain regions 622. Next, the recesses of the second seed layer 612 are filled with another highly doped metal material or semiconductor material (e.g., poly-Si). In the example where the second seed layer 612 is configured as a template to grow a 2D material for a p-type transistor, the second source/drain extensions 804 may be heavily doped in p-type.

Next, corresponding to operation 712, FIG. 8B is a cross-sectional view of the semiconductor device 800 in which recesses 806 of the first sacrificial materials 604 and recesses 808 of the second sacrificial materials 610 are filled up with the first dielectric isolation 608, at one of the various stages of fabrication, in accordance with various embodiments. Upon the recesses 806 and 808 are filled up with the first dielectric isolation 608, operations 714 to 726 of the method 700 (similar to operations 516 to 530 of the method 500 except for operation 520, respectively) are performed to continue making the semiconductor device 800, which is substantially similar to the semiconductor device 600 shown in FIG. 6S. Thus, the discussion are not repeated.

Figure 8E:
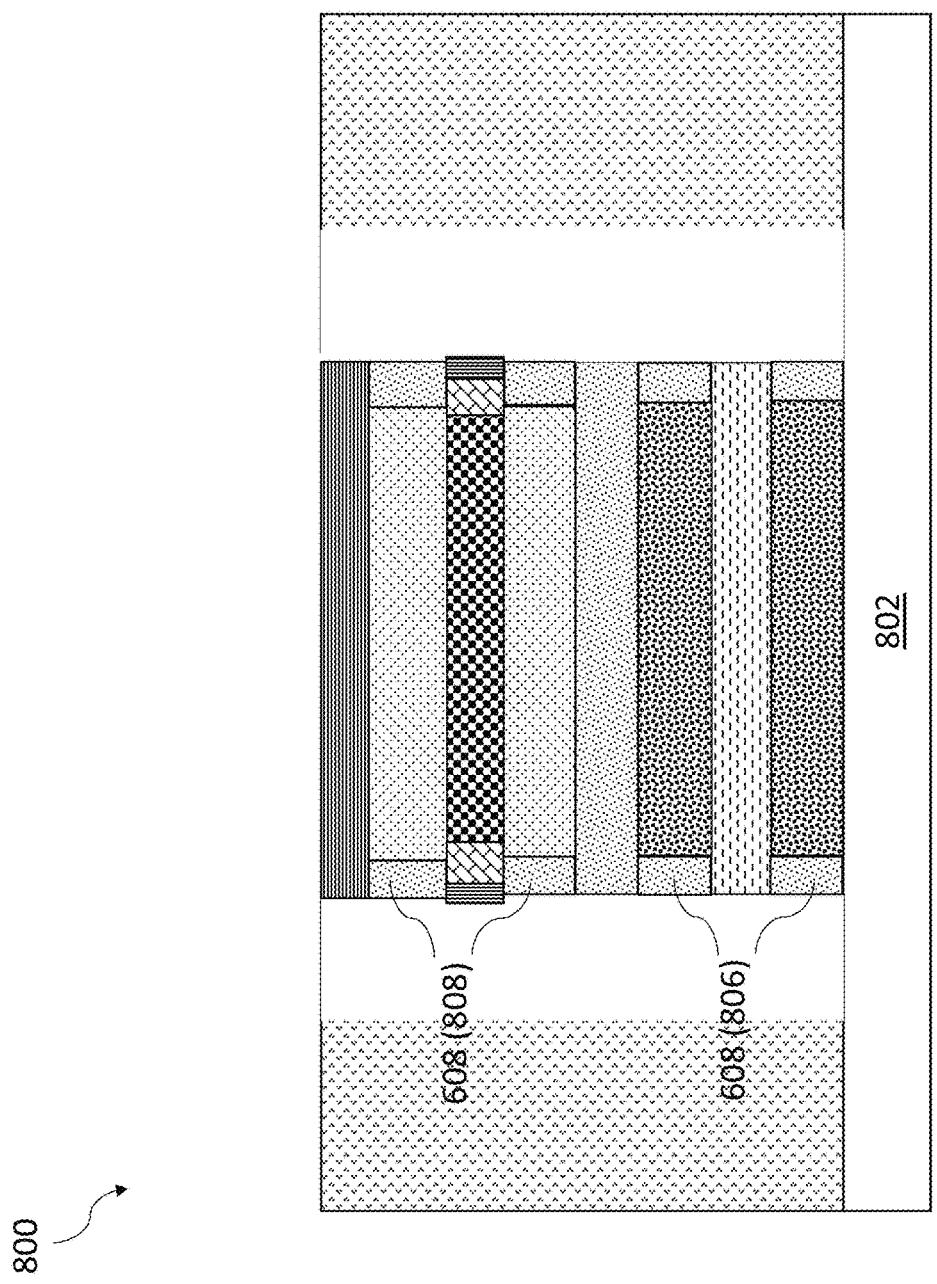

Alternatively or additionally, the second source/drain extensions 804 (e.g., for the p-type transistor) may be formed prior to forming the first source/drain extensions 802 (e.g., for the n-type transistor), as shown in FIG. 8C. Further, upon forming the second source/drain extensions 804, ends of the second source/drain extensions 804 may each be capped by a dielectric (e.g., $Si_3N_4$) layer 810, as shown in FIG. 8D. Next, recesses 806 of the first sacrificial materials 604 and recesses 808 of the second sacrificial materials 610 are filled up with the first dielectric isolation 608, as shown in FIG. 8E. Next, the first source/drain extensions 802 are formed, with the dielectric layer 810 capping the second source/drain extensions 804, as shown in FIG. 8F. Next, the first source/drain extensions 802 may be further grown (e.g., through epitaxial technique) to outwardly extend with a certain lateral distance, as shown in FIG. 8G. Next, the dielectric layer 810 is removed, and the source/drain regions 622 (FIG. 8G) are refilled with the second dielectric isolation 618, as shown in FIG. 8H.

Next, operations 714 to 726 of the method 700 (similar to operations 516 to 530 of the method 500 except for operation 520, respectively) are performed to continue making the semiconductor device 800, which is substantially similar to the semiconductor device 600 shown in FIG. 6S. Thus, the discussion are not repeated. In various embodiments, the first source/drain extensions 802 may serve as source and drain structures of the lower n-type GAA transistor, respectively, and the second source/drain extensions 804 may serve as source and drain structures of the upper p-type GAA transistor, respectively. Accordingly, respective (e.g., metal) contacts, 812 and 814, may be formed to electrically connect to the sourer/drain structures 802 and 804, as shown in FIG. 8I.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A semiconductor device, comprising:
  a transistor structure comprising:
    a structure having a seed layer;
    a first source/drain extension in contact with the structure;
    a second source/drain extension in contact with the structure;
    a two-dimensional (2D) material around the seed layer, and at least one of the first source/drain extension; or the second source/drain extension;
    a first source/drain structure in electrical contact with the 2D material through the first source/drain extension;
    a second source/drain structure in electrical contact with the 2D material through the second source/drain extension; and
    a gate structure around at least the 2D material.

2. The semiconductor device of claim 1, wherein further comprising:
  a second transistor structure disposed above the transistor structure and comprising:
    a second structure having a second seed layer;
    a third source/drain extension in contact with the second structure;
    a fourth source/drain extension in contact with the second structure;
    a second 2D material around at least one of the second seed layer, the third source/drain extension, or the fourth source/drain extension;
    a third source/drain structure in electrical contact with the second 2D material through the third source/drain extension;
    a fourth source/drain structure in electrical contact with the second 2D material through the fourth source/drain extension; and
    a second gate structure around at least the second 2D material,
  wherein the transistor has a first conductive type and the second transistor has a second conductive type, the first conductive type being opposite to the first conductive type.

3. The semiconductor device of claim 2, wherein the 2D material and the second 2D material each include at least one of: $WS_2$, $WSe_2$, $WTe_2$, $MoS_2$, $MoSe_2$, $MoTe_2$, $HfS_2$, $ZrS_2$, $TiS_2$, GaSe, InSe, or phosphorene.

4. The semiconductor device of claim 1, wherein the first source/drain extension and the second source/drain extension each include a doped metal material or a doped semiconductor material, and wherein the gate structure is around respective portions of the first source/drain extension and the second source/drain extension.

5. The semiconductor device of claim 1, wherein the seed layer is around a semiconductor core.

6. The semiconductor device of claim 5, wherein the semiconductor core includes one of: amorphous silicon, crystalline silicon, amorphous germanium, or crystalline germanium.

7. The semiconductor device of claim 5, wherein
  the first source/drain extension includes a first silicide metal between the first source/drain structure and a first end of the 2D material; and
  the second source/drain extension includes a second silicide metal between the second source/drain structure and a second end of the 2D material.

8. The semiconductor device of claim 1, wherein the structure comprises a dielectric material.

9. A semiconductor device, comprising:
  a first transistor structure comprising:
    a first two-dimensional (2D) material around a first structure having a first seed layer;
    a first source/drain extension in electrical contact with the first 2D material;
    a first source/drain structure electrically coupled to the first 2D material through the first source/drain extension;
    a second source/drain extension in electrical contact with the first 2D material, the first 2D material around the first seed layer and at least one of the first source/drain extension or the second source/drain extension;
    a second source/drain structure electrically coupled to the first 2D material through the second source/drain extension; and
    a first gate structure around at least the first 2D material; and
  a second transistor structure comprising:
    a second 2D material around a second structure having a second seed layer;
    a third source/drain extension in electrical contact with the second 2D material;

a third source/drain structure electrically coupled to the second 2D material through the third source/drain extension;

a fourth source/drain extension in electrical contact with the second 2D material;

a fourth source/drain structure electrically coupled to the second 2D material through the fourth source/drain extension; and a second gate structure around at least the second 2D material;

wherein the second transistor structure is disposed above the first transistor structure and isolated by a dielectric, wherein the first transistor structure has a first conductive type and the second transistor structure has a second conductive type, the second conductive type being opposite to the first conductive type.

10. The semiconductor device of claim 9, wherein the first and the second source/drain extensions each outwardly extend from the first seed layer farther than the third and the fourth source/drain extensions each do from the second seed layer.

11. The semiconductor device of claim 9, wherein the first 2D material and the second 2D material each include at least one of: WS2, WSe2, WTe2, MoS2, MoSe2, MoTe2, HfS2, ZrS2, TiS2, GaSe, InSe, or phosphorene.

12. The semiconductor device of claim 9, wherein each of the first seed layer and second seed layer is around a respective semiconductor core.

13. The semiconductor device of claim 9, wherein each of the first structure and second structure comprises a respective dielectric material.

* * * * *